US012286448B2

(12) United States Patent
Jeon et al.

(10) Patent No.: US 12,286,448 B2
(45) Date of Patent: Apr. 29, 2025

(54) ORGANOMETALLIC COMPOUND, ORGANIC LIGHT-EMITTING DEVICE INCLUDING ORANOMETALLIC COMPOUND, AND DIAGNOSTIC COMPOSITION INCLUDING ORGANOMETALLIC COMPOUND

(71) Applicant: Samsung Electronics Co., Ltd., Suwon-si (KR)

(72) Inventors: Aram Jeon, Suwon-si (KR); Banglin Lee, Suwon-si (KR); Seungyeon Kwak, Suwon-si (KR); Sunyoung Lee, Seoul (KR); Jungin Lee, Seoul (KR); Yuri Cho, Suwon-si (KR); Seokhwan Hong, Seoul (KR); Kyuyoung Hwang, Anyang-si (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 731 days.

(21) Appl. No.: 16/166,826

(22) Filed: Oct. 22, 2018

(65) Prior Publication Data

US 2019/0135844 A1 May 9, 2019

(30) Foreign Application Priority Data

Nov. 8, 2017 (KR) ........................ 10-2017-0148326

(51) Int. Cl.
*C07F 15/00* (2006.01)
*C07F 1/12* (2006.01)
(Continued)

(52) U.S. Cl.
CPC ............ *C07F 15/0086* (2013.01); *C07F 1/12* (2013.01); *C07F 15/006* (2013.01); *H10K 50/11* (2023.02);
(Continued)

(58) Field of Classification Search
None
See application file for complete search history.

(56) References Cited

U.S. PATENT DOCUMENTS 10,811,622 B2 * 10/2020 Yoon .................. H01L 51/0087
10,937,973 B2 * 3/2021 Lee .................... H01L 51/0087
(Continued)

FOREIGN PATENT DOCUMENTS

WO 2013-152727 A1 10/2013

OTHER PUBLICATIONS

Zhi-Qiang Zhu et al. "Harvesting All Electrogenerated Excitons through Metal Assisted Delayed Fluorescent Materials" Adv. Mater. 2015, vol. 27, p. 2533-2537 (Year: 2015).*
(Continued)

*Primary Examiner* — Seokmin Jeon
(74) *Attorney, Agent, or Firm* — CANTOR COLBURN LLP

(57) ABSTRACT

The present disclosure relates to an organometallic compound, an organic light-emitting device including the same, and a diagnostic composition including the organometallic compound, wherein the organometallic compound is represented by Formula 1: is suitable for use in an organic layer of an organic light-emitting device. The organic light-emitting device may have, due to the inclusion of an organic layer including the organometallic compound represented by Formula 1, a low driving voltage high efficiency, high power, high quantum efficiency, a long lifespan, a low roll-off ration, and excellent color purity. In addition, the organometallic compound represented by Formula 1 may provide high luminescent efficiency. Accordingly, a diagnostic composition including the organometallic compound may have high diagnostic efficiency.
(Continued)

Formula 1

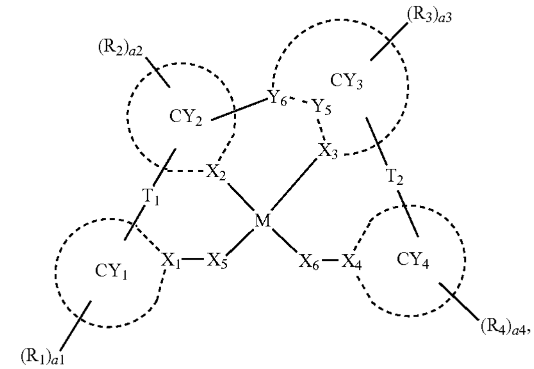

In Formula 1, groups and variables are the same as described in the specification.

9 Claims, 1 Drawing Sheet

(51) Int. Cl.
*H10K 50/11* (2023.01)
*H10K 85/30* (2023.01)
*H10K 101/10* (2023.01)

(52) U.S. Cl.
CPC ......... *H10K 85/346* (2023.02); *H10K 85/324* (2023.02); *H10K 85/371* (2023.02); *H10K 2101/10* (2023.02)

(56) References Cited

U.S. PATENT DOCUMENTS

| | | | | |
|---|---|---|---|---|
| 11,352,384 | B2 * | 6/2022 | Lee | C07F 15/0086 |
| 11,557,744 | B2 * | 1/2023 | Jeong | H01L 51/5056 |
| 11,825,737 | B2 * | 11/2023 | Lee | H10K 85/346 |
| 2006/0134461 | A1 * | 6/2006 | Huo | 428/690 |
| 2007/0103060 | A1 * | 3/2007 | Itoh | 313/504 |
| 2010/0187977 | A1 * | 7/2010 | Kai | 313/504 |
| 2015/0105556 | A1 | 4/2015 | Li et al. | |
| 2015/0162552 | A1 | 6/2015 | Li et al. | |
| 2015/0194615 | A1 * | 7/2015 | Lin | H01L 51/0087 |
| 2015/0274762 | A1 * | 10/2015 | Li | C07F 15/006 |
| 2018/0090707 | A1 | 3/2018 | Jeon et al. | |
| 2018/0208615 | A1 * | 7/2018 | Lin | C07F 15/0086 |
| 2018/0212165 | A1 * | 7/2018 | Ji | H01L 51/0087 |
| 2023/0038197 | A1 * | 2/2023 | Hwang | H01L 51/0087 |

OTHER PUBLICATIONS

Yafei Luo et al. “Exploring the Photodeactivation Pathways of Pt[O∧N∧C∧N] Complexes: A Theoretical Perspective”, ChemPhysChem 2016, vol. 17, p. 69-77 (Year: 2016).*

Machine translated English version of WO 2007/043484, Yagi Tadao, Apr. 16, 2007 (Year: 2007).*

Bin Wang et al. “Strongly phosphorescent platinum(II) complexes supported by tetradentate benzazole-containing ligands”, J. Mater. Chem. C, 2015, vol. 3, p. 8212-8218 (Year: 2015).*

Shiu-Lun Lai et al. “High Efficiency White Organic Light-Emitting Devices Incorporating Yellow Phosphorescent Platinum(II) Complex and Composite Blue Host”, Adv. Funct. Mater. 2013, 23(41), 5168-5176.

Tyler Fleetham et al. “Efficient Red-Emitting Platinum Complex with Long Operational Stability”, ACS Appl. Mater. Interfaces, 2015, 7(30), 16240-16246.

* cited by examiner

ORGANOMETALLIC COMPOUND, ORGANIC LIGHT-EMITTING DEVICE INCLUDING ORANOMETALLIC COMPOUND, AND DIAGNOSTIC COMPOSITION INCLUDING ORGANOMETALLIC COMPOUND

CROSS-REFERENCE TO RELATED APPLICATION

This application claims priority to Korean Patent Application No. 10-2017-0148326, filed on Nov. 8, 2017, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound, an organic light-emitting device including the same, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In a typical example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

Formula 1

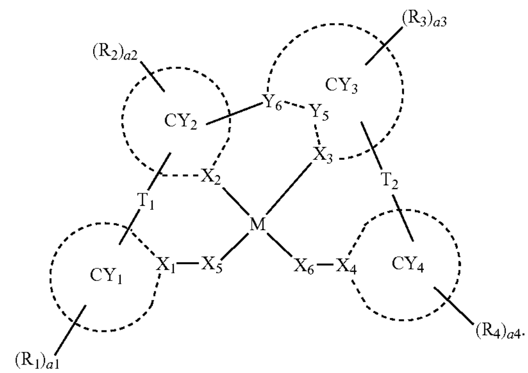

In Formula 1,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ to $X_4$, $Y_5$, and $Y_6$ may each independently be C or N, $X_5$ may be a chemical bond, O, S, $B(R_5)$, $N(R_5)$, $P(R_5)$, $C(R_5)(R_6)$, $Si(R_5)(R_6)$, $Ge(R_5)(R_6)$, $C(=O)$, $B(R_5)(R_6)$, $N(R_5)(R_6)$, or $P(R_5)(R_6)$, wherein, when $X_5$ is a chemical bond, $X_1$ and M may be directly bonded together, $X_6$ may be a chemical bond, O, S, $B(R_7)$, $N(R_7)$, $P(R_7)$, $C(R_7)(R_8)$, $Si(R_7)(R_8)$, $Ge(R_7)(R_8)$, $C(=O)$, $B(R_7)(R_8)$, $N(R_7)(R_8)$, or $P(R_7)(R_8)$, wherein, when $X_6$ is a chemical bond, $X_4$ and M may be directly bonded together, at least one of $X_5$ and $X_6$ may not be a chemical bond, two bonds selected from a bond between M and $X_1$ or $X_5$, a bond between $X_2$ and M, a bond between $X_3$ and M, and a bond between M and $X_4$ or $X_6$ may each independently be a coordinate bond while the remaining bonds may each independently be a covalent bond, ring $CY_1$ to ring $CY_4$ may each independently be selected from a $C_5$-$C_{30}$ carbocyclic group and a $C_1$-$C_{30}$ heterocyclic group, $T_1$ and $T_2$ may each independently be a single bond, a double bond, *—N(R')—*', *—B(R')—*', *—P(R')—*', *—C(R')(R")—*', *—Si(R')(R")—*', *—Ge(R')(R")—*', *—S—*', *—Se—*', *—O—*', *—C(=O)—*', *—S(=O)—*', *—S(=O)$_2$—*', *—C(R')=*', *=C(R')—*', *—C(R')=C(R")—*', *—C(=S)—*', or *—C≡C—*', $R_1$ to $R_8$, R', and R" may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), a1 to a4 may each independently be an integer of 0 to 20, two groups $R_1$ among a plurality of neighboring groups $R_1$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, two groups $R_2$ among a plurality of neighboring groups $R_2$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, two groups $R_3$ among a plurality of neighboring groups $R_3$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, two groups $R_4$ among a plurality of neighboring groups $R_4$ may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group are each unsubstituted or substituted with at least one $R_{10a}$, two selected from $R_1$ to $R_4$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $R_{10a}$ may be the same as described in connection with $R_1$,

* and *' each independently indicate a binding site to a neighboring atom, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group.

Another aspect of the present disclosure provides an organic light-emitting device including:

a first electrode, a second electrode, and an organic layer disposed between the first electrode and the second electrode, wherein the organic layer includes an emission layer, and wherein the organic layer includes at least one organometallic compound.

The organometallic compound in the organic layer may serve as a dopant.

Another aspect of the present disclosure provides a diagnostic composition including at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
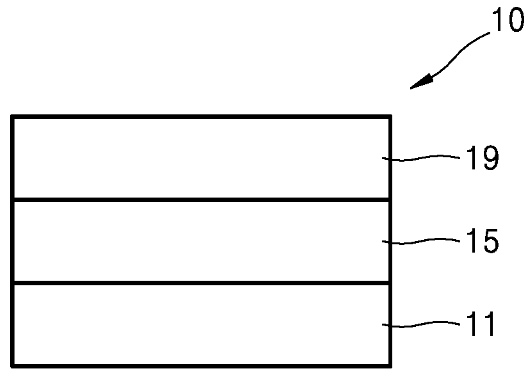
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound represented by Formula 1 below is provided:

Formula 1

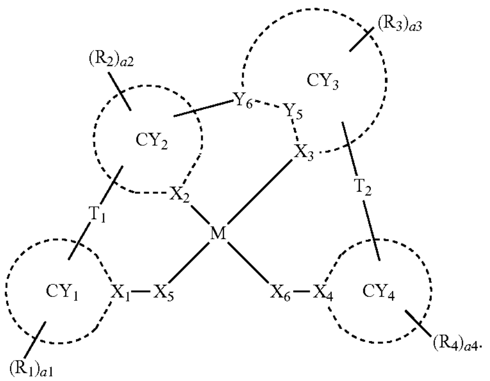

In Formula 1, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, in Formula 1, M may be Pt, Pd, or Au, but embodiments of the present disclosure are not limited thereto.

In Formula 1, $X_1$ to $X_4$, $Y_5$ and $Y_6$ may each independently be C or N.

In an embodiment, in Formula 1, $Y_6$ may be N, but embodiments of the present disclosure are not limited thereto.

In Formula 1, $X_5$ may be a chemical bond, O, S, $B(R_5)$, $N(R_5)$, $P(R_5)$, $C(R_5)(R_6)$, $Si(R_5)(R_6)$, $Ge(R_5)(R_6)$, C(═O), $B(R_5)(R_6)$, $N(R_5)(R_6)$, or $P(R_5)(R_6)$, wherein, when $X_5$ is a chemical bond, $X_1$ and M may be directly bonded together.

In Formula 1, $X_6$ may be a chemical bond, O, S, $B(R_7)$, $N(R_7)$, $P(R_7)$, $C(R_7)(R_8)$, $Si(R_7)(R_8)$, $Ge(R_7)(R_8)$, C(═O), $B(R_7)(R_8)$, $N(R_7)(R_8)$, or $P(R_7)(R_8)$, wherein, when $X_6$ is a chemical bond, $X_4$ and M may be directly bonded together.

In Formula 1, at least one of $X_5$ and $X_6$ may not be a chemical bond.

For example, at least one of $X_5$ and $X_6$ may not be a chemical bond, and the other may be a chemical bond.

In an embodiment, in Formula 1, $X_5$ and $X_6$ may each independently be a chemical bond, O, or S, wherein at least one of $X_5$ and $X_6$ may be O or, but embodiments of the present disclosure are not limited thereto.

In one or more embodiments, in Formula 1, i) $X_5$ may be O, S, $B(R_5)$, $N(R_5)$, $P(R_5)$, $C(R_5)(R_6)$, $Si(R_5)(R_6)$, $Ge(R_5)(R_6)$, C(═O), $B(R_5)(R_6)$, $N(R_5)(R_6)$, or $P(R_5)(R_6)$, $X_6$ may be a chemical bond, $X_1$ and $X_3$ may each independently be C, and $X_2$ and $X_4$ may each independently be N;

ii) $X_5$ may be O, S, $B(R_5)$, $N(R_5)$, $P(R_5)$, $C(R_5)(R_6)$, $Si(R_5)(R_6)$, $Ge(R_5)(R_6)$, C(═O), $B(R_5)(R_6)$, $N(R_5)(R_6)$, or $P(R_5)(R_6)$, $X_6$ may be a chemical bond, $X_1$ and $X_4$ may each independently be C, and $X_2$ and $X_3$ may each independently be N;

iii) $X_5$ may be a chemical bond, $X_6$ may be O, S, $B(R_7)$, $N(R_7)$, $P(R_7)$, $C(R_7)(R_8)$, $Si(R_7)(R_8)$, $Ge(R_7)(R_8)$, C(═O), $B(R_7)(R_8)$, $N(R_7)(R_8)$, or $P(R_7)(R_8)$, $X_1$ and $X_3$ may each independently be N, and $X_2$ and $X_4$ may each independently be C; or iv) $X_5$ may be a chemical bond, $X_6$ may be O, S, $B(R_7)$, $N(R_7)$, $P(R_7)$, $C(R_7)(R_8)$, $Si(R_7)(R_8)$, $Ge(R_7)(R_8)$, C(═O), $B(R_7)(R_8)$, $N(R_7)(R_8)$, or $P(R_7)(R_8)$, $X_1$ and $X_4$ may each independently be C, and $X_2$ and $X_3$ may each independently be N.

In Formula 1, two bonds selected from a bond between M and $X_1$ or $X_5$, a bond between $X_2$ and M, a bond between $X_3$ and M, and a bond between M and $X_4$ or $X_6$ may each independently be a coordinate bond while the remaining bonds may each independently be a covalent bond. In this regard, the organometallic compound represented by Formula 1 may be electrically neutral.

In an embodiment, in Formula 1, i) $X_5$ may be O, S, $B(R_5)$, $N(R_5)$, $P(R_5)$, $C(R_5)(R_6)$, $Si(R_5)(R_6)$, $Ge(R_5)(R_6)$, or C(═O), $X_6$ may be a chemical bond, a bond between $X_5$ and M and a bond between $X_3$ and M may each independently be a covalent bond, and a bond between $X_2$ and M and a bond between $X_4$ and M may each independently be a coordinate bond;

ii) $X_5$ may be O, S, $B(R_5)$, $N(R_5)$, $P(R_5)$, $C(R_5)(R_6)$, $Si(R_5)(R_6)$, $Ge(R_5)(R_6)$, or C(═O), $X_6$ may be a chemical bond, a bond between $X_5$ and M and a bond between $X_4$ and M may each independently be a covalent bond, a bond between $X_2$ and M and a bond between $X_3$ and M may each independently be a coordinate bond;

iii) $X_5$ may be a chemical bond, $X_6$ may be O, S, $B(R_7)$, $N(R_7)$, $P(R_7)$, $C(R_7)(R_8)$, $Si(R_7)(R_8)$, $Ge(R_7)(R_8)$, or C(═O), a bond between $X_1$ and M and a bond between $X_3$ and M may each independently be a coordinate bond, and a bond between $X_2$ and M and a bond between $X_6$ and M may each independently be a covalent bond; or iv) $X_5$ may be a chemical bond, $X_6$ may be O, S, $B(R_7)$, $N(R_7)$, $P(R_7)$, $C(R_7)(R_8)$, $Si(R_7)(R_8)$, $Ge(R_7)(R_8)$, or C(═O), a bond between $X_1$ and M and a bond between $X_6$ and M may each independently be a covalent bond, and a bond between $X_2$ and M and a bond between $X_3$ and M may each independently be a coordinate bond, but embodiments of the present disclosure are not limited thereto.

In Formula 1, ring $CY_1$ to ring $CY_4$ may each independently be selected from a $C_5$-$C_{30}$ carbocyclic group, and a $C_1$-$C_{30}$ heterocyclic group.

For example, ring $CY_1$ to ring $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

In an embodiment, in Formula 1, ring $CY_1$ to ring $CY_4$ may each independently be selected from i) a first ring, ii) a second ring, iii) a condensed ring in which two or more second rings are condensed each other, and iv) a condensed ring in which at least one first ring and at least one second ring are condensed, wherein the first ring may be selected from a cyclopentane group, a cyclopentadiene group, a furan group, a thiophene group, a pyrrole group, a silole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group.

In an embodiment, ring $CY_3$ may be a condensed ring in which one first ring and one second ring are condensed each other, or a condensed ring in which one first ring and two second rings are condensed each other, wherein the first ring and the second ring are the same as described above.

In Formula 1, $T_1$ and $T_2$ may each independently be a single bond, a double bond, *—N(R')—*', *—B(R')—*', *—P(R')—*', *—C(R')(R")—*', *—Si(R')(R")—*', *—Ge(R')(R")—*', *—S—*', *—Se—*', *—O—*', *—C(=O)—*', *—S(=O)—*', *—S(=O)$_2$—*', *—C(R')=*', *=C(R')—*', *—C(R')=C(R")—*', *—C(=S)—*', or *—C≡C—*', R' and R" are the same as described above.

For example, $T_1$ and $T_2$ may each independently be a single bond, but embodiments of the present disclosure are not limited thereto.

$R_1$ to $R_8$, R', and R" may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ are the same as described above.

In an embodiment, $R_1$ to $R_8$, R', and R" may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—N(Q_1)(Q_2)$, $—Si(Q_3)(Q_4)(Q_5)$, $—B(Q_6)(Q_7)$, and $—P(=O)(Q_8)(Q_9)$, and $Q_1$ to $Q_9$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, $R_1$ to $R_8$, R', and R" may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, and groups represented by Formulae 9-1 to 9-19 and 10-1 to 10-226:

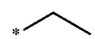
9-1

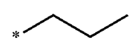
9-2

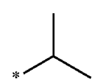
9-3

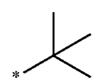
9-4

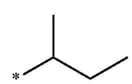
9-5

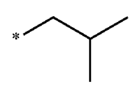
9-6

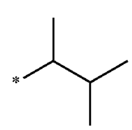
9-7

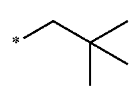
9-8

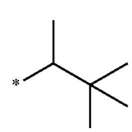
9-9

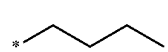
9-10

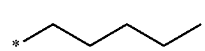
9-11

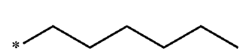
9-12

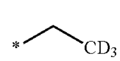

9-13

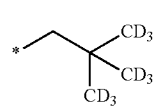

9-14

9-15
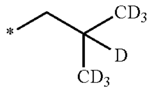
9-16
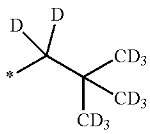
9-17
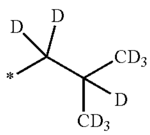
9-18
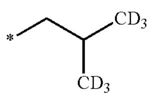
9-19
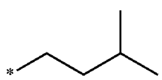
10-1
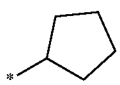
10-2
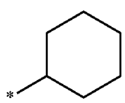
10-3
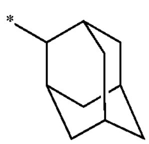
10-4
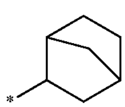
10-5
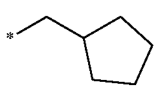
10-6
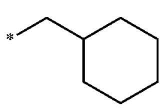
10-7
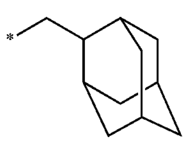
10-8
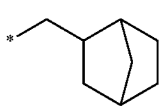
10-9
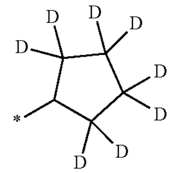
10-10
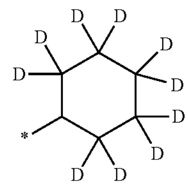
10-11
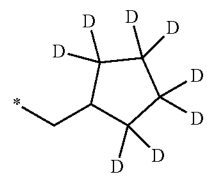
10-12
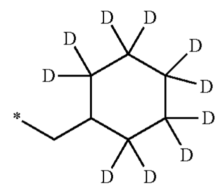
10-13
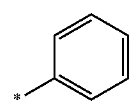
10-14
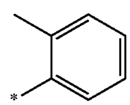
10-15
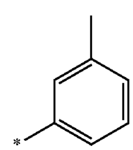
10-16
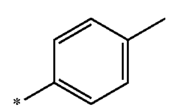
10-17
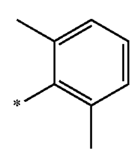
10-18
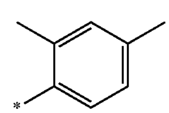

-continued
10-19
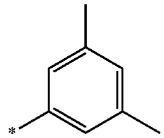
10-20
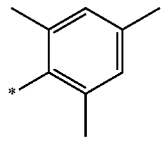
10-21
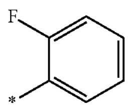
10-22
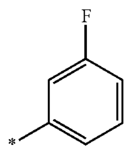
10-23
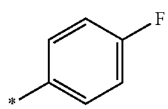
10-24
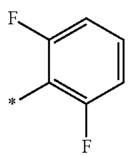
10-25
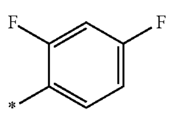
10-26
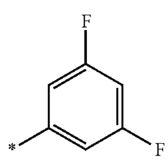
10-27
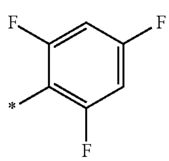
10-28
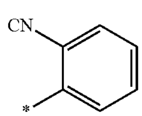
10-29
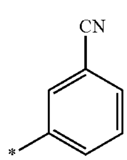
-continued
10-30
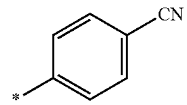
10-31
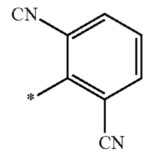
10-32
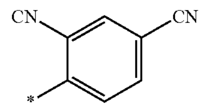
10-33
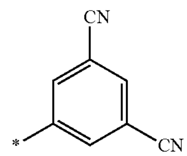
10-34
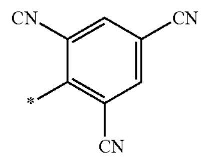
10-35
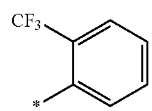
10-36
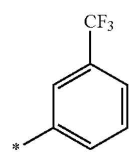
10-37
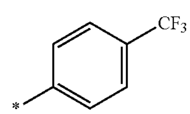
10-38
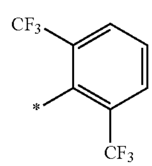
10-39
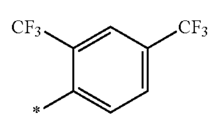
10-40
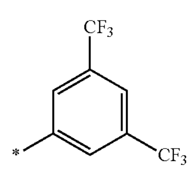

-continued
10-41
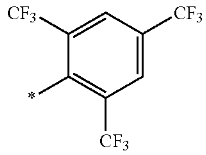
10-42
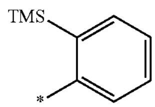
10-43
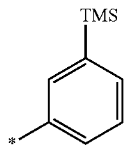
10-44
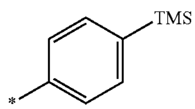
10-45
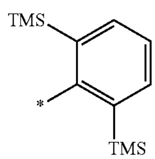
10-46
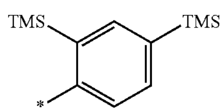
10-47
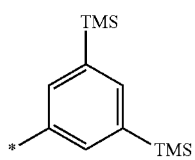
10-48
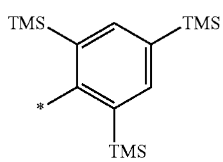
10-49
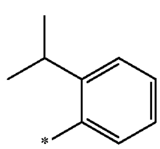
10-50
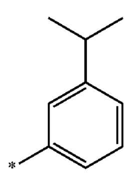
10-51
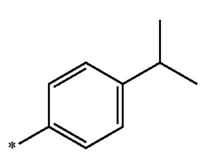
-continued
10-52
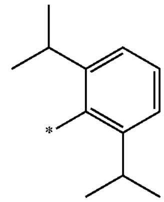
10-53
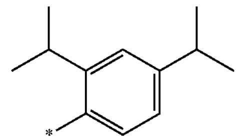
10-54
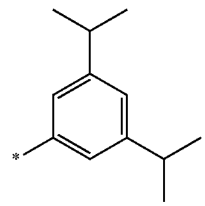
10-55
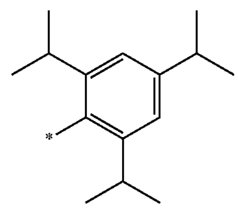
10-56
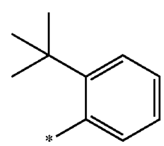
10-57
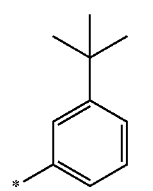
10-58
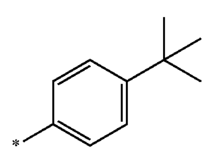
10-59
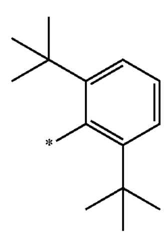

-continued
10-60
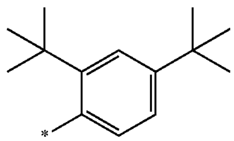
10-61
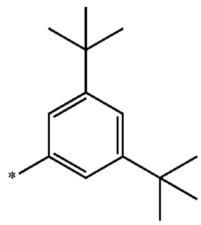
10-62
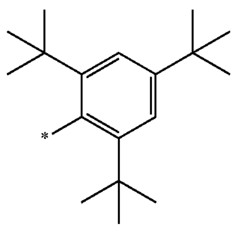
10-63
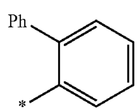
10-64
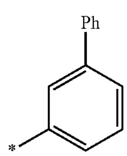
10-65
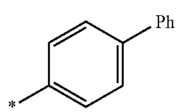
10-66
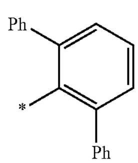
10-67
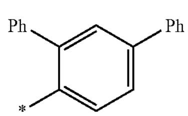
10-68
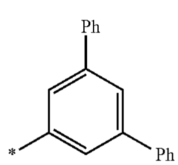
10-69
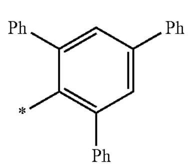
-continued
10-70
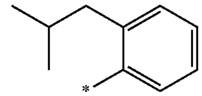
10-71
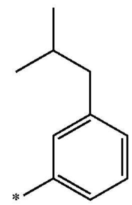
10-72
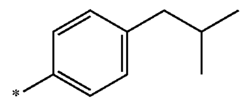
10-73
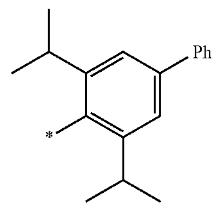
10-74
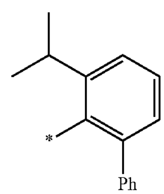
10-75
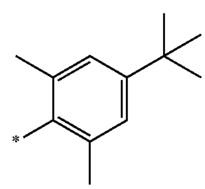
10-76
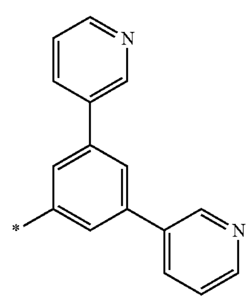
10-77
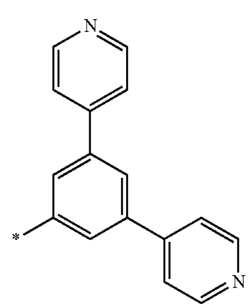

-continued
10-78
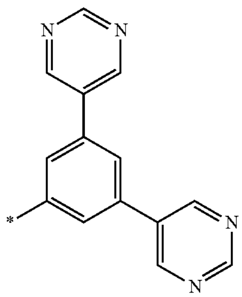
10-79
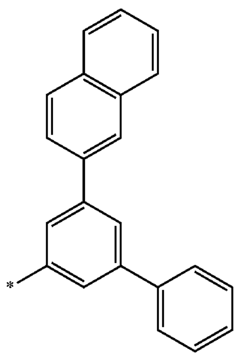
10-80
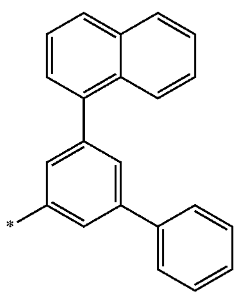
10-81
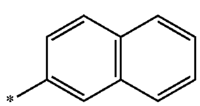
10-82
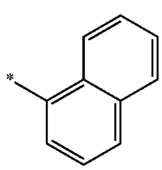
10-83
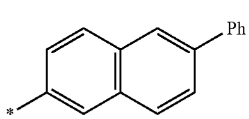
10-84
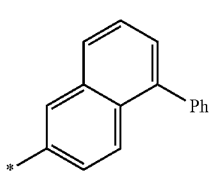
-continued
10-85
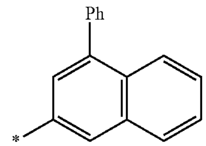
10-86
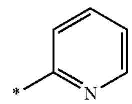
10-87
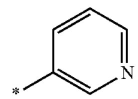
10-88
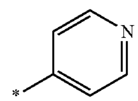
10-89
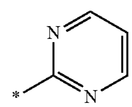
10-90
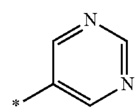
10-91
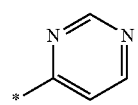
10-92
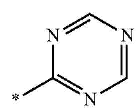
10-93
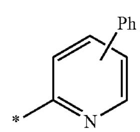
10-94
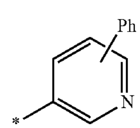
10-95
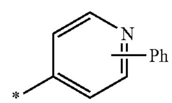
10-96
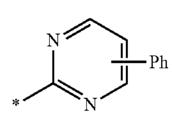
10-97
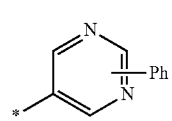

-continued
10-98
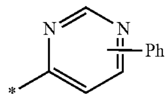
10-99
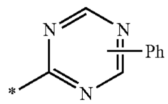
10-100
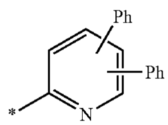
10-101
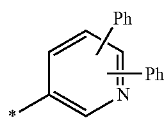
10-102
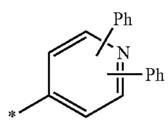
10-103
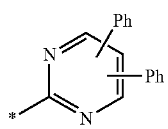
10-104
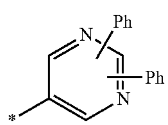
10-105
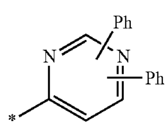
10-106
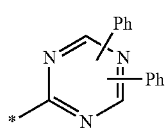
10-107
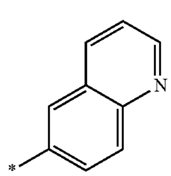
10-108
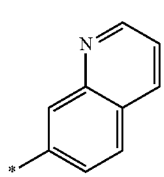
-continued
10-109
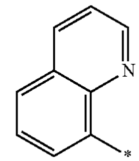
10-110
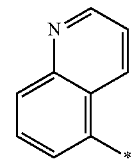
10-111
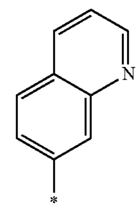
10-112
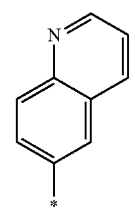
10-113
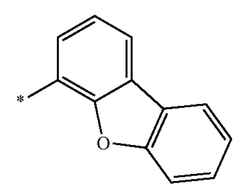
10-114
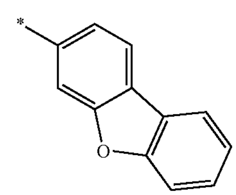
10-115
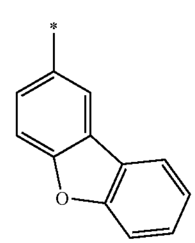
10-116
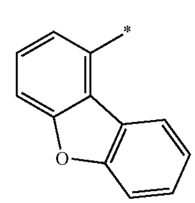

-continued
10-117
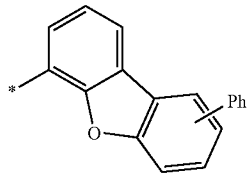
10-118
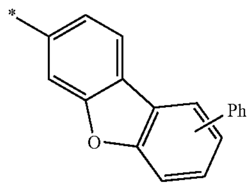
10-119
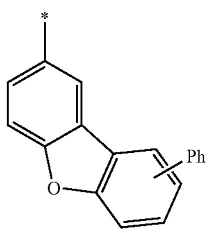
10-120
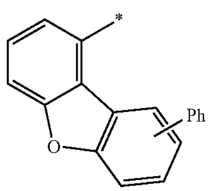
10-121
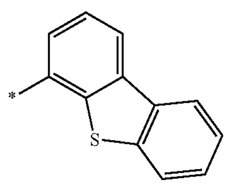
10-122
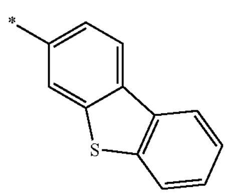
10-123
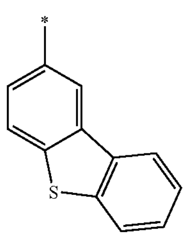
10-124
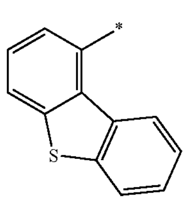
-continued
10-125
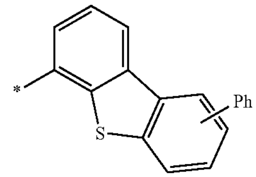
10-126
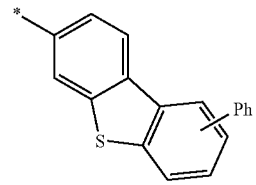
10-127
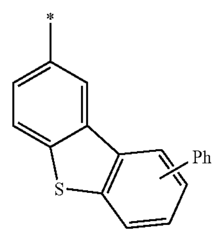
10-128
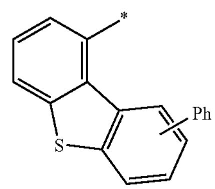
10-129
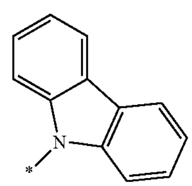
10-130
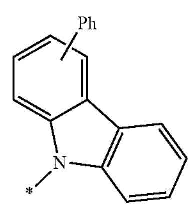
10-131
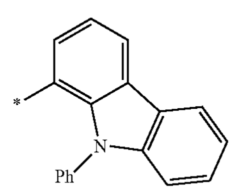
10-132
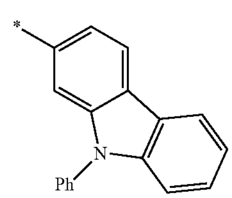

-continued
10-133
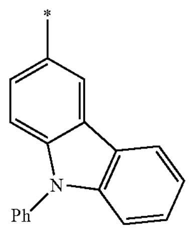
10-134
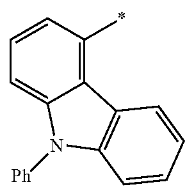
10-135
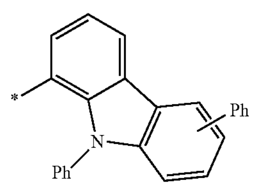
10-136
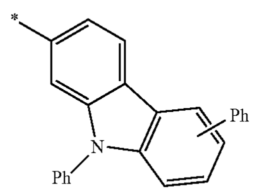
10-137
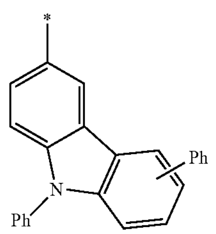
10-138
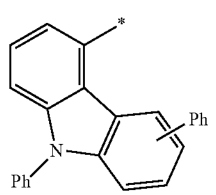
10-139
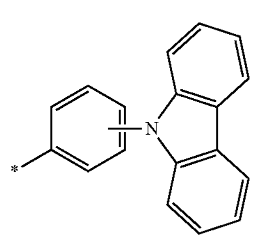
-continued
10-140
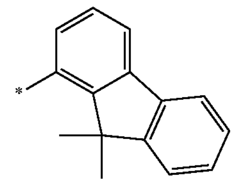
10-141
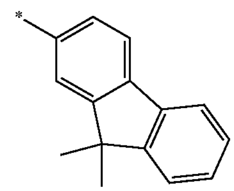
10-142
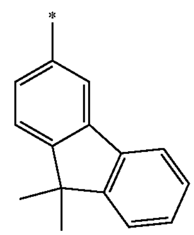
10-143
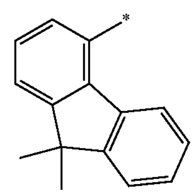
10-144
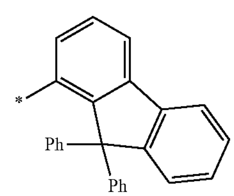
10-145
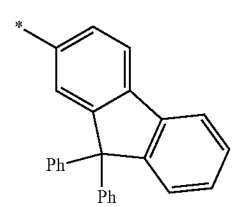
10-146
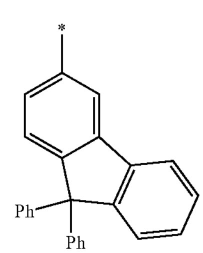

-continued
10-147
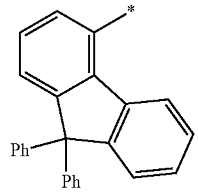
10-148
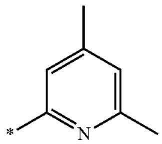
10-149
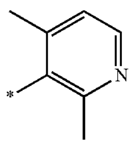
10-150
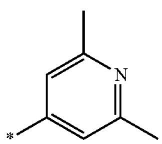
10-151
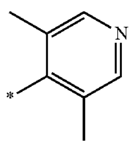
10-152
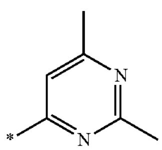
10-153
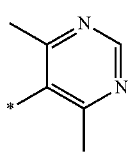
10-154
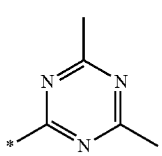
10-155
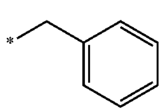
10-156
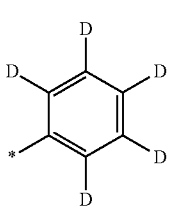
-continued
10-157
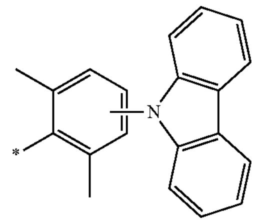
10-158
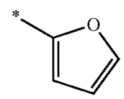
10-159
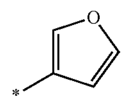
10-160
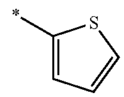
10-161
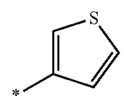
10-162
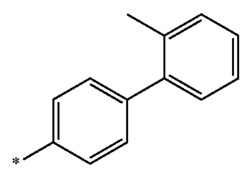
10-163
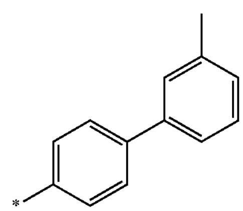
10-164
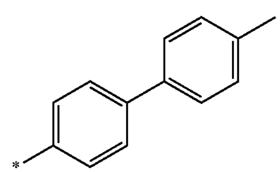
10-165
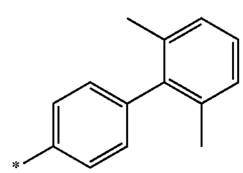
10-166
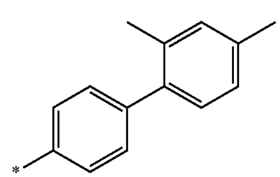

-continued
10-167
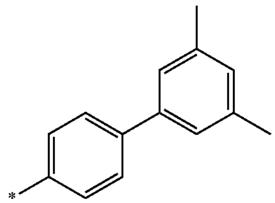
10-168
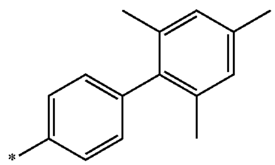
10-169
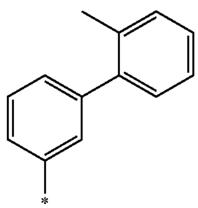
10-170
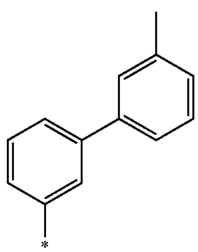
10-171
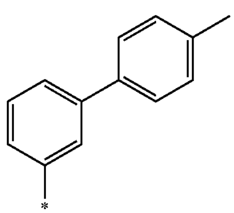
10-172
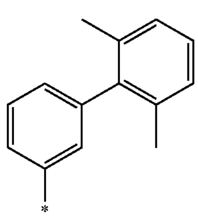
10-173
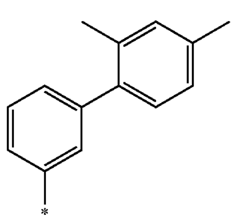
-continued
10-174
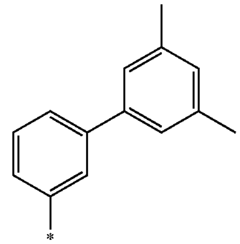
10-175
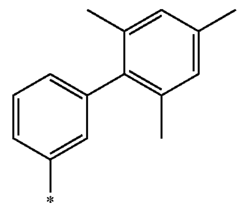
10-176
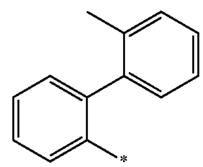
10-177
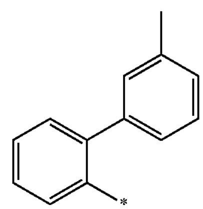
10-178
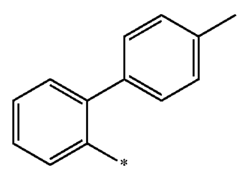
10-179
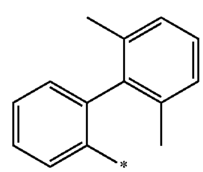
10-180
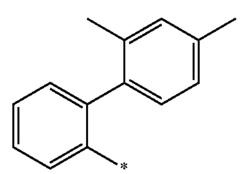
10-181
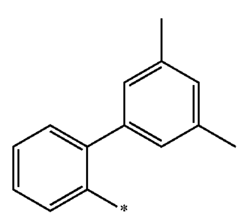

-continued
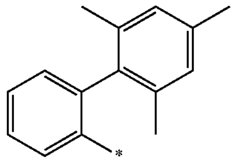
10-182
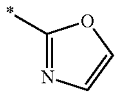
10-183
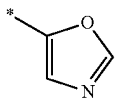
10-184
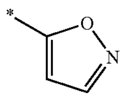
10-185
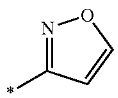
10-186
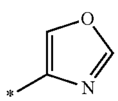
10-187
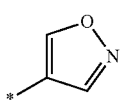
10-188
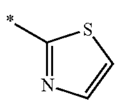
10-189
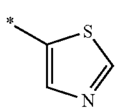
10-190
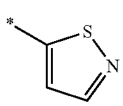
10-191
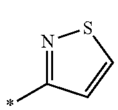
10-192
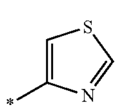
10-193
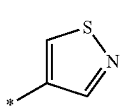
10-194
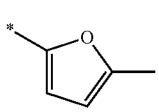
10-195
-continued
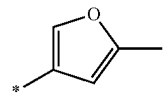
10-196
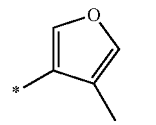
10-197
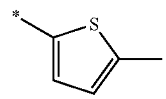
10-198
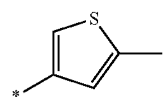
10-199
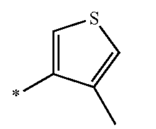
10-200
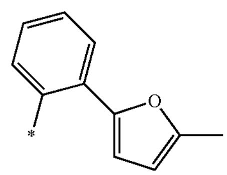
10-201
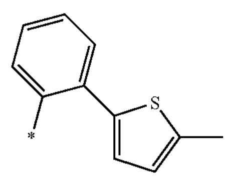
10-202
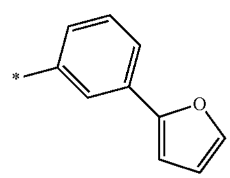
10-203
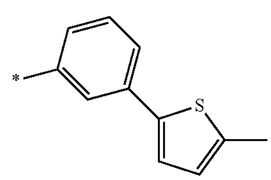
10-204
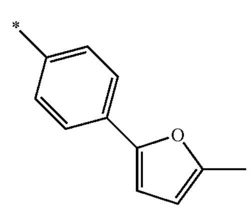
10-205

-continued
10-206
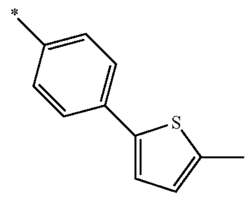
10-207
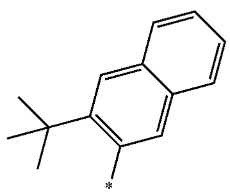
10-208
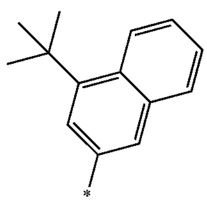
10-209
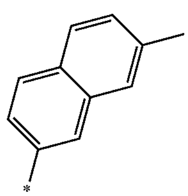
10-210
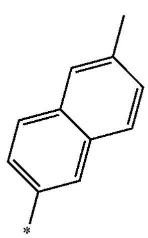
10-211
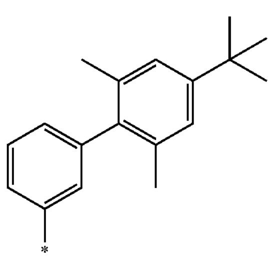
10-212
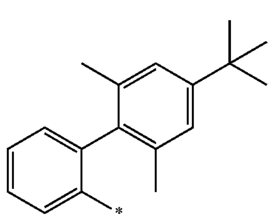
-continued
10-213
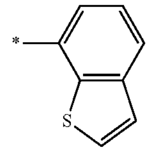
10-214
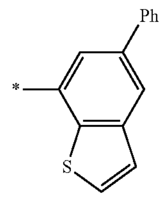
10-215
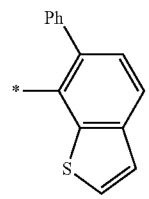
10-216
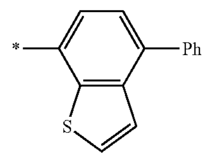
10-217
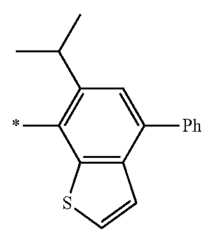
10-218
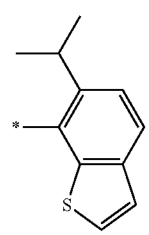
10-219
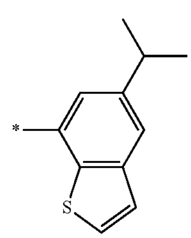
10-220
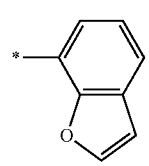

-continued 10-221

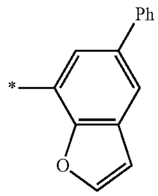

10-222

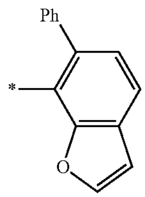

10-223

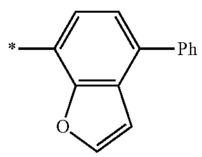

10-224

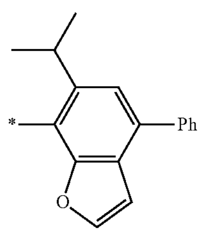

10-225

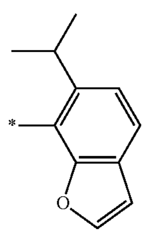

10-226

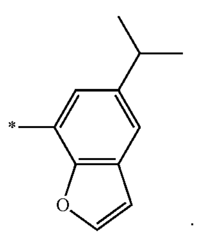

In Formulae 9-1 to 9-19 and 10-1 to 10-226, * indicates a binding site to a neighboring atom, Ph indicates a phenyl group, and TMS indicates a trimethylsilyl group.

In Formula 1, a1 to a4 each indicate the number of $R_1$ to $R_4$, and may each independently be an integer of 0 to 20 (for example, an integer of 0 to 7). When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, and when a4 is two or more, two or more groups $R_4$ may be identical to or different from each other.

In Formula 1, i) two groups $R_1$ among a plurality of neighboring groups $R_1$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, ii) two groups $R_2$ among a plurality of neighboring groups $R_2$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, iii) two groups $R_3$ among a plurality of neighboring groups $R_3$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, iv) two groups $R_4$ among a plurality of neighboring groups $R_4$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, or v) two selected from $R_1$ to $R_4$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$. Here, "the $C_5$-$C_{30}$ carbocyclic group" and "the $C_1$-$C_{30}$ heterocyclic group" are the same as described in connection with ring $CY_1$, and $R_{10a}$ is the same as described in connection with $R_1$.

* and *' in Formula 1 each indicate a binding site to a neighboring atom.

The organometallic compound represented by Formula 1 may satisfy Condition 1 or Condition 2:

Condition 1

$X_5$ may be O, S, $B(R_5)$, $N(R_5)$, $P(R_5)$, $C(R_5)(R_6)$, $Si(R_5)(R_6)$, $Ge(R_5)(R_6)$, C(=O), $B(R_5)(R_6)$, $N(R_5)(R_6)$, or $P(R_5)(R_6)$;

a moiety represented by

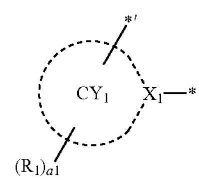

may be represented by Formula A1-1; and $T_1$ may be a single bond, and

Condition 2

$X_6$ may be O, S, $B(R_7)$, $N(R_7)$, $P(R_7)$, $C(R_7)(R_8)$, $Si(R_7)(R_8)$, $Ge(R_7)(R_8)$, C(=O), $B(R_7)(R_8)$, $N(R_7)(R_8)$, or $P(R_7)(R_8)$;

a moiety represented by

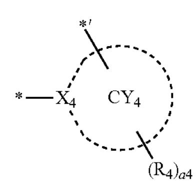

may be represented by Formula A4-1; and $T_2$ may be a single bond

A1-1

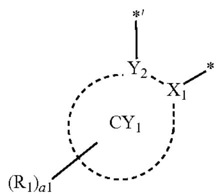

A4-1

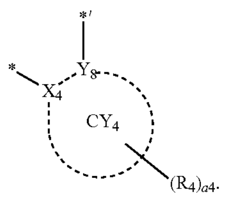

In Formulae A1-1 and A4-1, $X_1$, $X_4$, ring $CY_1$, ring $CY_4$, $R_1$, $R_4$, a1, and a4 are the same as described above in the present specification, $Y_2$ and $Y_8$ may each independently be N or C,

* in Formula A1-1 indicates a binding site to M or $X_5$ of Formula 1,

*' in Formula A1-1 indicates a binding site to $T_1$ of Formula 1,

* in Formula A4-1 indicates a binding site to M or $X_6$ of Formula 1, and

*' in Formula A4-1 indicates a binding site to $T_2$ of Formula 1.

In an embodiment, a moiety represented by

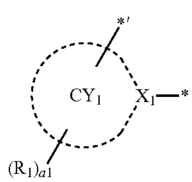

in Formula 1 may be represented by one selected from Formulae A1-1(1) to A1-1(28) and A1-2(1) to A1-2(74):

A1-1(1)

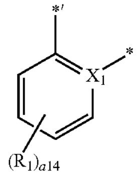

A1-1(2)

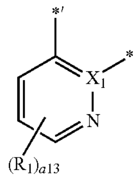

-continued

A1-1(3)

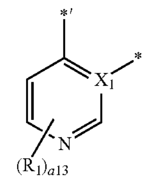

A1-1(4)

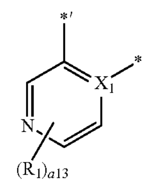

A1-1(5)

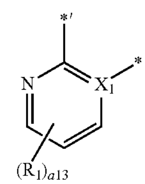

A1-1(6)

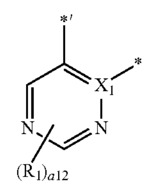

A1-1(7)

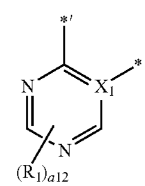

A1-1(8)

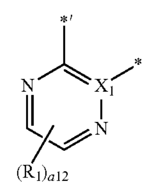

A1-1(9)

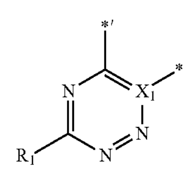

A1-1(10)

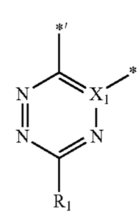

-continued
A1-1(11)
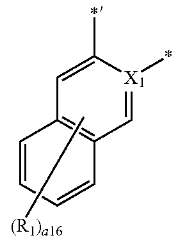
A1-1(12)
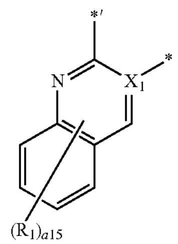
A1-1(13)
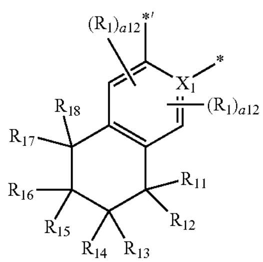
A1-1(14)
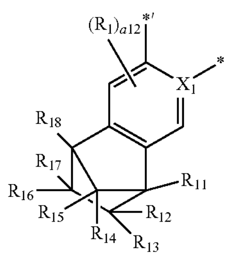
A1-1(15)
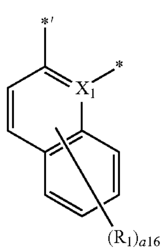
A1-1(16)
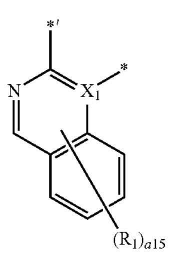
-continued
A1-1(17)
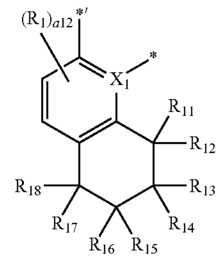
A1-1(18)
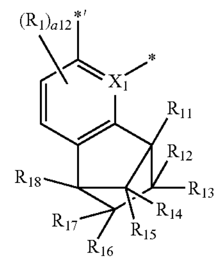
A1-1(19)
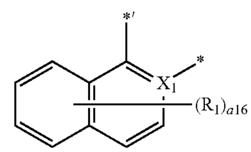
A1-1(20)
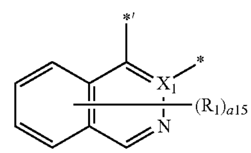
A1-1(21)
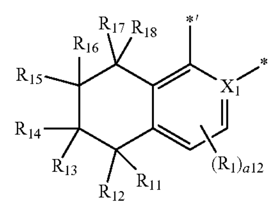
A1-1(22)
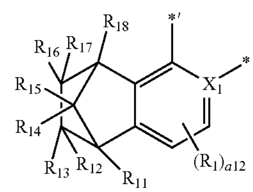
A1-1(23)
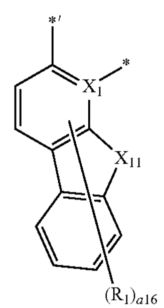

-continued
A1-1(24)
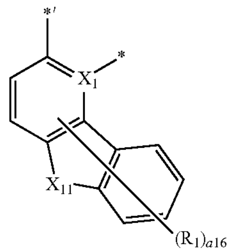
A1-1(25)
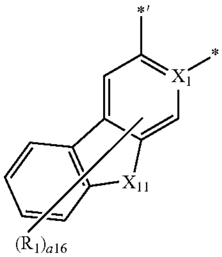
A1-1(26)
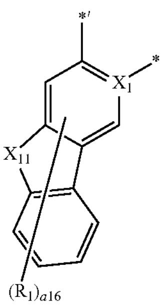
A1-1(27)
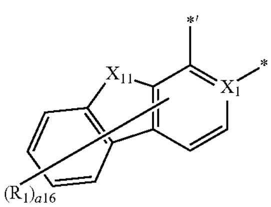
A1-1(28)
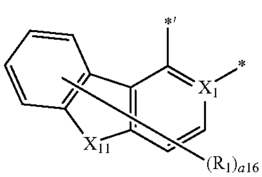
A1-2(1)
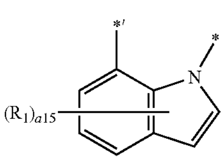
A1-2(2)
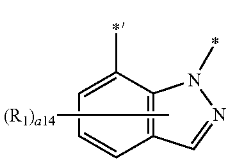
-continued
A1-2(3)
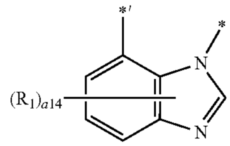
A1-2(4)
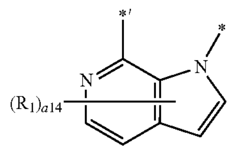
A1-2(5)
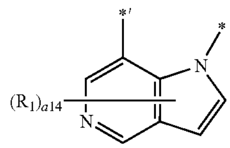
A1-2(6)
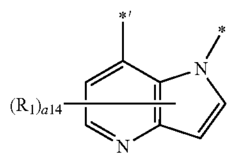
A1-2(7)
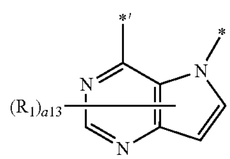
A1-2(8)
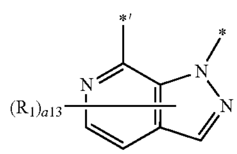
A1-2(9)
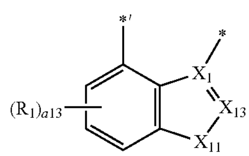
A1-2(10)
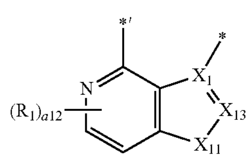
A1-2(11)
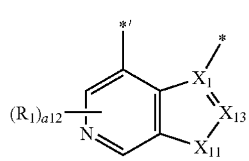
A1-2(12)
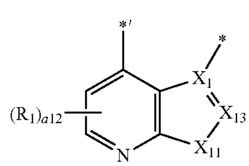

-continued
A1-2(13)
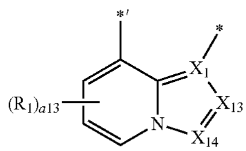
A1-2(14)
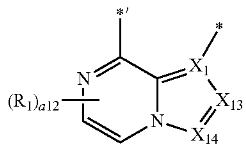
A1-2(15)
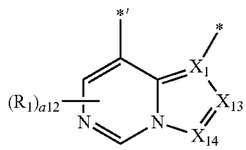
A1-2(16)
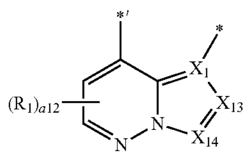
A1-2(17)
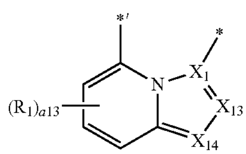
A1-2(18)
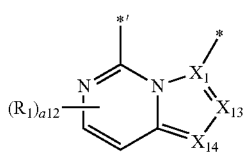
A1-2(19)
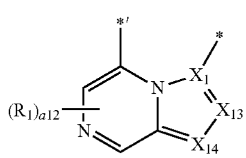
A1-2(20)
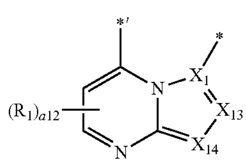
A1-2(21)
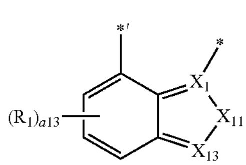
A1-2(22)
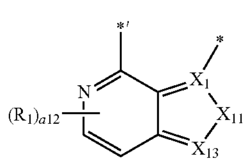
-continued
A1-2(23)
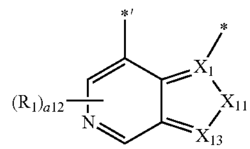
A1-2(24)
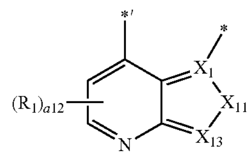
A1-2(25)
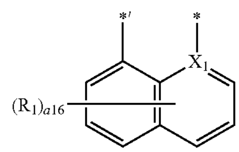
A1-2(26)
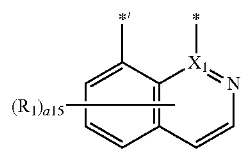
A1-2(27)
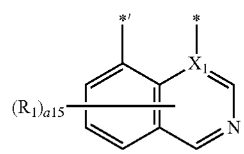
A1-2(28)
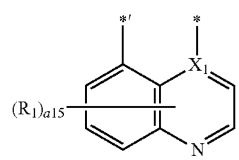
A1-2(29)
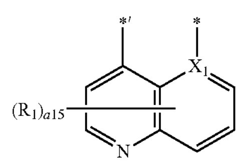
A1-2(30)
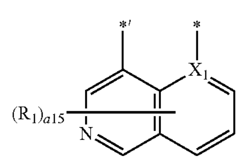
A1-2(31)
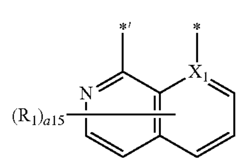
A1-2(32)
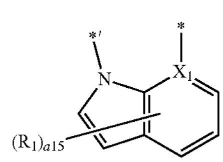

-continued
A1-2(33)
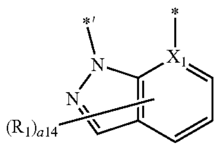
A1-2(34)
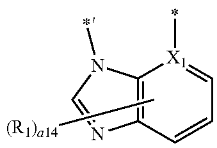
A1-2(35)
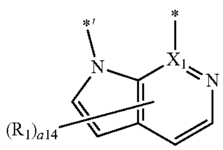
A1-2(36)
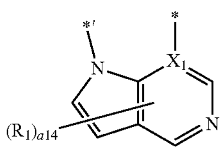
A1-2(37)
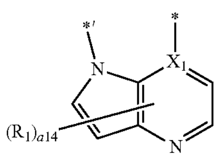
A1-2(38)
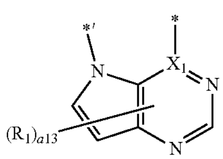
A1-2(39)
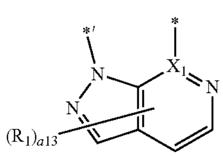
A1-2(40)
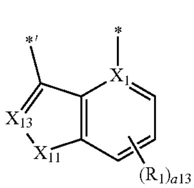
A1-2(41)
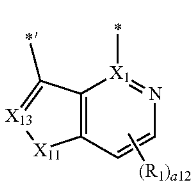
-continued
A1-2(42)
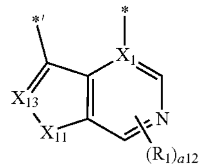
A1-2(43)
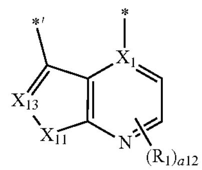
A1-2(44)
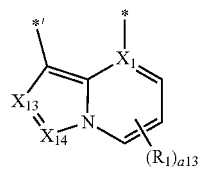
A1-2(45)
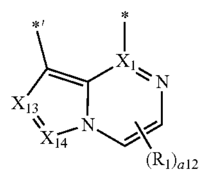
A1-2(46)
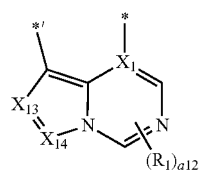
A1-2(47)
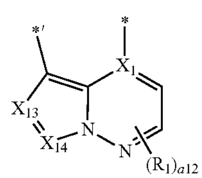
A1-2(48)
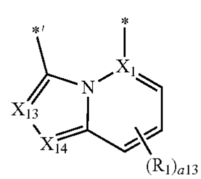
A1-2(49)
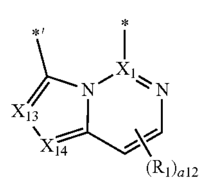
A1-2(50)
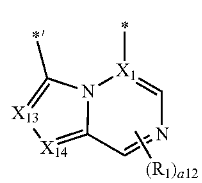

-continued
A1-2(51)
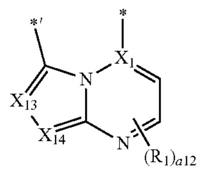
A1-2(52)
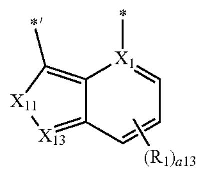
A1-2(53)
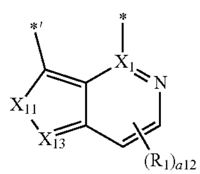
A1-2(54)
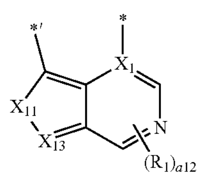
A1-2(55)
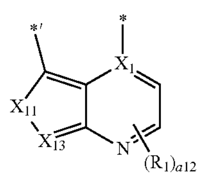
A1-2(56)
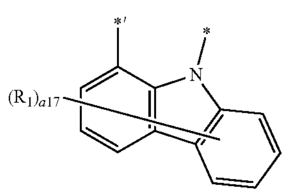
A1-2(57)
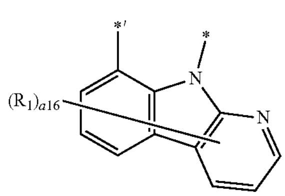
A1-2(58)
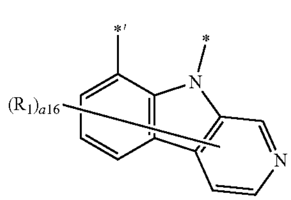
-continued
A1-2(59)
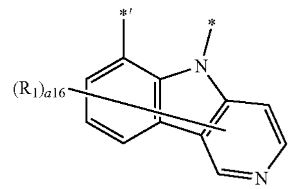
A1-2(60)
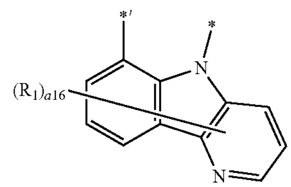
A1-2(61)
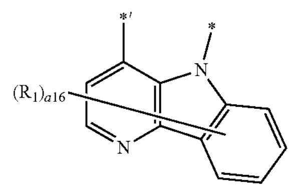
A1-2(62)
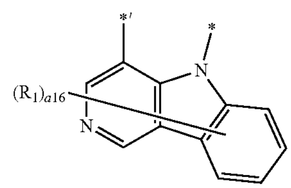
A1-2(63)
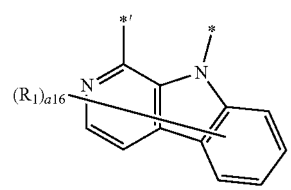
A1-2(64)
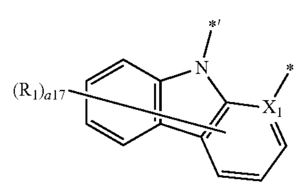
A1-2(65)
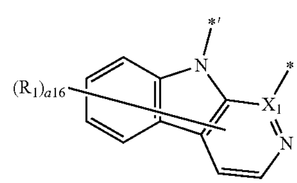
A1-2(66)
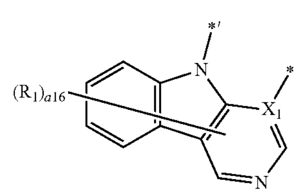

-continued

A1-2(67)

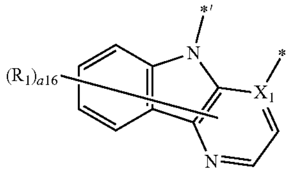

A1-2(68)

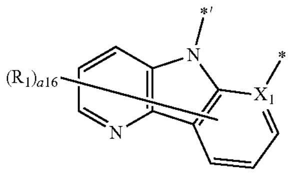

A1-2(69)

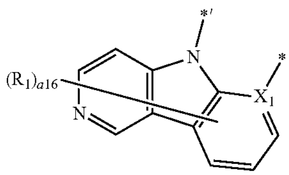

A1-2(70)

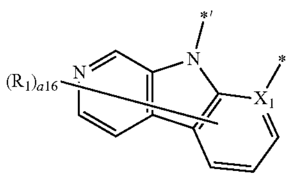

A1-2(71)

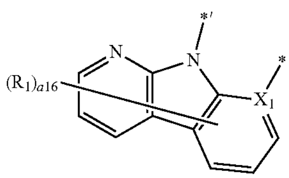

A1-2(72)

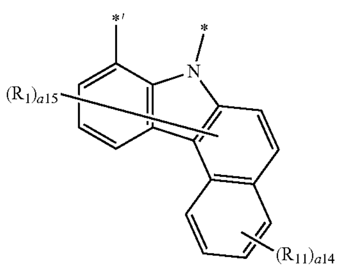

A1-2(73)

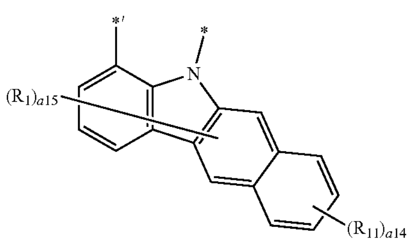

A1-2(74)

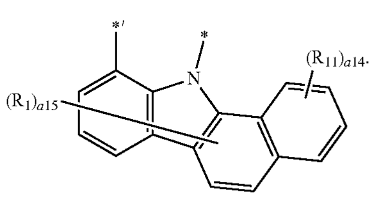

In Formulae A1-1(1) to A1-1(28) and A1-2(1) to A1-2(74), $X_1$ and $R_1$ are the same as described above in the present specification, $X_{11}$ may be O, S, $N(R_{11})$, $C(R_{11})(R_{12})$, or $Si(R_{11})(R_{12})$, $X_{13}$ may be N or $C(R_{13})$, $X_{14}$ may be N or $C(R_{14})$, $R_{11}$ to $R_{18}$ are the same as described in connection with $R_1$, a17 may be an integer of 0 to 7, a16 may be an integer of 0 to 6, a15 may be an integer of 0 to 5, a14 may be an integer of 0 to 4, a13 may be an integer of 0 to 3, a12 may be an integer of 0 to 2,

* indicates a binding site to M or $X_5$ of Formula 1, and

*' indicates a binding site to $T_1$ of Formula 1.

In one or more embodiments, a moiety represented by

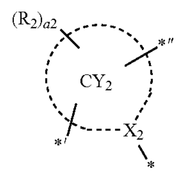

in Formula 1 may be represented by one selected from Formulae A2-1(1) to A2-1(17):

A2-1(1)

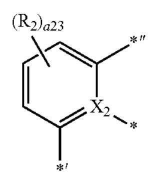

A2-1(2)

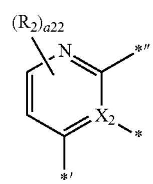

A2-1(3)

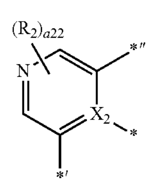

A2-1(4)

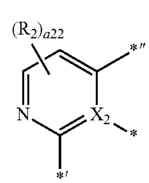

A2-1(5)

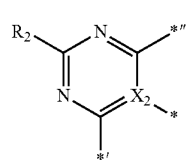

-continued

A2-1(6)

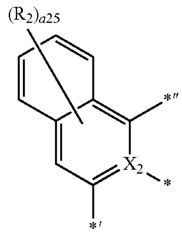

A2-1(7)

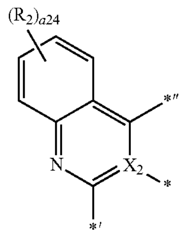

A2-1(8)

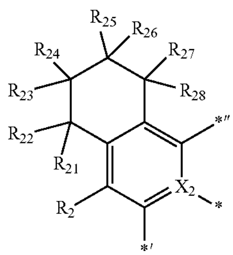

A2-1(9)

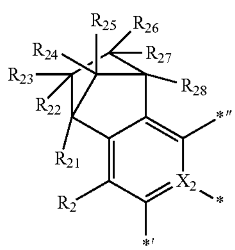

A2-1(10)

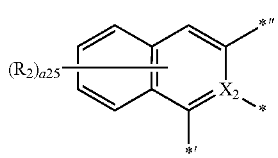

A2-1(11)

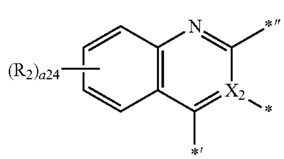

A2-1(12)

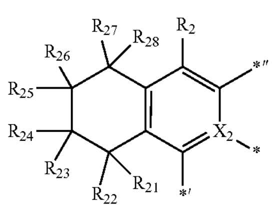

-continued

A2-1(13)

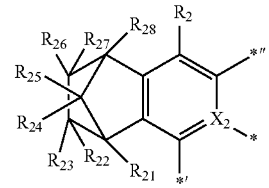

A2-1(14)

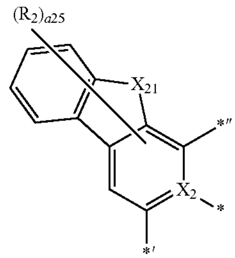

A2-1(15)

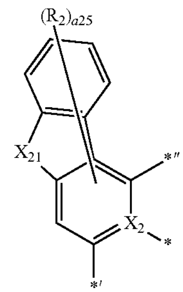

A2-1(16)

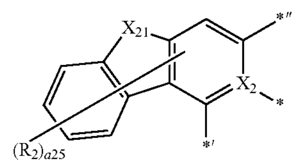

A2-1(17)

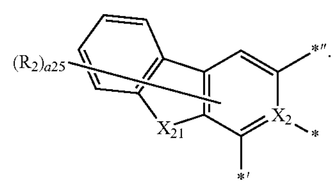

In Formulae A2-1(1) to A2-1(17), $X_2$ and $R_2$ are the same as described above in the present specification, $X_{21}$ may be O, S, $N(R_{21})$, $C(R_{21})(R_{22})$, or $Si(R_{21})(R_{22})$, $R_{21}$ to $R_{28}$ are the same as described in connection with $R_2$, a26 may be an integer of 0 to 6, a25 may be an integer of 0 to 5, a24 may be an integer of 0 to 4, a23 may be an integer of 0 to 3, a22 may be an integer of 0 to 2,

* indicates a binding site to M of Formula 1,

*' indicates a binding site to $T_1$ of Formula 1, and

*" indicates a binding site to $Y_6$ of Formula 1.

In one or more embodiments, a moiety represented by
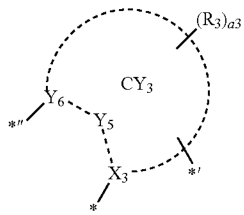
in Formula 1 may be represented by one selected from Formulae A3-3(1) to A3-3(61):
A3-3(1)
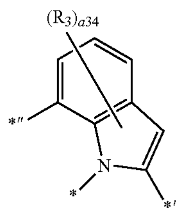
A3-3(2)
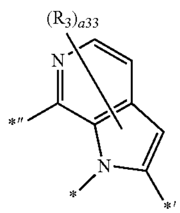
A3-3(3)
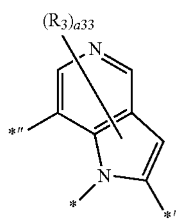
A3-3(4)
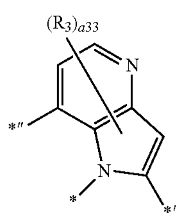
A3-3(5)
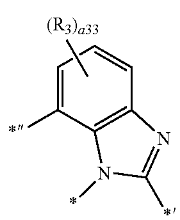
-continued
A3-3(6)
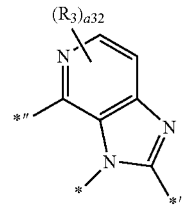
A3-3(7)
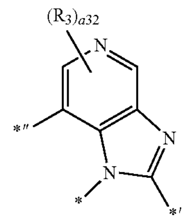
A3-3(8)
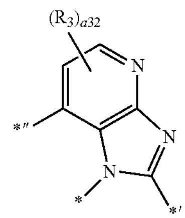
A3-3(9)
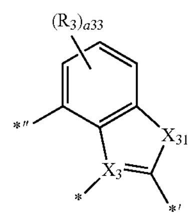
A3-3(10)
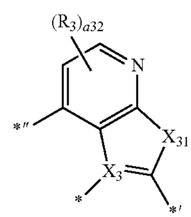
A3-3(11)
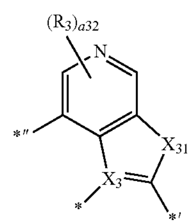
A3-3(12)
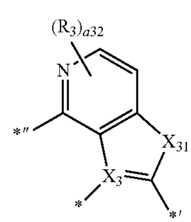

-continued
A3-3(13)
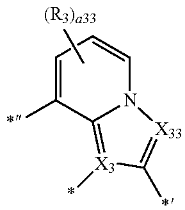
A3-3(14)
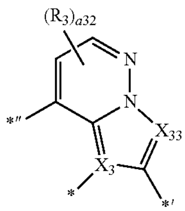
A3-3(15)
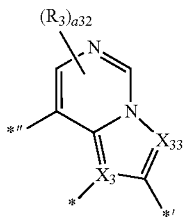
A3-3(16)
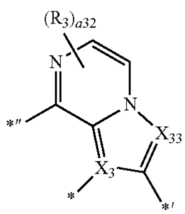
A3-3(17)
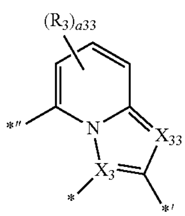
A3-3(18)
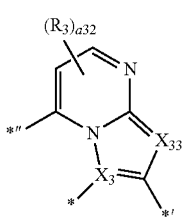
A3-3(19)
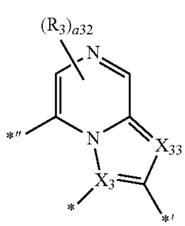
-continued
A3-3(20)
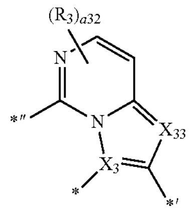
A3-3(21)
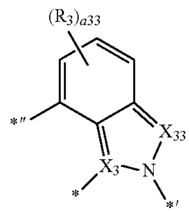
A3-3(22)
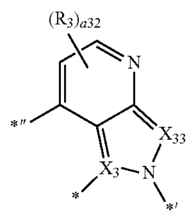
A3-3(23)
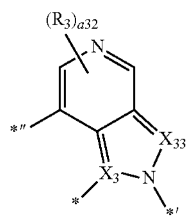
A3-3(24)
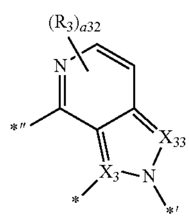
A3-3(25)
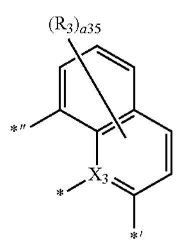
A3-3(26)
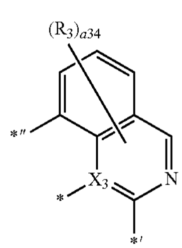

-continued
A3-3(27)
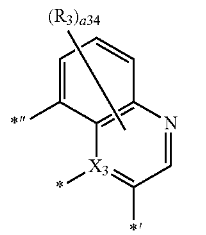
A3-3(28)
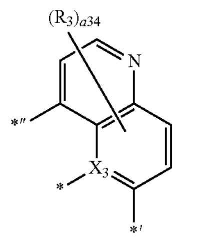
A3-3(29)
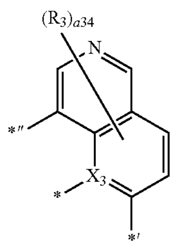
A3-3(30)
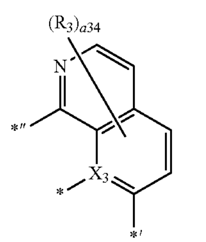
A3-3(31)
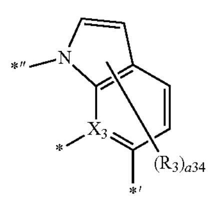
A3-3(32)
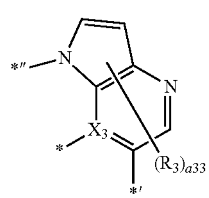
A3-3(33)
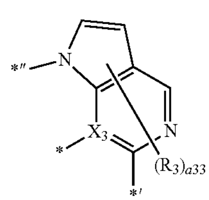
-continued
A3-3(34)
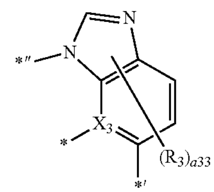
A3-3(35)
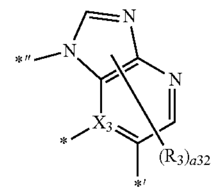
A3-3(36)
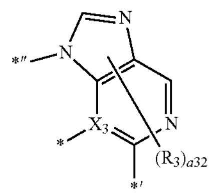
A3-3(37)
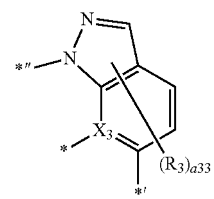
A3-3(38)
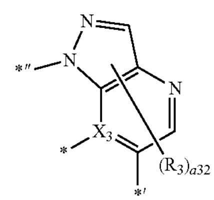
A3-3(39)
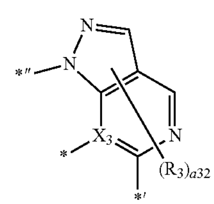
A3-3(40)
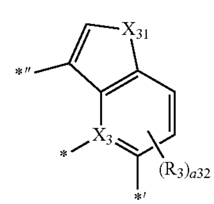
A3-3(41)
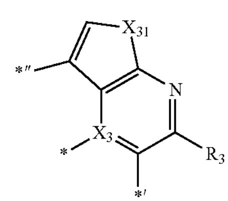

-continued
A3-3(42)
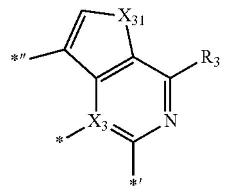
A3-3(43)
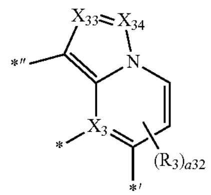
A3-3(44)
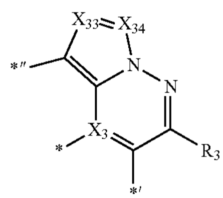
A3-3(45)
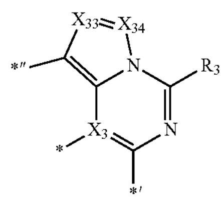
A3-3(46)
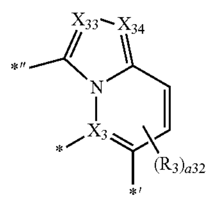
A3-3(47)
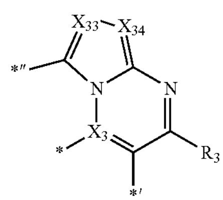
A3-3(48)
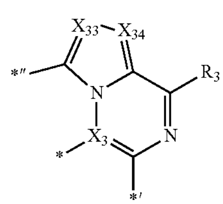
A3-3(49)
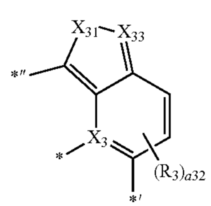
-continued
A3-3(50)
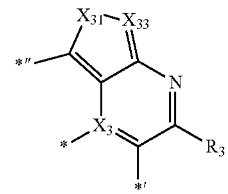
A3-3(51)
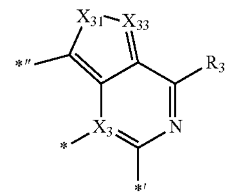
A3-3(52)
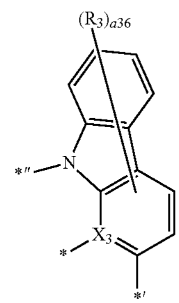
A3-3(53)
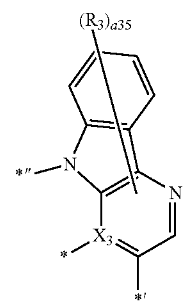
A3-3(54)
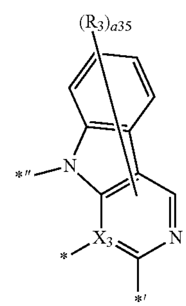
A3-3(55)
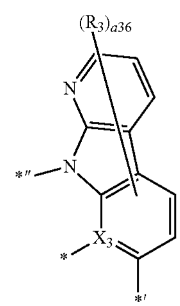

-continued

A3-3(56)

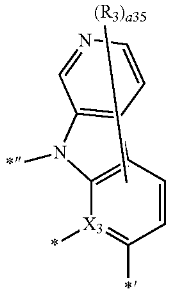

A3-3(57)

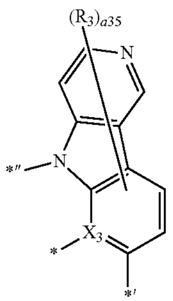

A3-3(58)

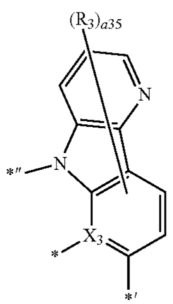

A3-3(59)

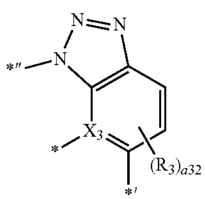

A3-3(60)

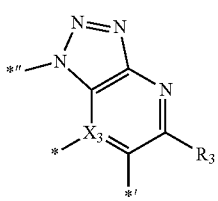

A3-3(61)

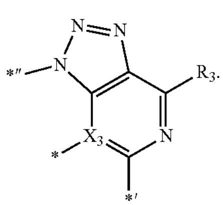

In Formulae A3-3(1) to A3-3(61), $X_3$ and $R_3$ are the same described above in the present specification, $X_{31}$ may be O, S, $N(R_{31})$, $C(R_{31})(R_{32})$, or $Si(R_{31})(R_{32})$, $X_{33}$ may be N or $C(R_{33})$, $X_{34}$ may be N or $C(R_{34})$, $R_{31}$ to $R_{38}$ are the same as described in connection with $R_3$, a36 may be an integer of 0 to 6, a35 may be an integer of 0 to 5, a34 may be an integer of 0 to 4, a33 may be an integer of 0 to 3, a32 may be an integer of 0 to 2,

* indicates a binding site to M of Formula 1,

*" indicates a binding site to ring $CY_2$ of Formula 1, and

*' indicates a binding site to $T_2$ of Formula 1.

In one or more embodiments, a moiety represented by

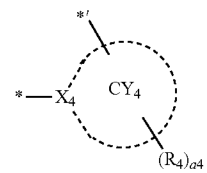

in Formula 1 may be represented by one selected from Formulae A4-1(1) to A4-1(28) and A4-2(1) to A4-2(71):

A4-1(1)

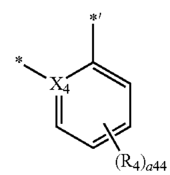

A4-1(2)

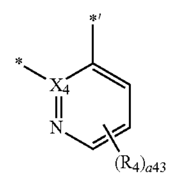

A4-1(3)

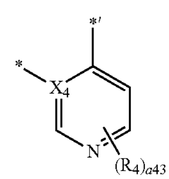

A4-1(4)

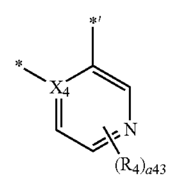

A4-1(5)

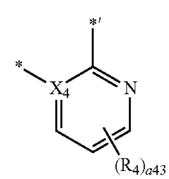

-continued
A4-1(6)
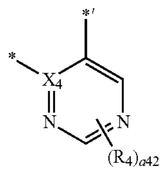
A4-1(7)
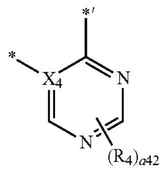
A4-1(8)
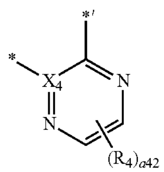
A4-1(9)
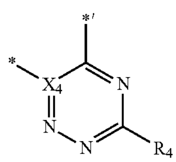
A4-1(10)
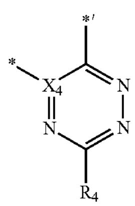
A4-1(11)
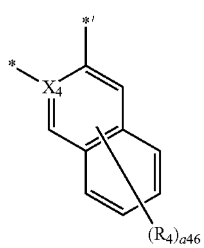
A4-1(12)
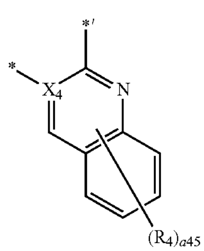
-continued
A4-1(13)
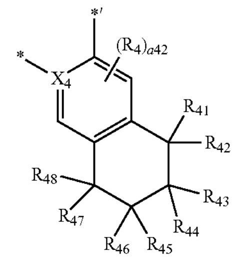
A4-1(14)
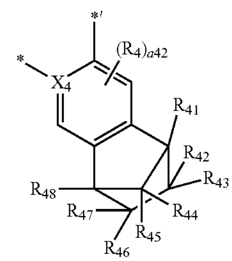
A4-1(15)
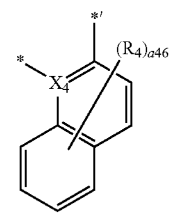
A4-1(16)
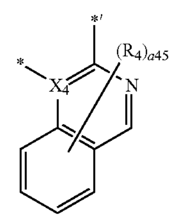
A4-1(17)
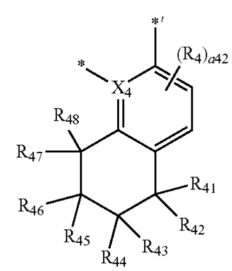
A4-1(18)
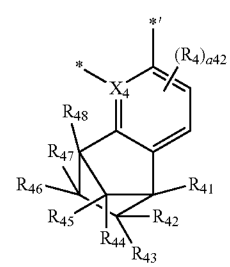
A4-1(19)
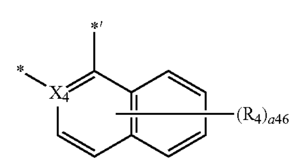

-continued
A4-1(20)
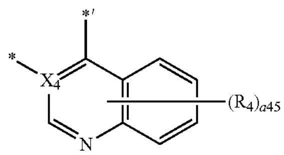
A4-1(21)
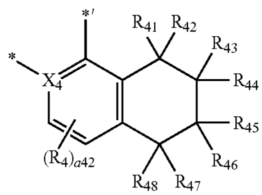
A4-1(22)
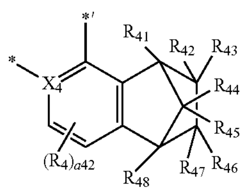
A4-1(23)
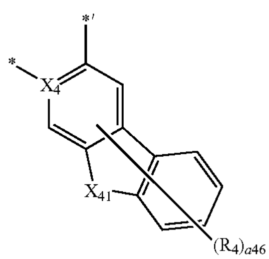
A4-1(24)
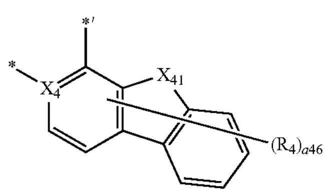
A4-1(25)
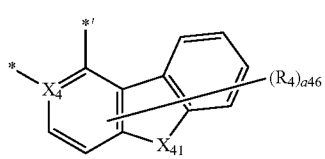
A4-1(26)
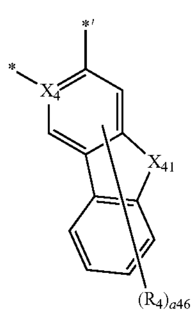
-continued
A4-1(27)
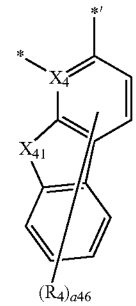
A4-1(28)
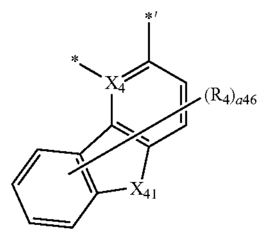
A4-2(1)
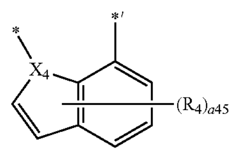
A4-2(2)
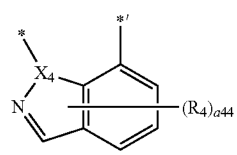
A4-2(3)
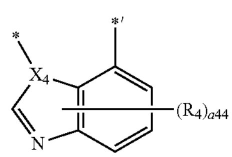
A4-2(4)
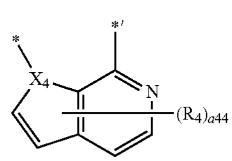
A4-2(5)
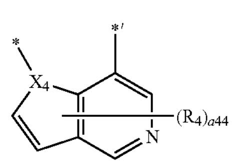
A4-2(6)
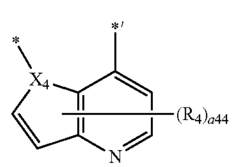

-continued
A4-2(7)
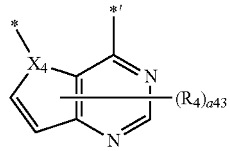
A4-2(8)
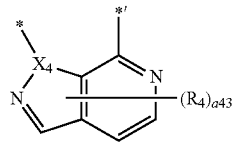
A4-2(9)
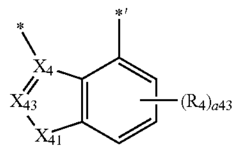
A4-2(10)
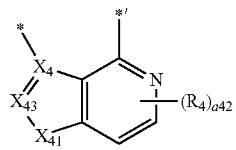
A4-2(11)
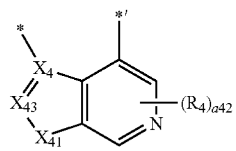
A4-2(12)
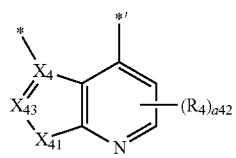
A4-2(13)
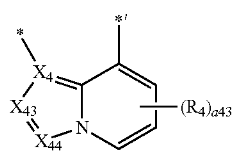
A4-2(14)
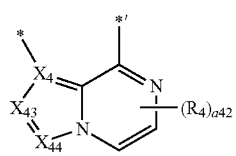
A4-2(15)
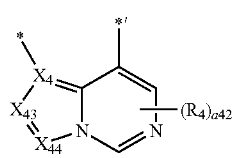
A4-2(16)
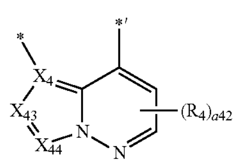
-continued
A4-2(17)
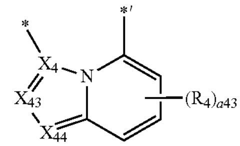
A4-2(18)
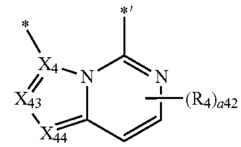
A4-2(19)
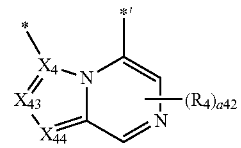
A4-2(20)
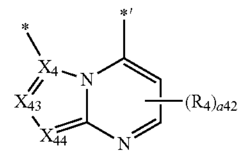
A4-2(21)
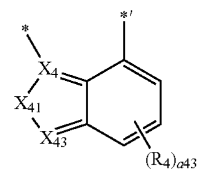
A4-2(22)
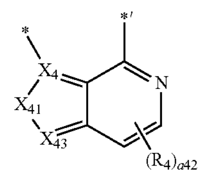
A4-2(23)
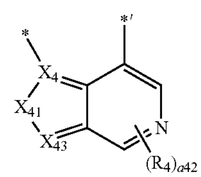
A4-2(24)
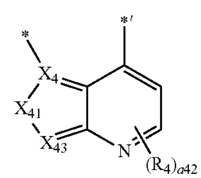
A4-2(25)
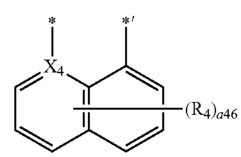

-continued
A4-2(26)
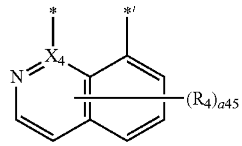
A4-2(27)
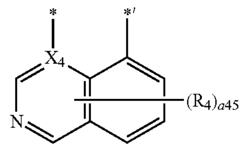
A4-2(28)
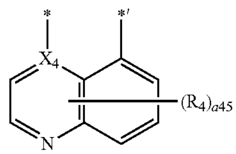
A4-2(29)
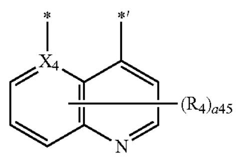
A4-2(30)
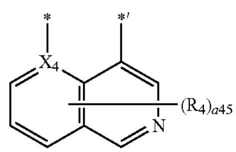
A4-2(31)
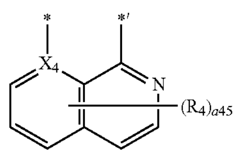
A4-2(32)
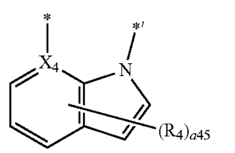
A4-2(33)
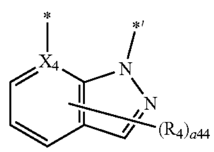
A4-2(34)
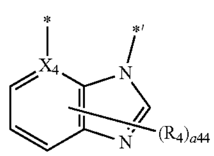
A4-2(35)
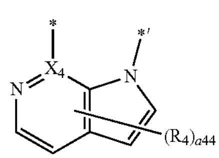
-continued
A4-2(36)
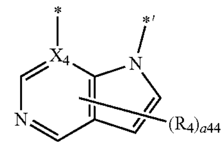
A4-2(37)
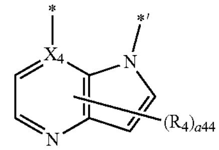
A4-2(38)
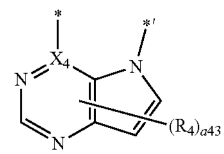
A4-2(39)
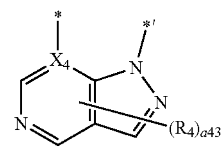
A4-2(40)
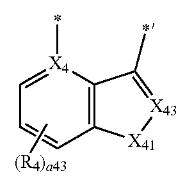
A4-2(41)
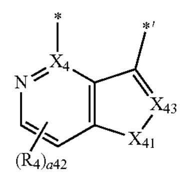
A4-2(42)
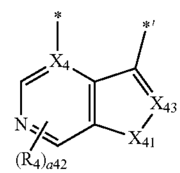
A4-2(43)
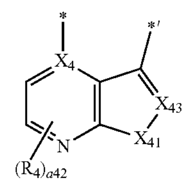
A4-2(44)
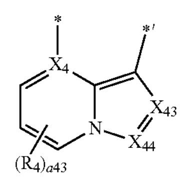

-continued
A4-2(45)
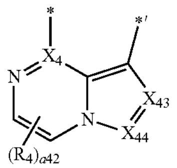
A4-2(46)
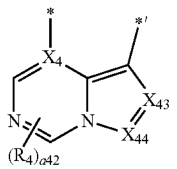
A4-2(47)
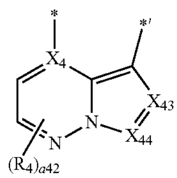
A4-2(48)
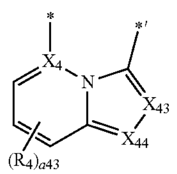
A4-2(49)
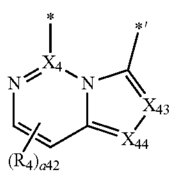
A4-2(50)
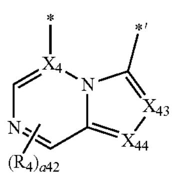
A4-2(51)
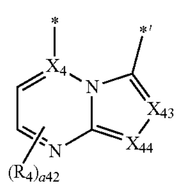
A4-2(52)
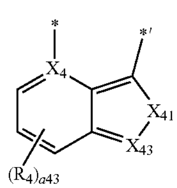
A4-2(53)
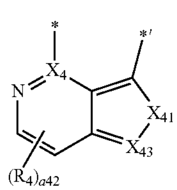
-continued
A4-2(54)
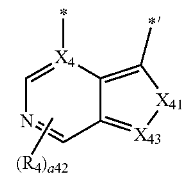
A4-2(55)
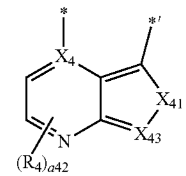
A4-2(56)
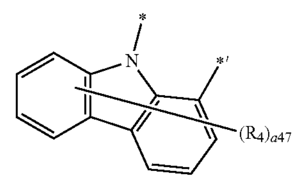
A4-2(57)
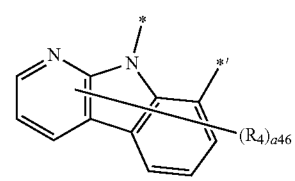
A4-2(58)
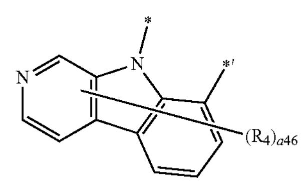
A4-2(59)
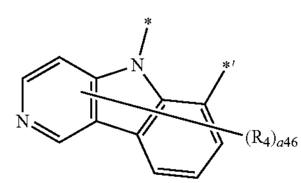
A4-2(60)
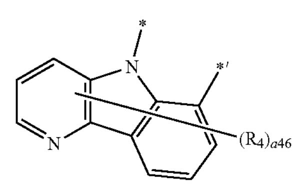
A4-2(61)
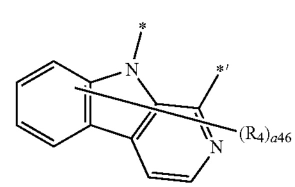

-continued

A4-2(62)

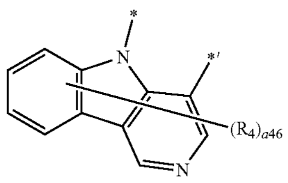

A4-2(63)

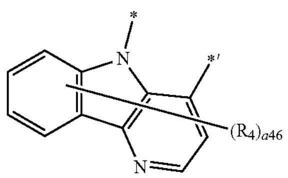

A4-2(64)

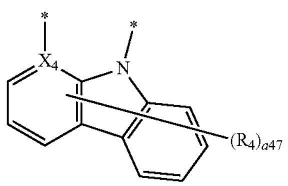

A4-2(65)

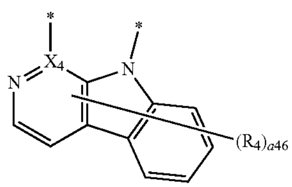

A4-2(66)

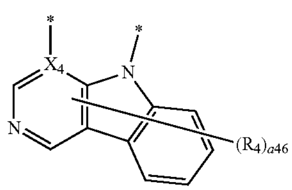

A4-2(67)

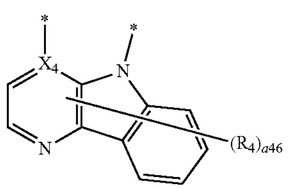

A4-2(68)

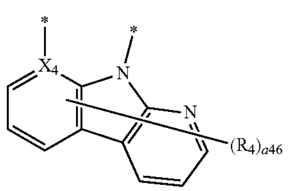

A4-2(69)

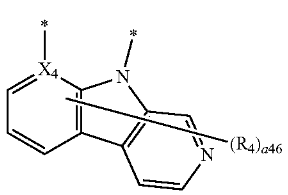

-continued

A4-2(70)

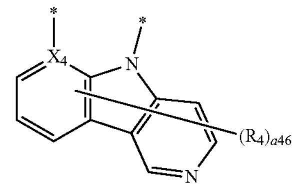

A4-2(71)

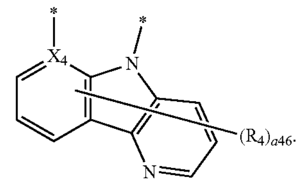

In Formulae A4-1(1) to A4-1 (28) and A4-2(1) to A4-2 (71), $X_4$ and $R_4$ are the same described above in the present specification, $X_{41}$ may be O, S, $N(R_{41})$, $C(R_{41})(R_{42})$, or $Si(R_{41})(R_{42})$, $X_{43}$ may be N or $C(R_{43})$, $X_{44}$ may be N or $C(R_{44})$, $R_{41}$ to $R_{48}$ are the same as described in connection with $R_4$, a47 may be an integer of 0 to 7, a46 may be an integer of 0 to 6, a45 may be an integer of 0 to 5, a44 may be an integer of 0 to 4, a43 may be an integer of 0 to 3, a42 may be an integer of 0 to 2,

* indicates a binding site to M or $X_6$ of Formula 1, and

*' indicates a binding site to $T_2$ of Formula 1.

In one or more embodiments, regarding Formula 1, the moiety represented by

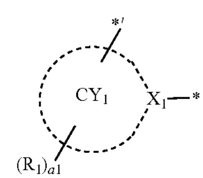

may be represented by one selected from Formulae CY1-1 to CY1-41, and/or the moiety represented by

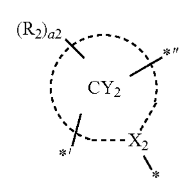

may be represented by one selected from Formulae CY2-1 to CY2-15, and/or the moiety represented by
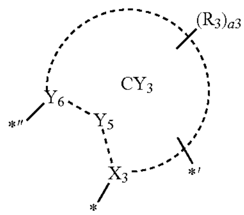
may be represented by one selected from Formulae CY3-1 to CY3-13, and/or
the moiety represented by
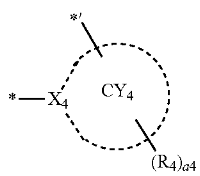
may be represented by one selected from Formulae CY4-1 to CY4-41, but embodiments of the present disclosure are not limited thereto:
CY1-1
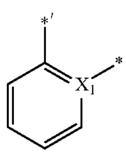
CY1-2
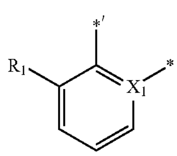
CY1-3
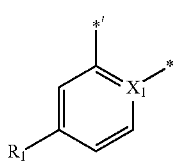
CY1-4
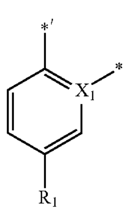
CY1-5
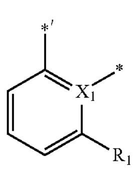
-continued
CY1-6
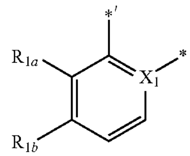
CY1-7
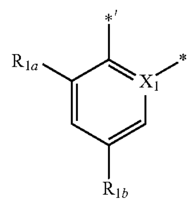
CY1-8
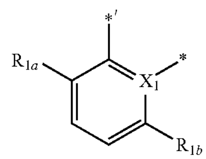
CY1-9
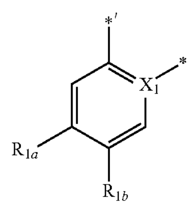
CY1-10
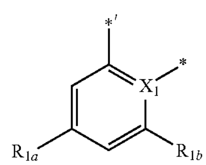
CY1-11
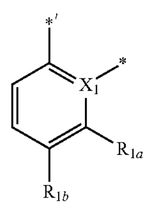
CY1-12
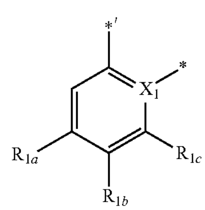
CY1-13
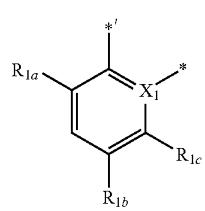

-continued
CY1-14
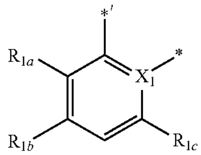
CY1-15
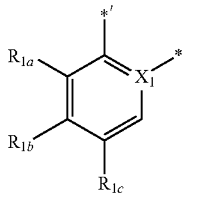
CY1-16
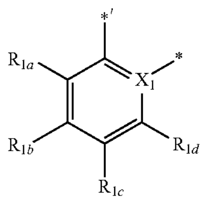
CY1-17
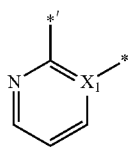
CY1-18
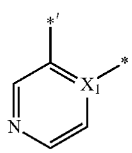
CY1-19
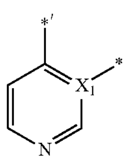
CY1-20
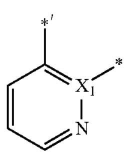
CY1-21
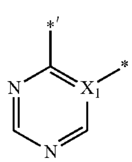
CY1-22
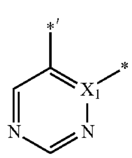
-continued
CY1-23
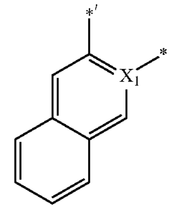
CY1-24
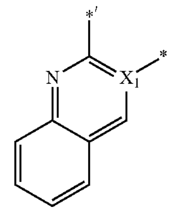
CY1-25
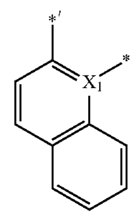
CY1-26
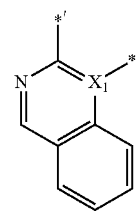
CY1-27
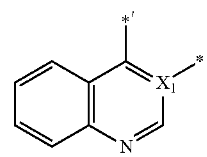
CY1-28
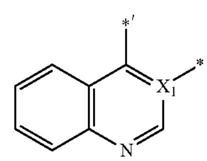
CY1-29
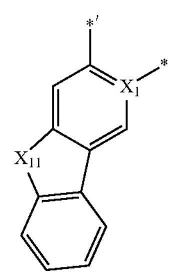

-continued
CY1-30
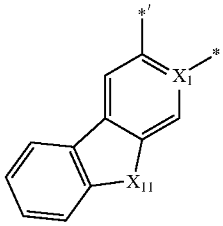
CY1-31
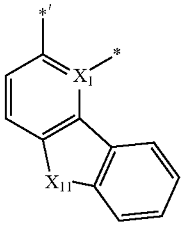
CY1-32
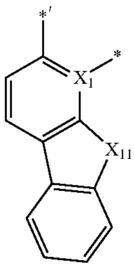
CY1-33
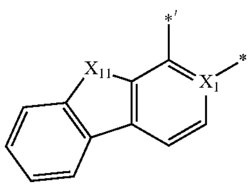
CY1-34
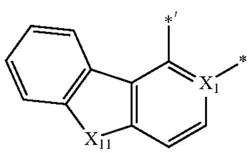
CY1-35
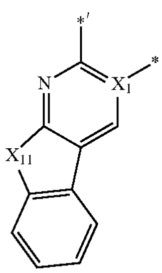
CY1-36
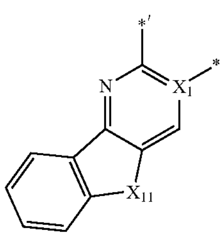
-continued
CY1-37
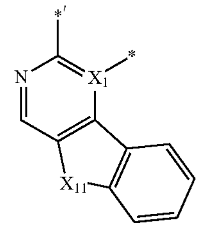
CY1-38
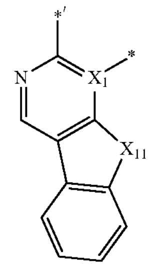
CY1-39
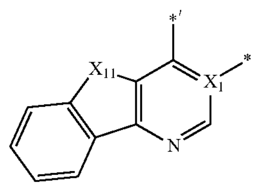
CY1-40
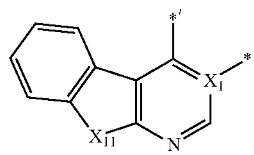
CY1-41
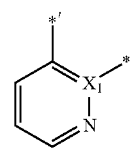
CY2-1
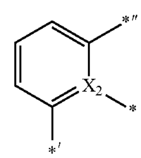
CY2-2
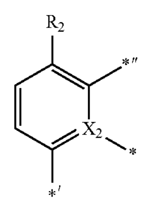
CY2-3
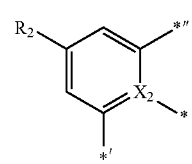

CY2-4
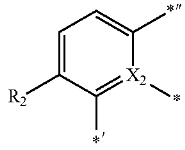
CY2-5
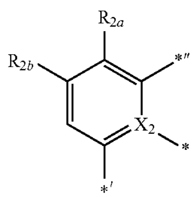
CY2-6
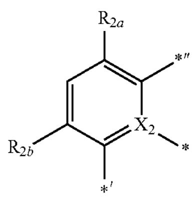
CY2-7
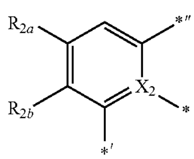
CY2-8
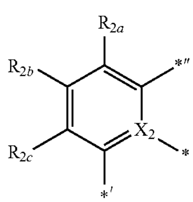
CY2-9
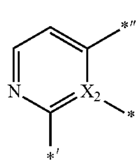
CY2-10
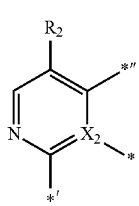
CY2-11
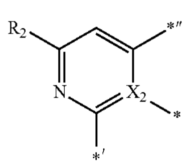
CY2-12
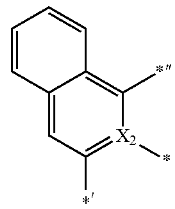
CY2-13
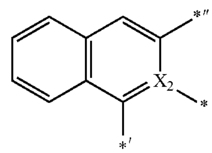
CY2-14
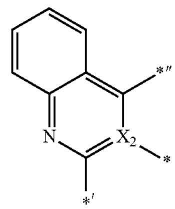
CY2-15
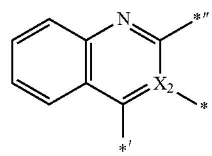
CY3-1
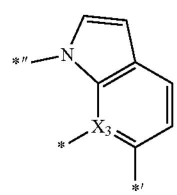
CY3-2
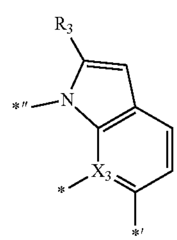
CY3-3
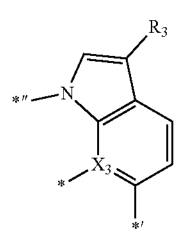
CY3-4
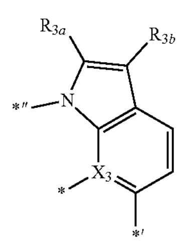

-continued
CY3-5
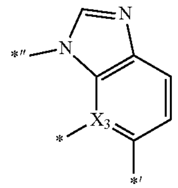
CY3-6
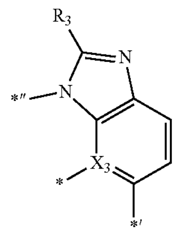
CY3-7
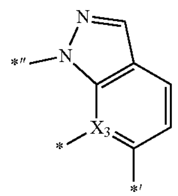
CY3-8
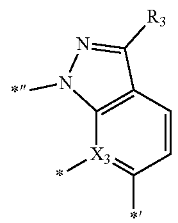
CY3-9
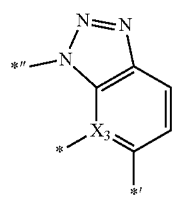
CY3-10
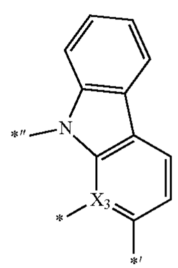
CY3-11
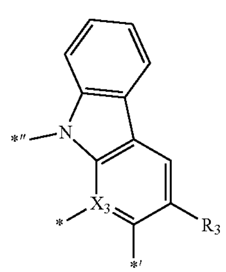
-continued
CY3-12
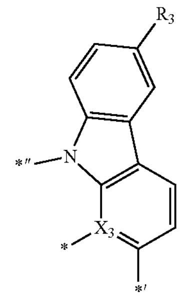
CY3-13
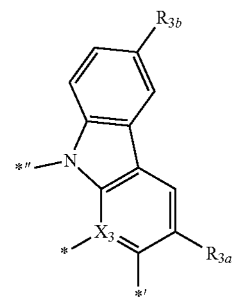
CY4-1
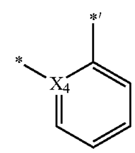
CY4-2
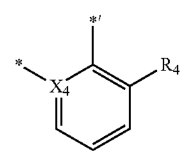
CY4-3
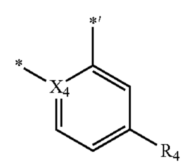
CY4-4
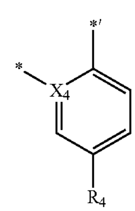
CY4-5
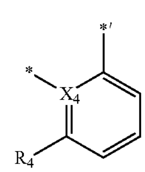
CY4-6
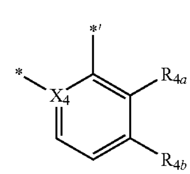

-continued
CY4-7
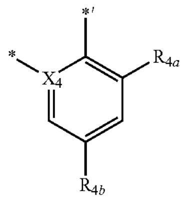
CY4-8
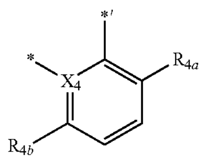
CY4-9
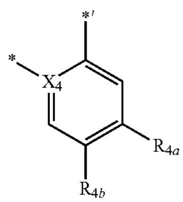
CY4-10
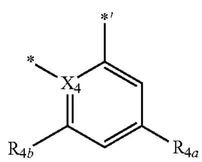
CY4-11
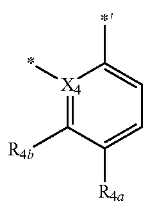
CY4-12
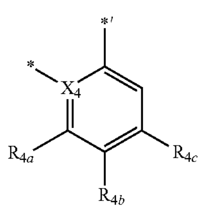
CY4-13
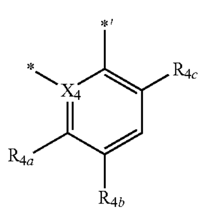
CY4-14
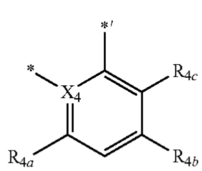
-continued
CY4-15
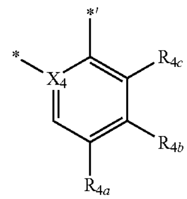
CY4-16
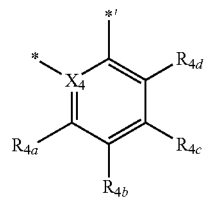
CY4-17
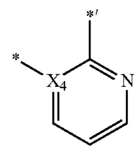
CY4-18
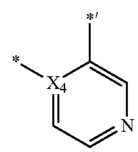
CY4-19
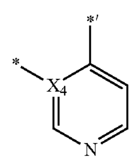
CY4-20
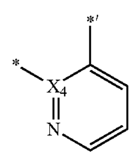
CY4-21
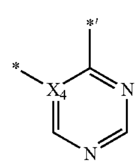
CY4-22
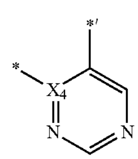
CY4-23
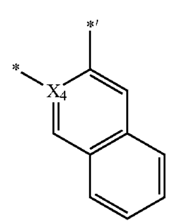

-continued
CY4-24
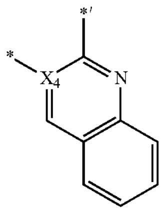
CY4-25
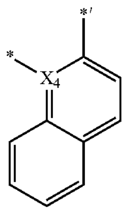
CY4-26
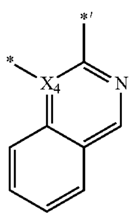
CY4-27
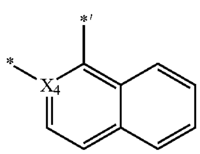
CY4-28
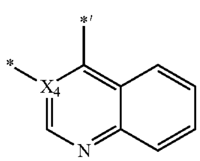
CY4-29
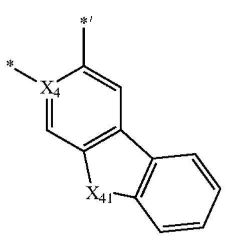
CY4-30
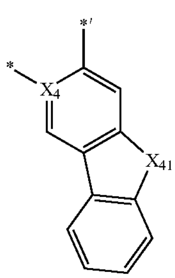
-continued
CY4-31
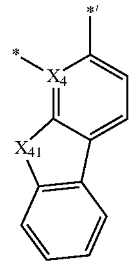
CY4-32
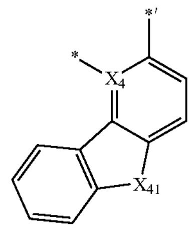
CY4-33
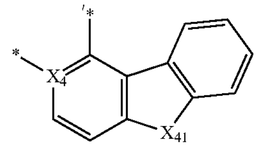
CY4-34
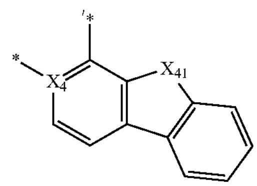
CY4-35
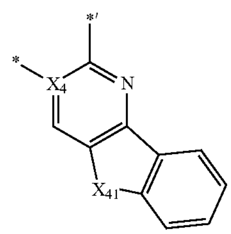
CY4-36
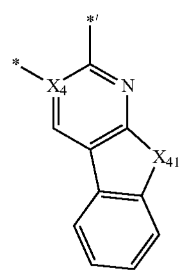
CY4-37
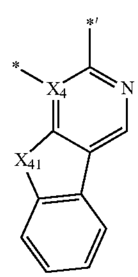

-continued

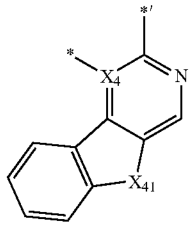

CY4-38

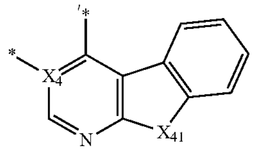

CY4-39

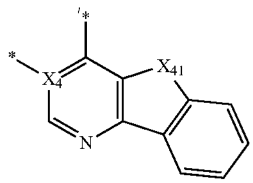

CY4-40

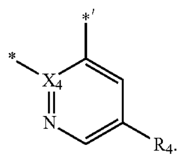

CY4-41

In Formulae CY1-1 to CY1-41, CY2-1 to CY2-15, CY3-1 to CY3-13, and CY4-1 to CY4-41, $X_1$ to $X_4$ and $R_1$ to $R_4$ are the same as described above in the present specification, $X_{11}$ may be O, S, $N(R_{11})$, $C(R_{11})(R_{12})$, or $Si(R_{11})(R_{12})$, $X_{41}$ may be O, S, $N(R_{41})$, $C(R_{41})(R_{42})$, or $Si(R_{41})(R_{42})$, $R_{1a}$ to $R_{1d}$, $R_{11}$, and $R_{12}$ are the same as described in connection with $R_1$, $R_{2a}$ to $R_{2c}$ are the same as described in connection with $R_2$, $R_{3a}$ to $R_{3c}$ are the same as described in connection with $R_3$, $R_{4a}$ to $R_{4d}$, $R_{41}$, and $R_{42}$ are the same as described in connection with $R_4$, $R_1$ to $R_4$, $R_{1a}$ to $R_{1d}$, $R_{2a}$ to $R_{2c}$, $R_{3a}$ to $R_{3c}$, and $R_{4a}$ to $R_{4d}$ may not be hydrogen, in Formulae CY1-1 to CY1-41, * indicates a binding site to M or $X_5$ of Formula 1, and *' indicates a binding site to $T_1$ of Formula 1, in Formulae CY2-1 to CY2-15, * indicates a binding site to M of Formula 1, *' indicates a binding site to $T_1$ of Formula 1, and *" indicates a binding site to $T_2$ of Formula 1, in Formulae CY3-1 to CY3-13, * indicates a binding site to M of Formula 1, *" indicates a binding site to $T_2$ of Formula 1, and *' indicates a binding site to $T_3$ of Formula 1, in Formulae CY4-1 to CY4-41, * indicates a binding site to M or $X_6$ of Formula 1, and *' indicates a binding site to $T_2$ of Formula 1.

In one or more embodiments, the organometallic compound may be represented by Formula 1A or Formula 1B:

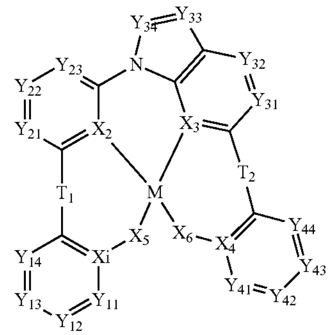

1A

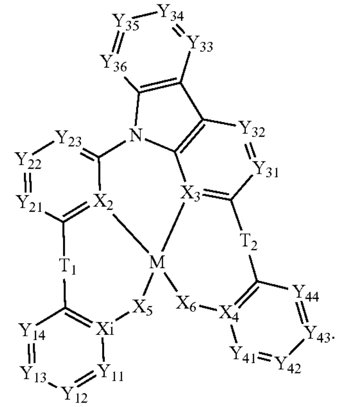

1B

In Formulae 1A and 1B,

M, $X_1$ to $X_6$, $T_1$, and $T_2$ are the same as described above in the present specification, $Y_{11}$ may be $C(Z_{11})$ or N, $Y_{12}$ may be $C(Z_{12})$ or N, $Y_{13}$ may be $C(Z_{13})$ or N, $Y_{14}$ may be $C(Z_{14})$ or N, $Y_{21}$ may be $C(Z_{21})$ or N, $Y_{22}$ may be $C(Z_{22})$ or N, $Y_{23}$ may be $C(Z_{23})$ or N, $Y_{31}$ may be $C(Z_{31})$ or N, $Y_{32}$ may be $C(Z_{32})$ or N, $Y_{33}$ may be $C(Z_{33})$ or N, $Y_{34}$ may be $C(Z_{34})$ or N, $Y_{35}$ may be $C(Z_{35})$ or N, $Y_{36}$ may be $C(Z_{36})$ or N, $Y_{41}$ may be $C(Z_{41})$ or N, $Y_{42}$ may be $C(Z_{42})$ or N, $Y_{43}$ may be $C(Z_{43})$ or N, and $Y_{44}$ may be $C(Z_{44})$ or N, $Z_{11}$ to $Z_{14}$ are the same as described in connection with $R_1$, wherein two selected from $Z_{11}$ to $Z_{14}$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $Z_{21}$ to $Z_{23}$ are the same as described in connection with $R_2$, wherein two selected from $Z_{21}$ to $Z_{23}$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $Z_{31}$ to $Z_{36}$ are the same as described in connection with $R_3$, wherein two selected from $Z_{31}$ to $Z_{36}$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $Z_{41}$ to $Z_{44}$ are the same as described in connection with $R_4$, wherein two selected from $Z_{41}$ to $Z_{44}$ may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, and $R_{10a}$ is the same as described in connection with $R_1$, wherein i) $X_5$ may be a chemical bond, $X_6$ may be O, S, $B(R_7)$, $N(R_7)$, $P(R_7)$, $C(R_7)(R_8)$, $Si(R_7)(R_8)$, $Ge(R_7)(R_8)$, C(=O), $B(R_7)(R_8)$, $N(R_7)(R_8)$, or $P(R_7)(R_8)$, and $T_2$ may be a single bond; or ii) $X_5$ may be O, S, $B(R_5)$, $N(R_5)$, $P(R_5)$, $C(R_5)(R_6)$, $Si(R_5)(R_6)$, $Ge(R_5)(R_6)$, C(=O), $B(R_5)(R_6)$, $N(R_5)(R_6)$, or $P(R_5)(R_6)$, $X_6$ may be a chemical bond, and $T_1$ may be a single bond.

The term "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, and an azadibenzothiophene 5,5-dioxide group" as used herein each refer to a hetero-ring having the same backbone as each of "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group" in which at least one ring-forming carbon is substituted with nitrogen.

In one or more embodiments, the organometallic compound may be one of Compounds 1 to 168 below, but embodiments of the present disclosure are not limited thereto:

1

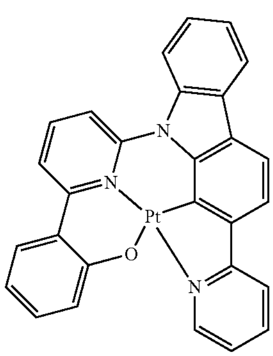

-continued

2

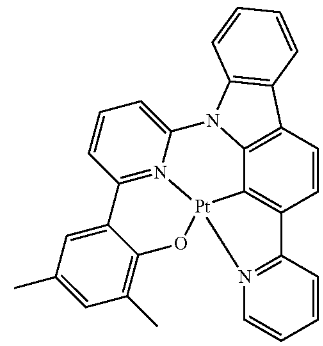

3

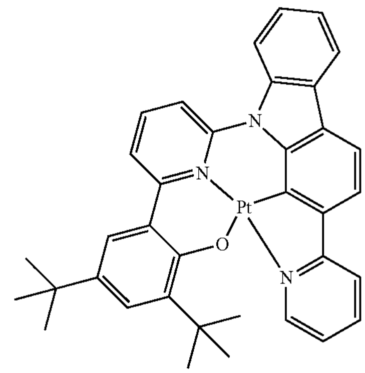

4

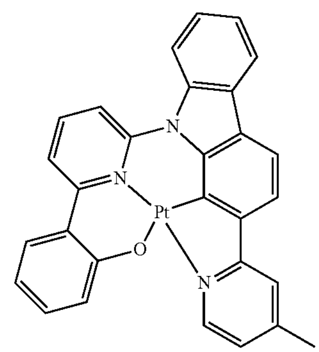

5

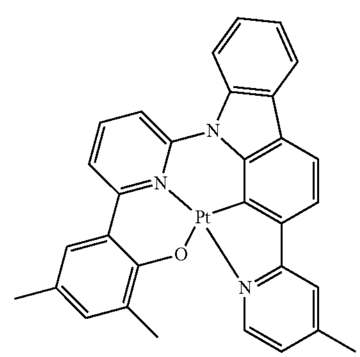

-continued
6
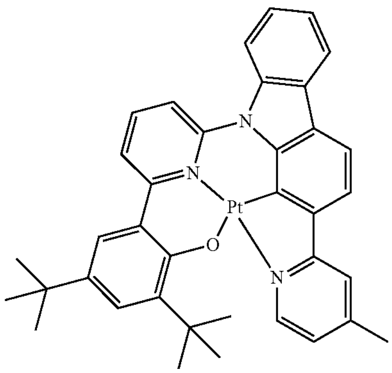
7
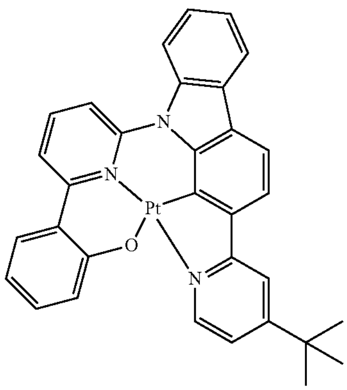
8
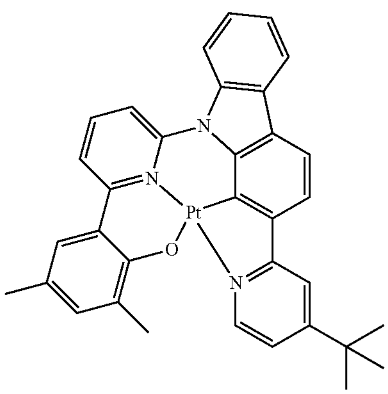
9
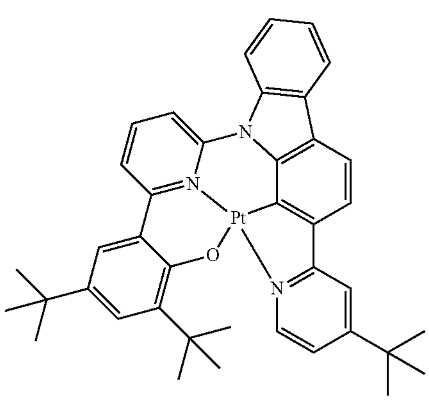
-continued
10
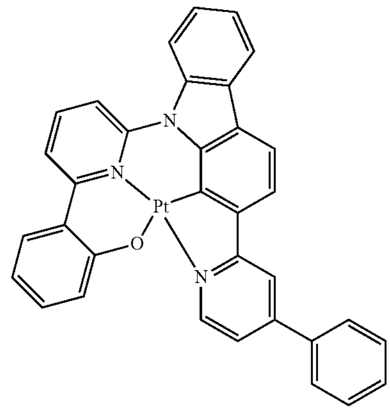
11
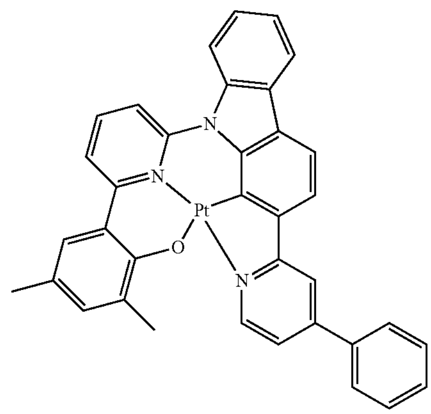
12
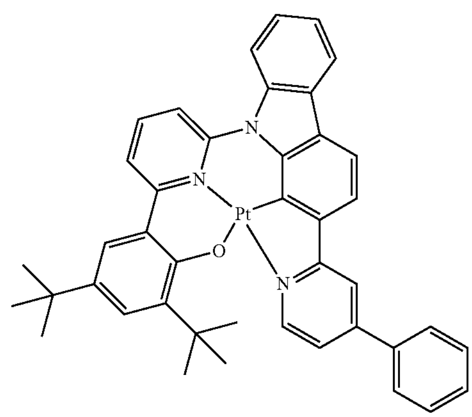
13
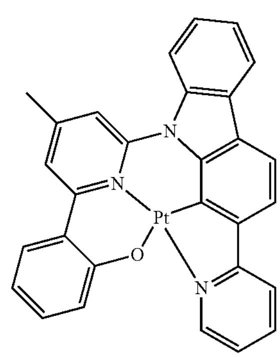

-continued
14
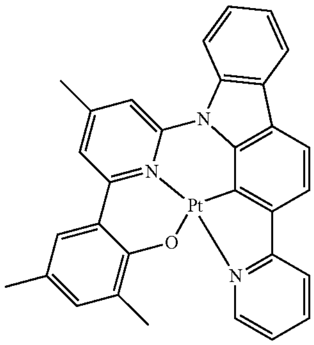
15
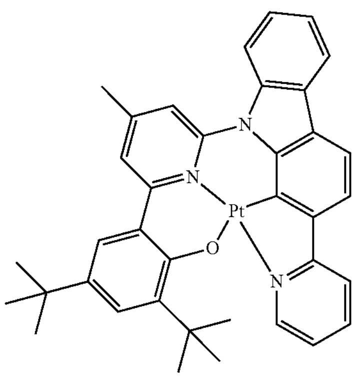
16
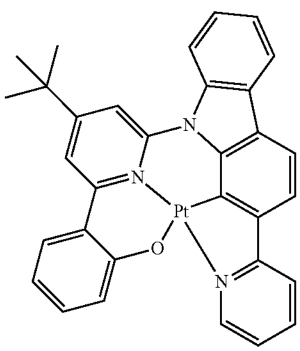
17
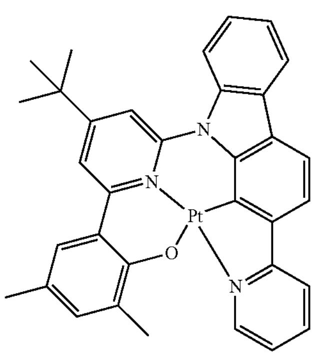
-continued
18
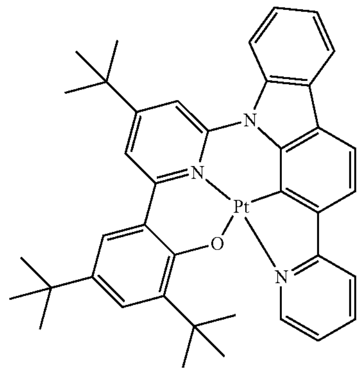
19
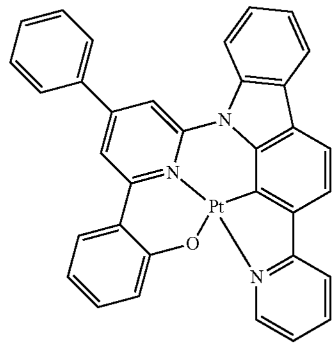
20
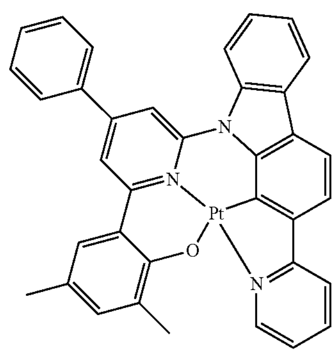
21
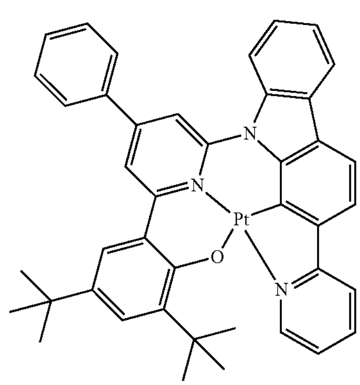

22
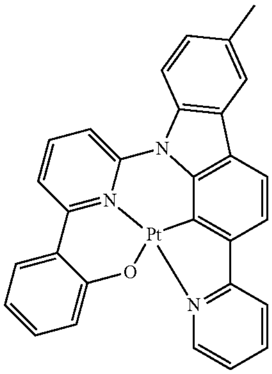
23
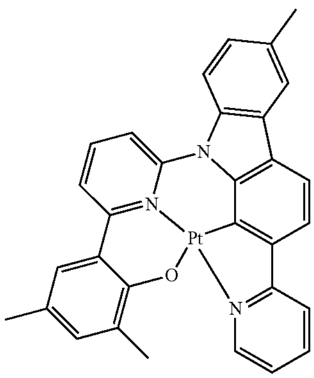
24
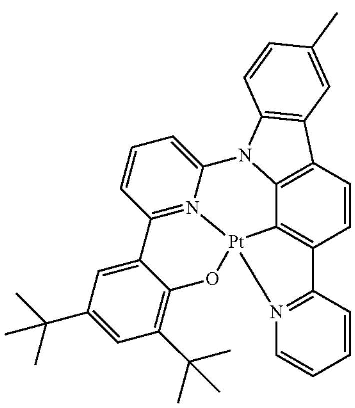
25
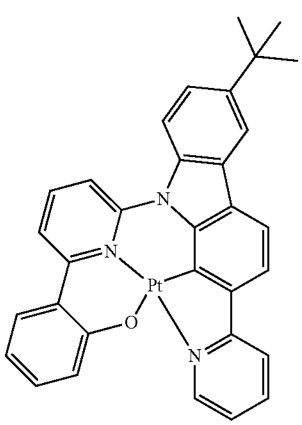
26
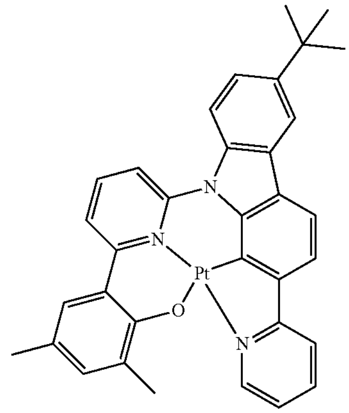
27
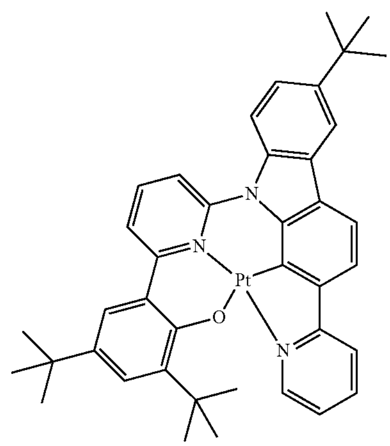
28
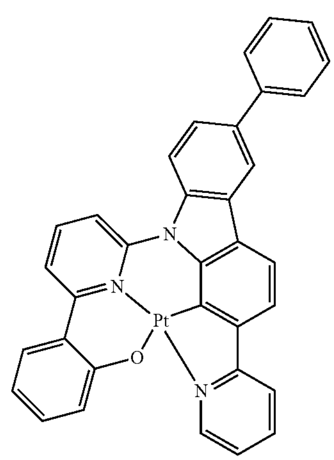

-continued
29
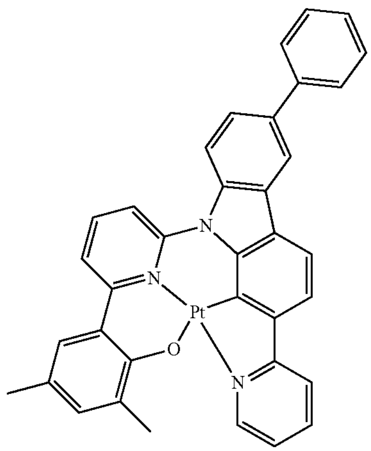
30
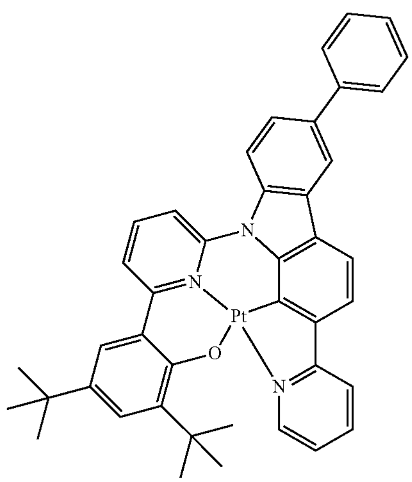
31
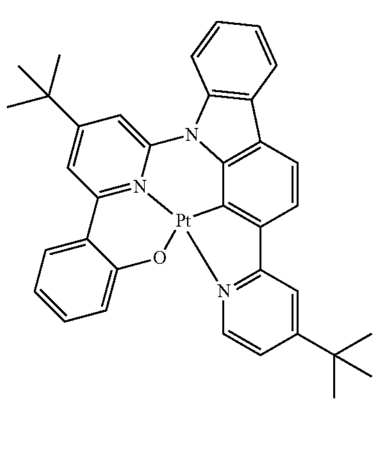
-continued
32
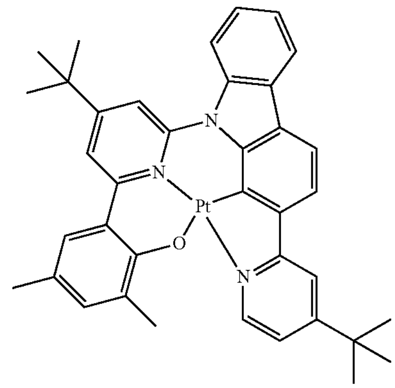
33
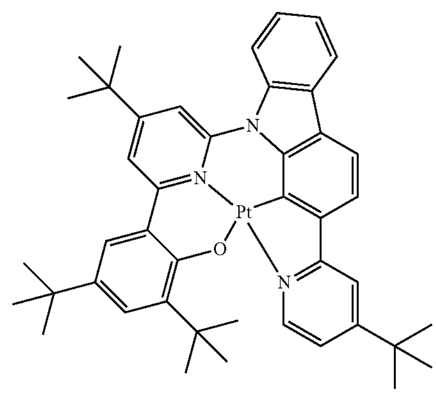
34
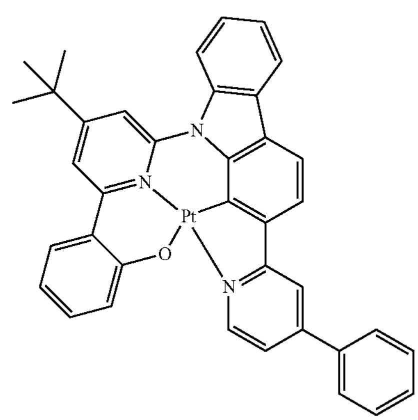
35
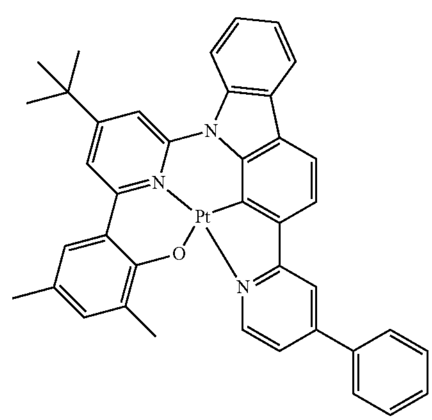

36
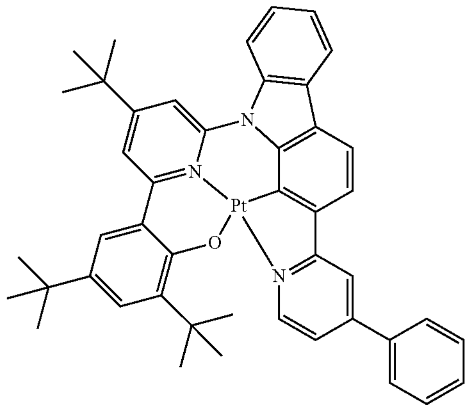
37
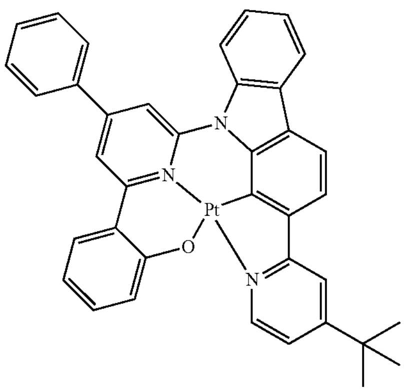
38
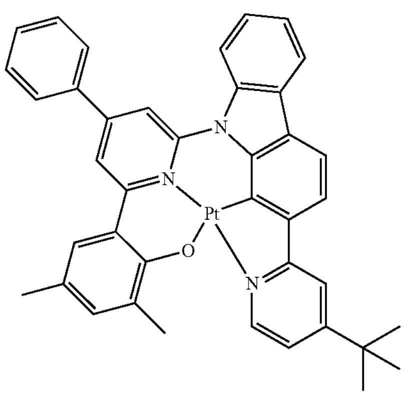
39
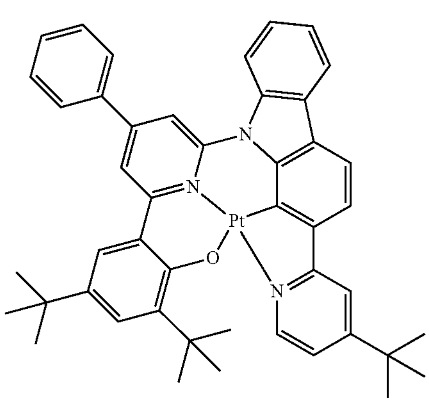
40
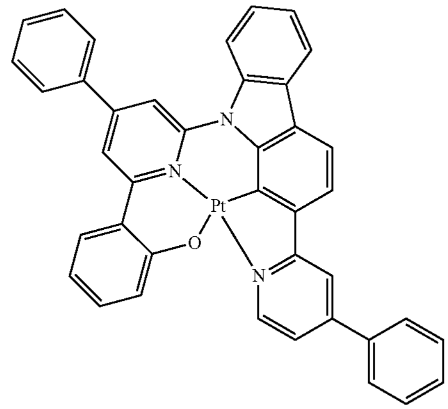
41
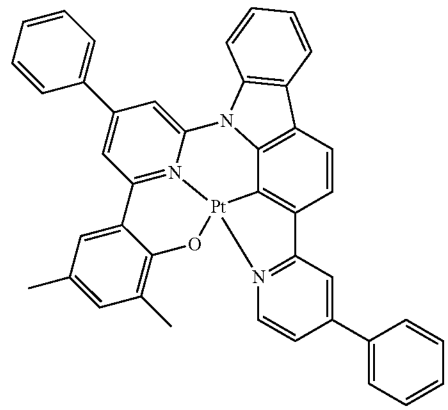
42
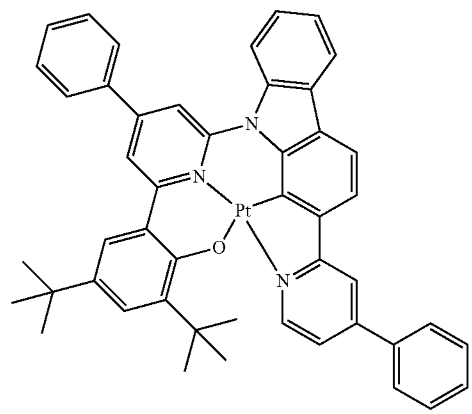
43
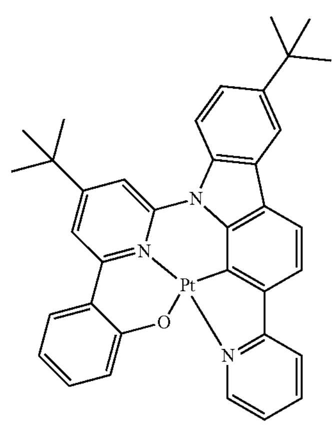

44
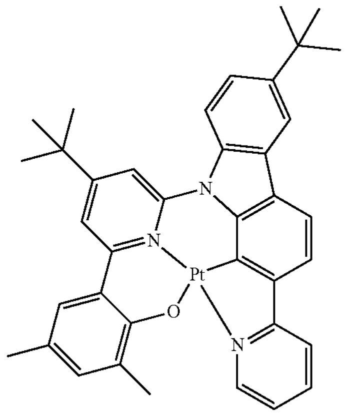
45
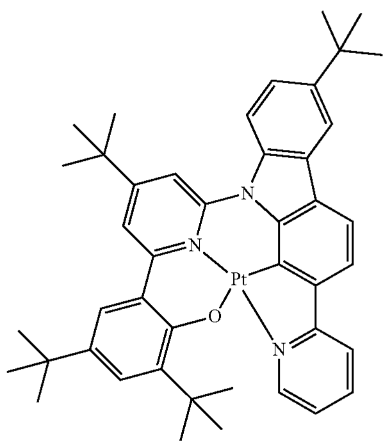
46
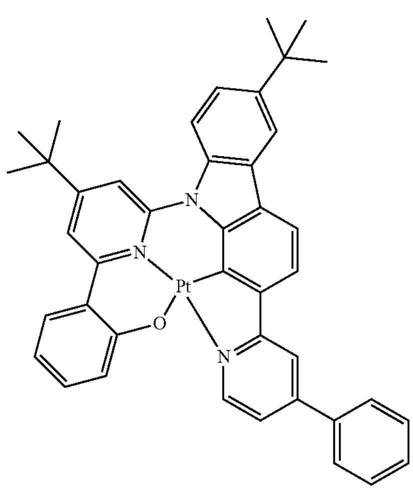
47
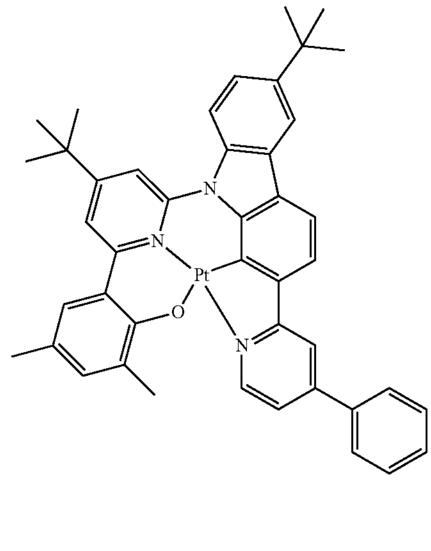
48
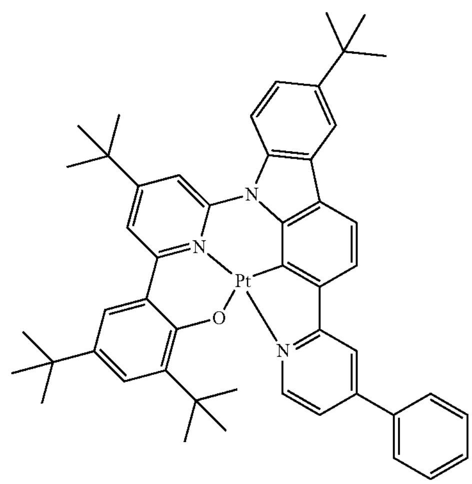
49
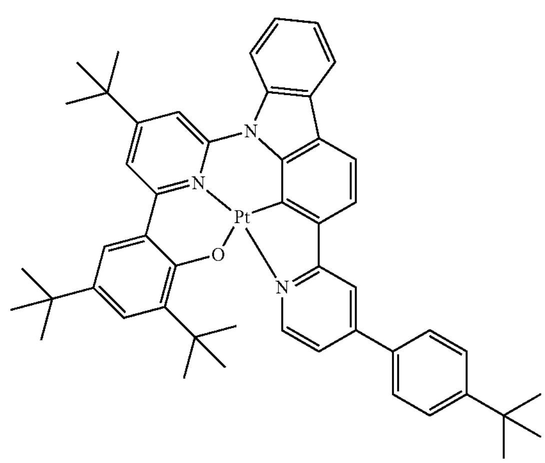

-continued
50
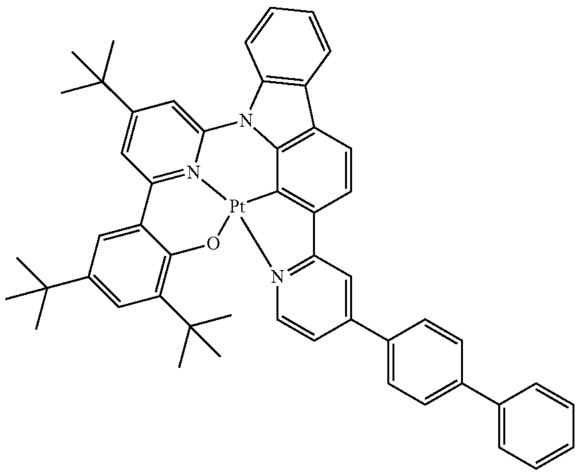
51
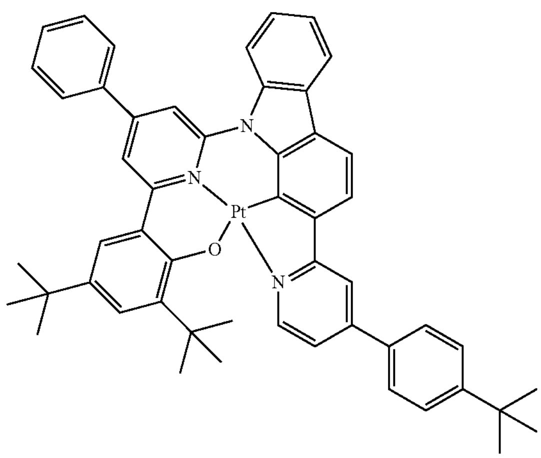
52
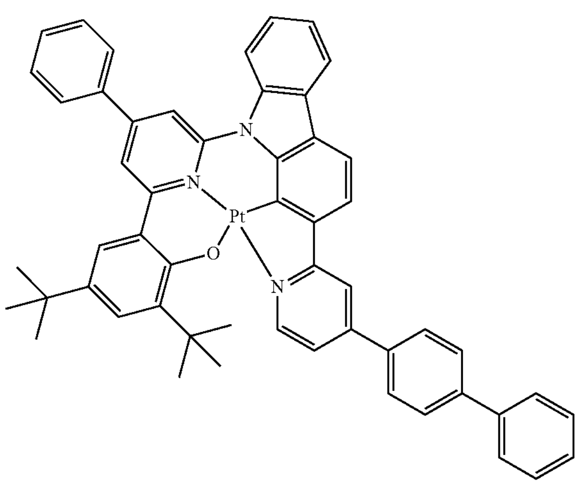
-continued
53
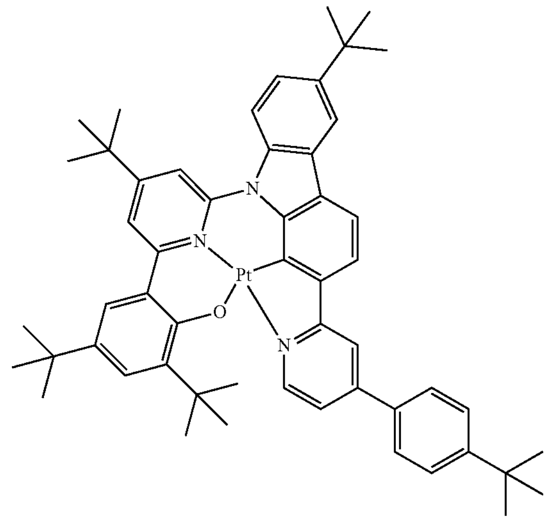
54
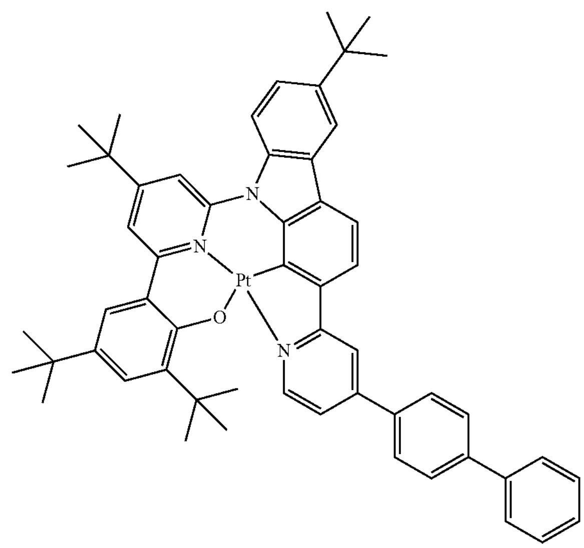
55
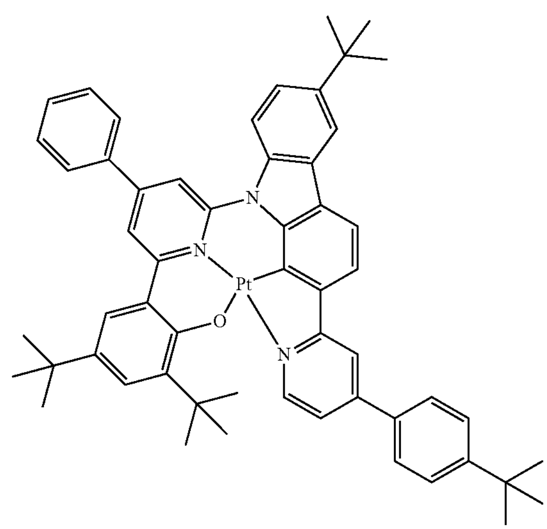

-continued
56
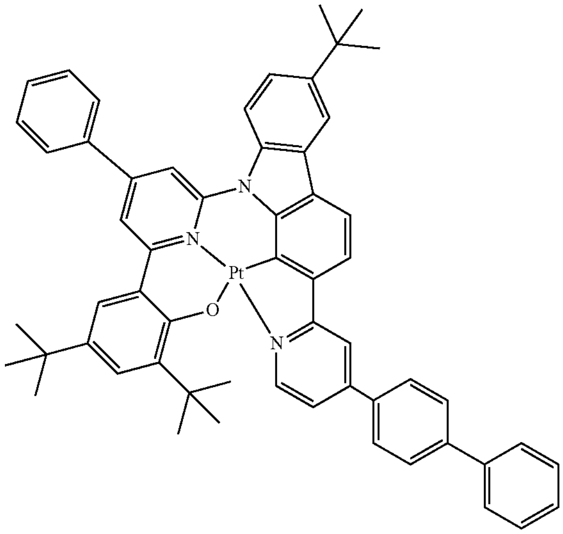
57
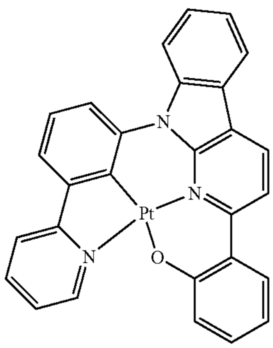
58
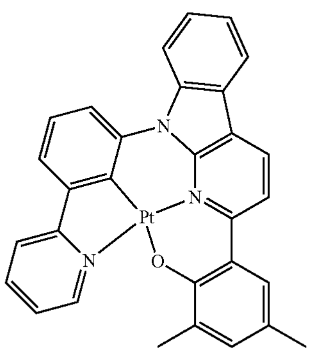
59
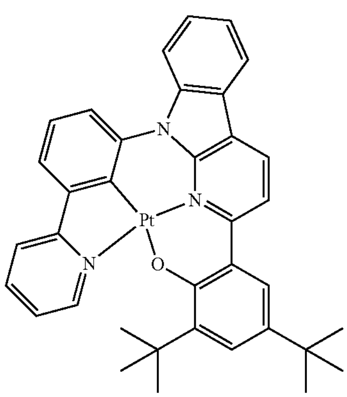
-continued
60
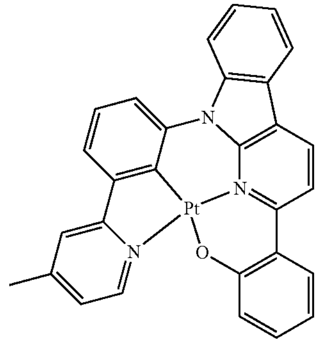
61
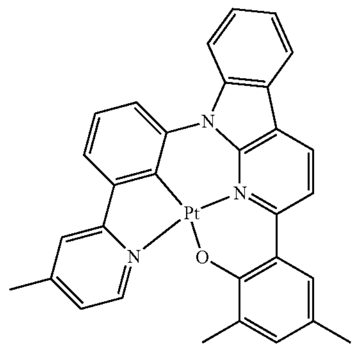
62
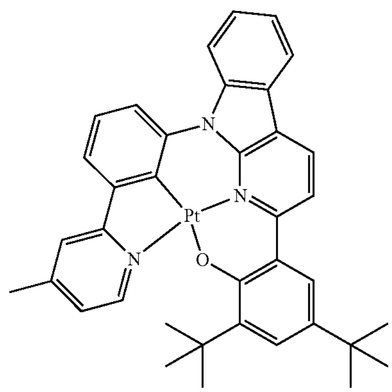
63
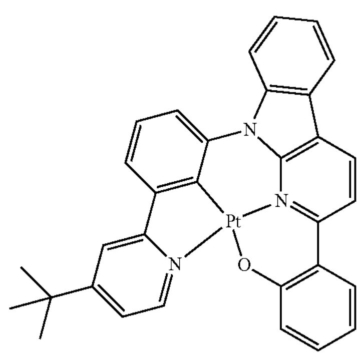

-continued
64
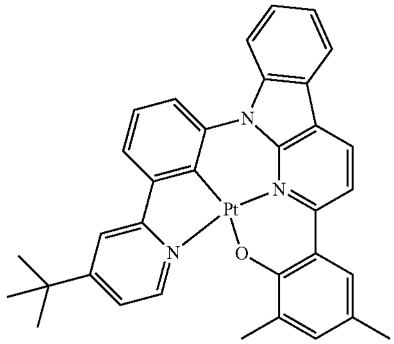
65
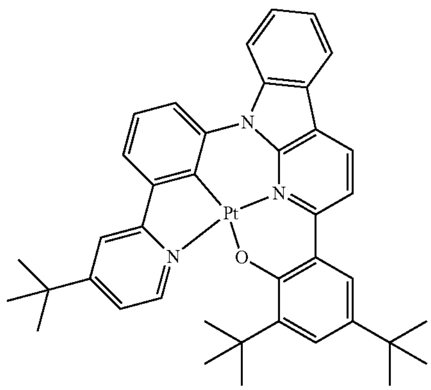
66
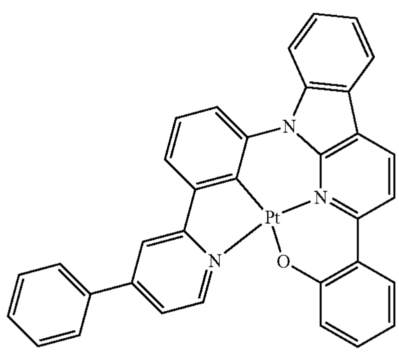
67
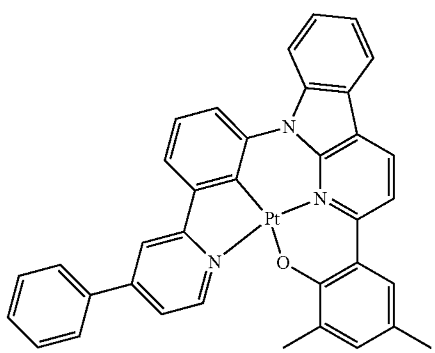
-continued
68
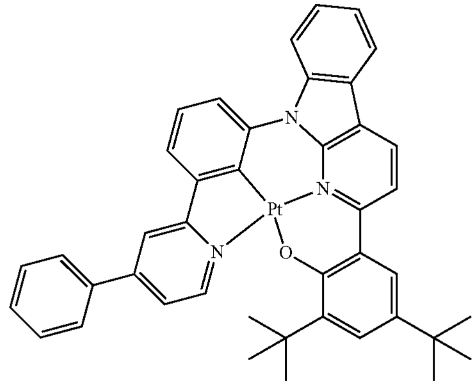
69
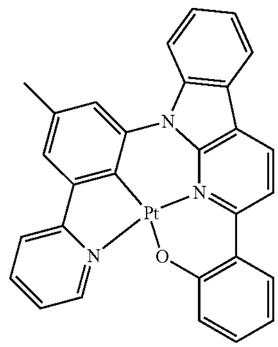
70
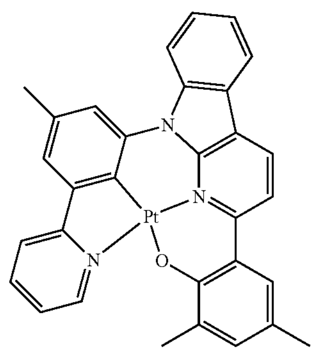
71
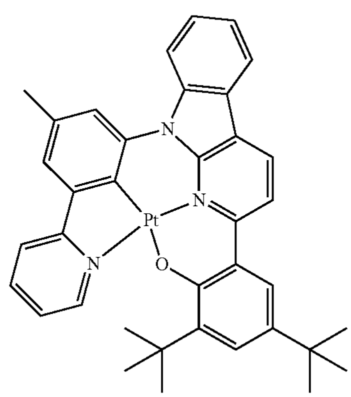

-continued
72
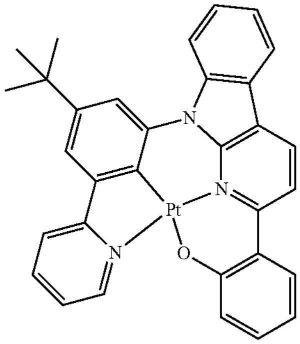
73
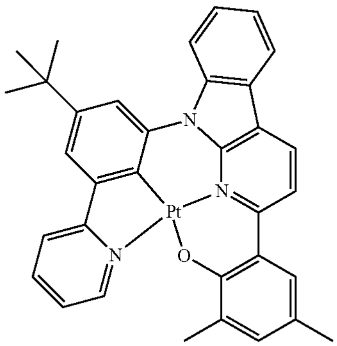
74
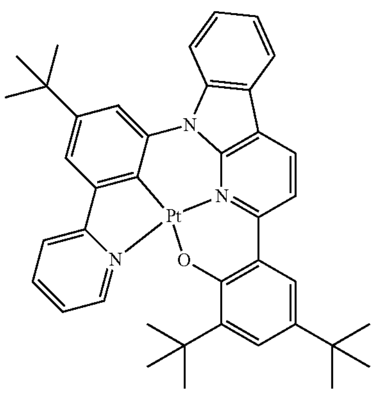
75
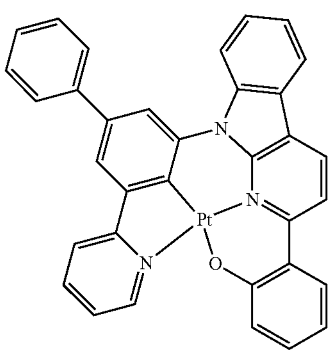
-continued
76
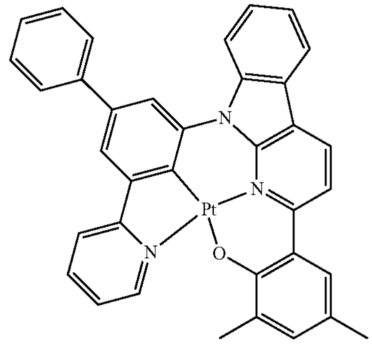
77
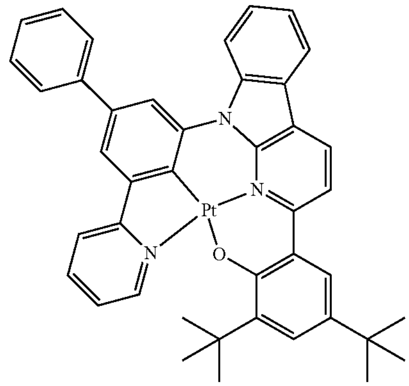
78
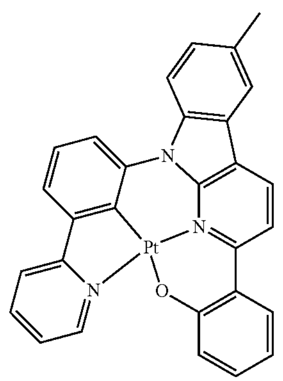
79
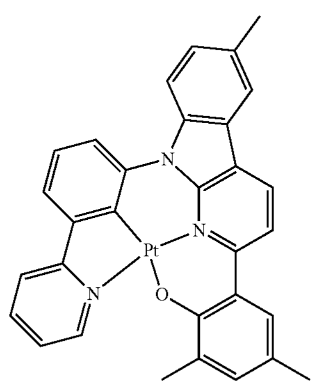

-continued
80
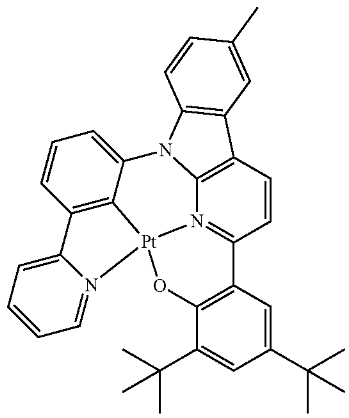
81
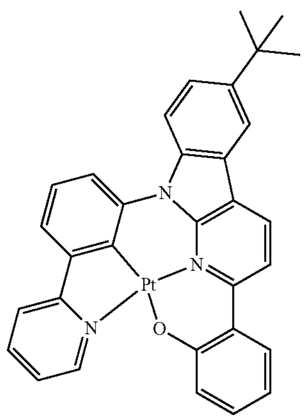
82
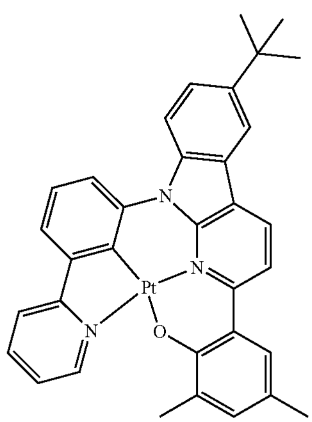
-continued
83
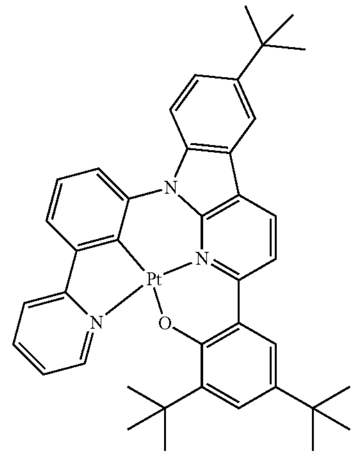
84
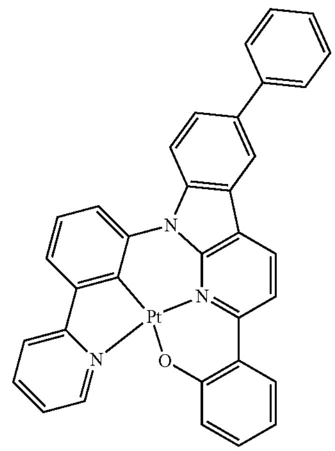
85
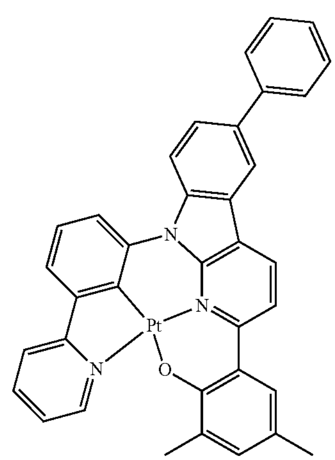

-continued
86
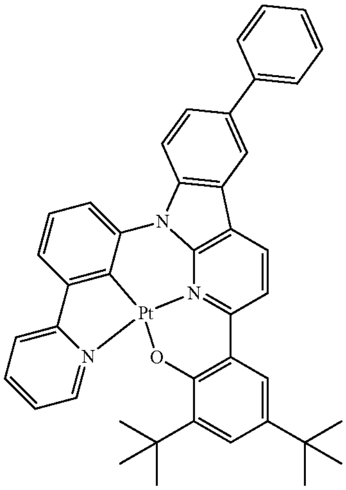
87
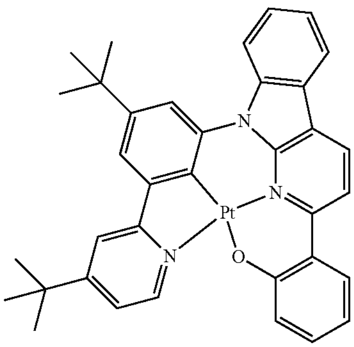
88
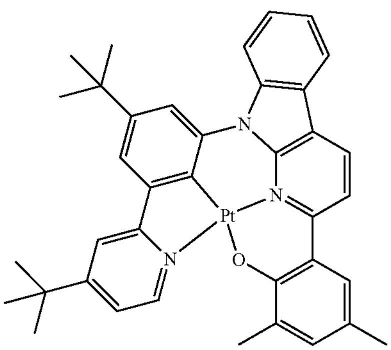
89
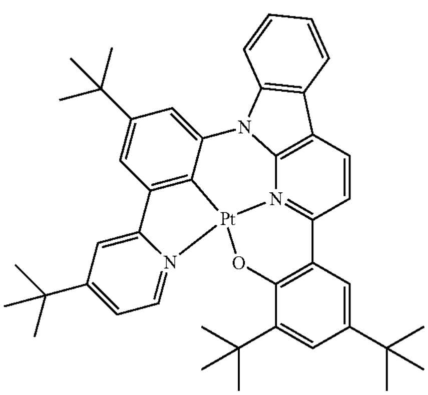
-continued
90
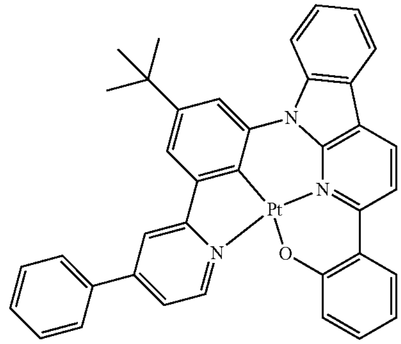
91
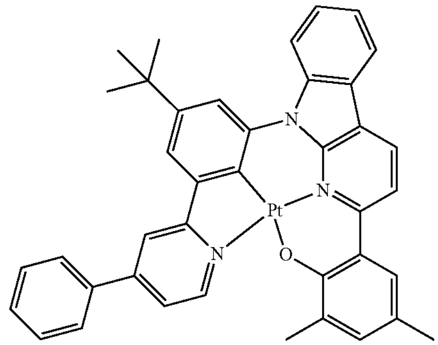
92
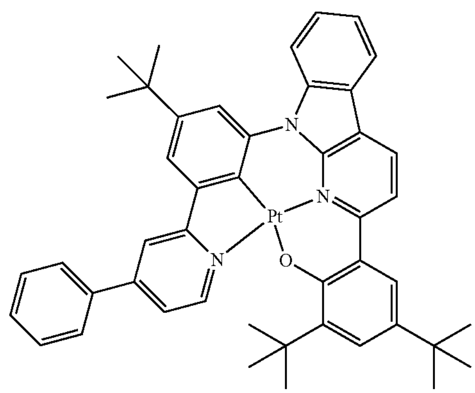
93
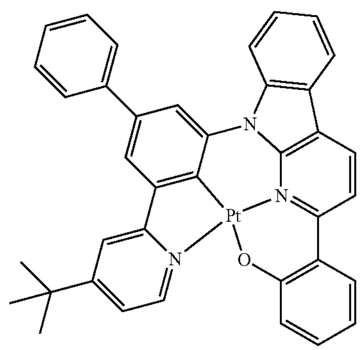

94
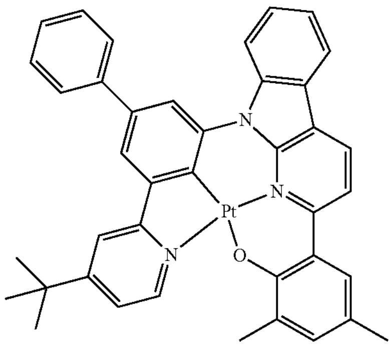
95
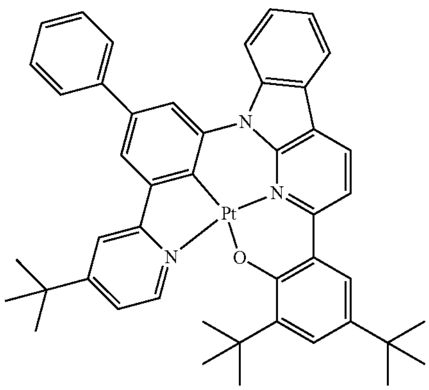
96
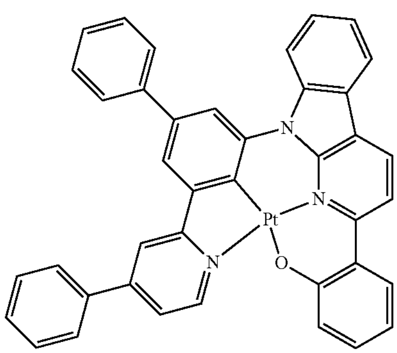
97
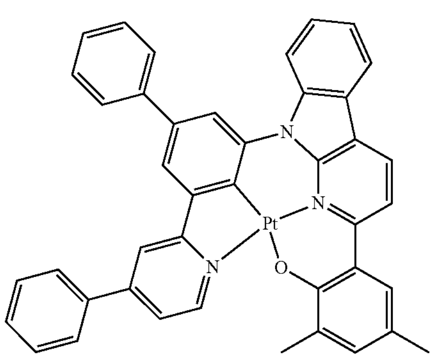
98
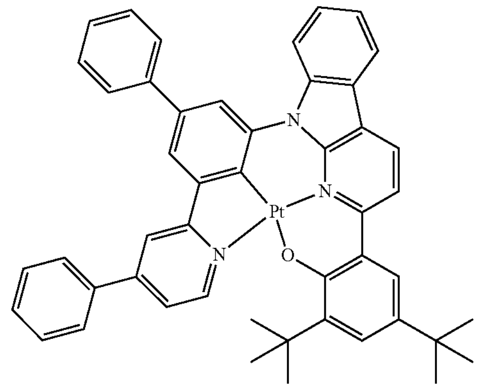
99
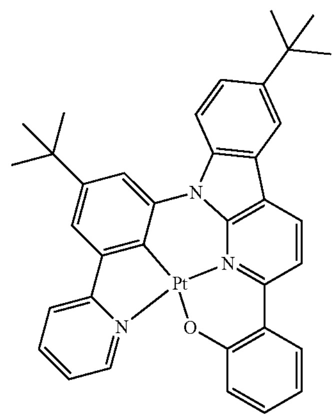
100
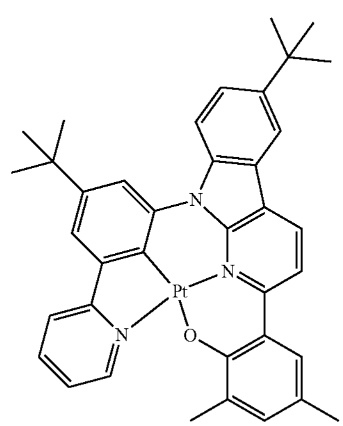

101
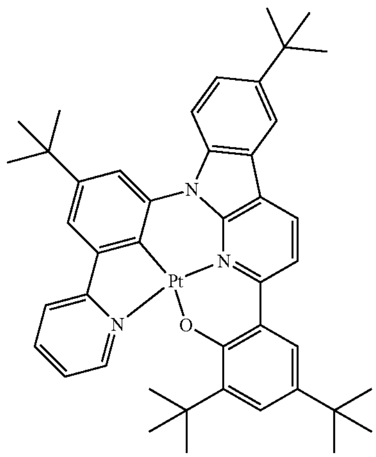
102
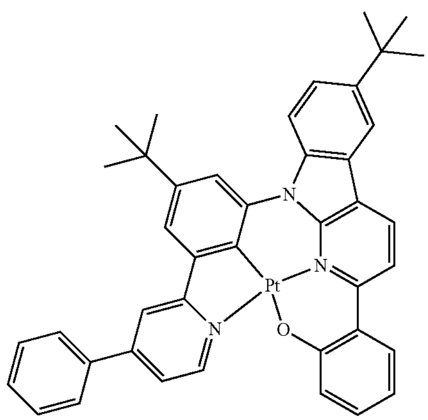
103
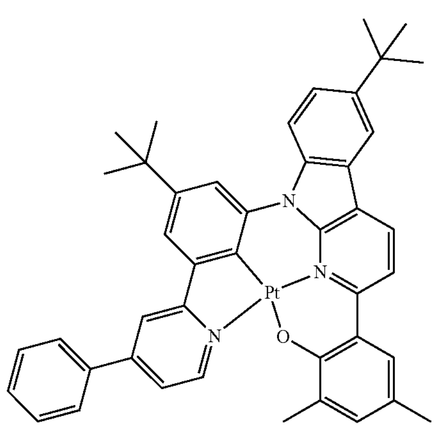
104
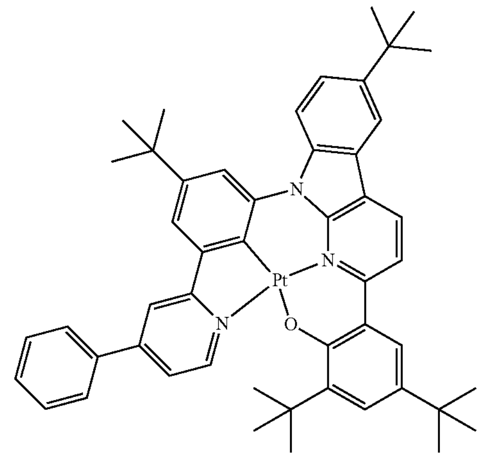
105
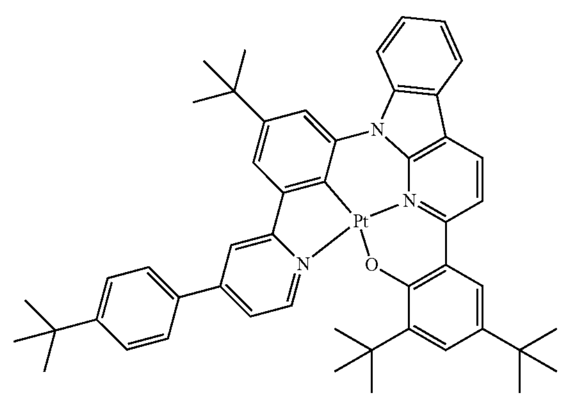
106
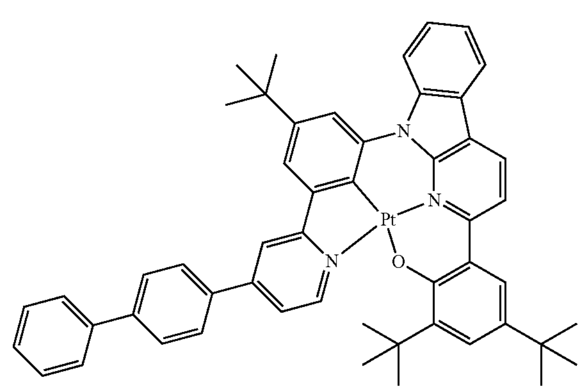

-continued
107
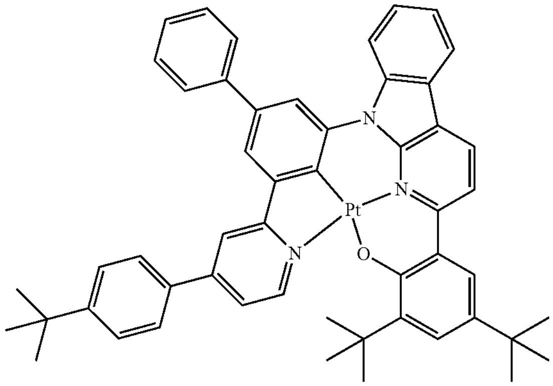
108
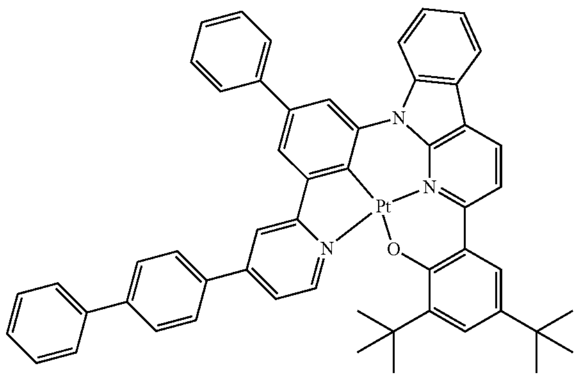
109
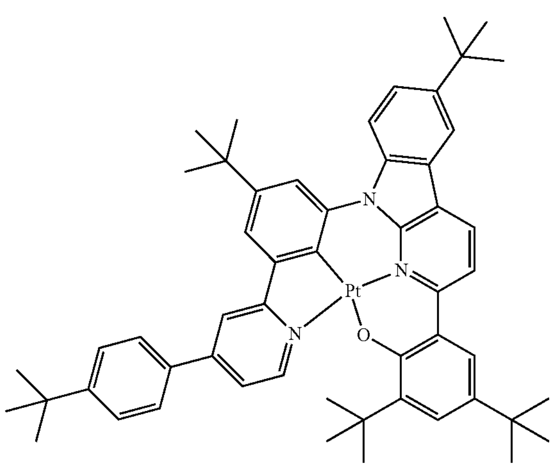
-continued
110
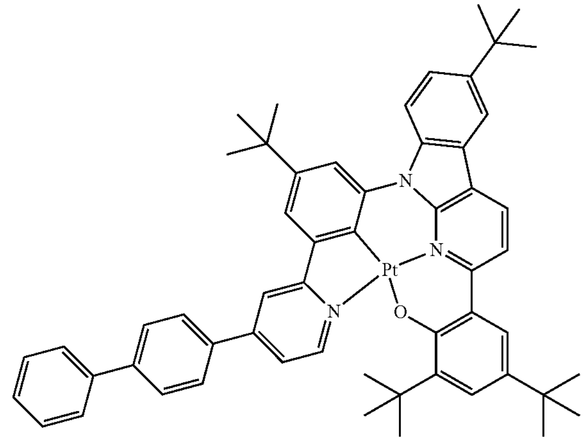
111
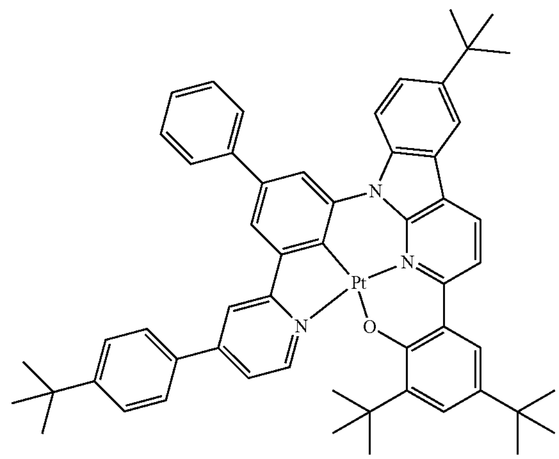
112
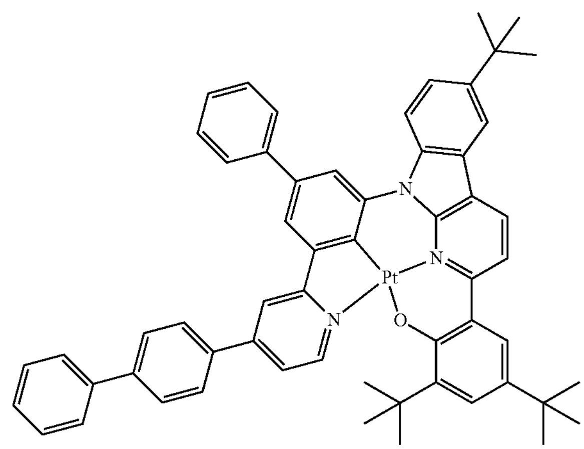

113
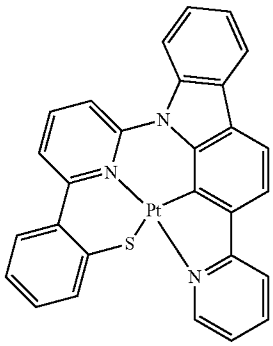
114
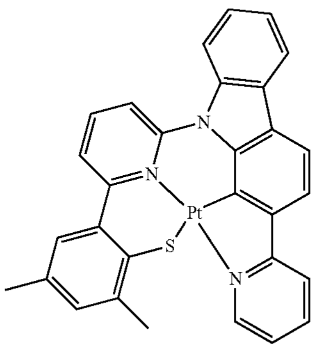
115
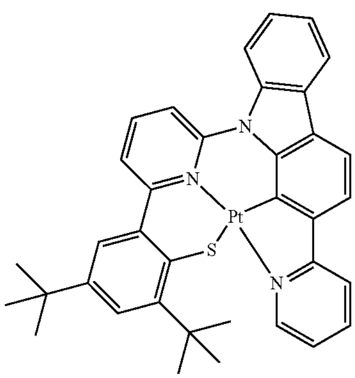
116
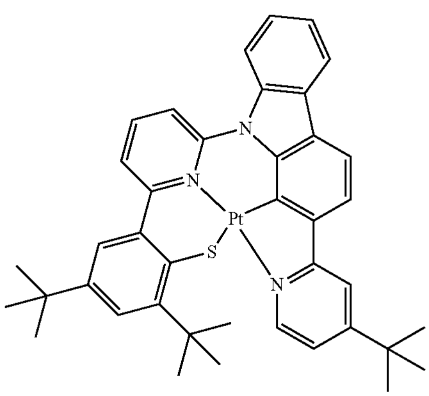
117
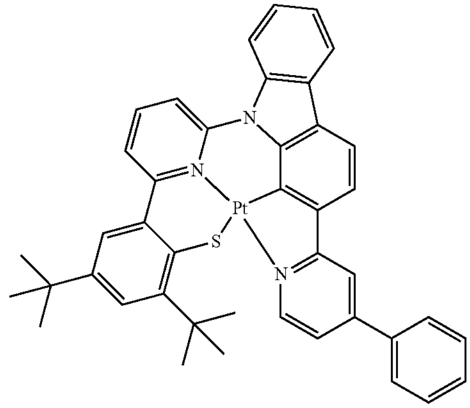
118
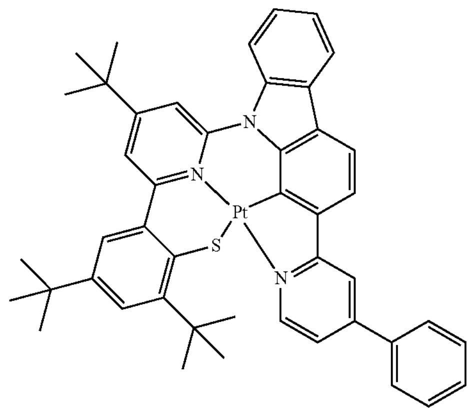
119
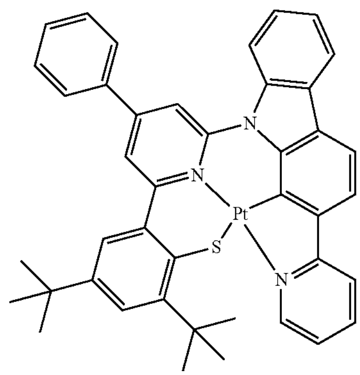
120
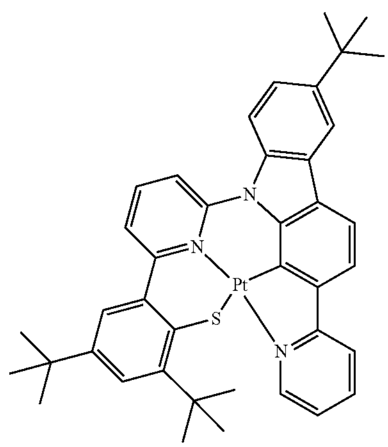

-continued
121
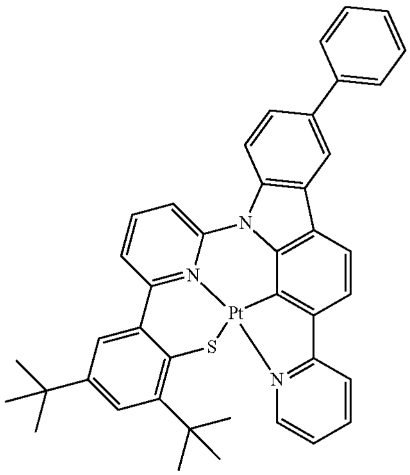
122
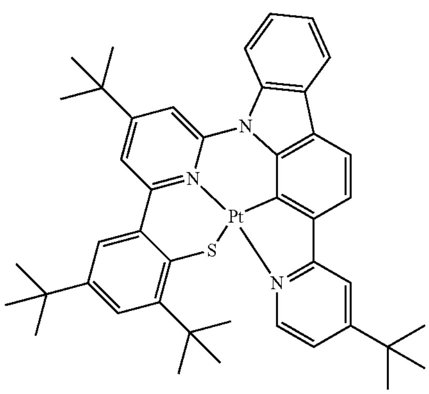
123
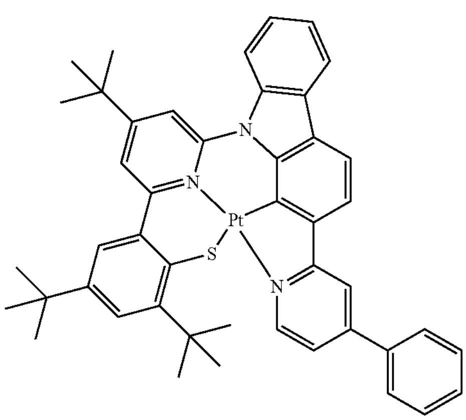
-continued
124
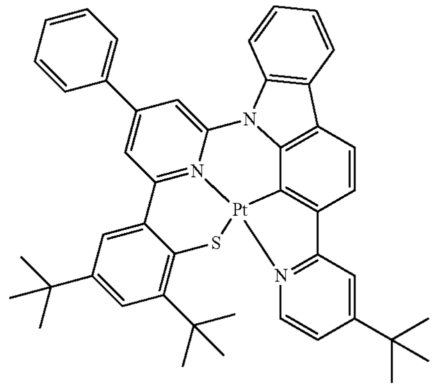
125
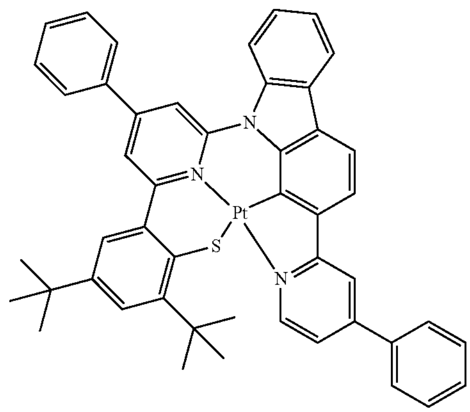
126
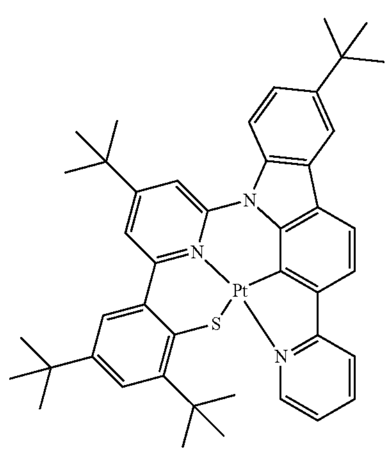

127
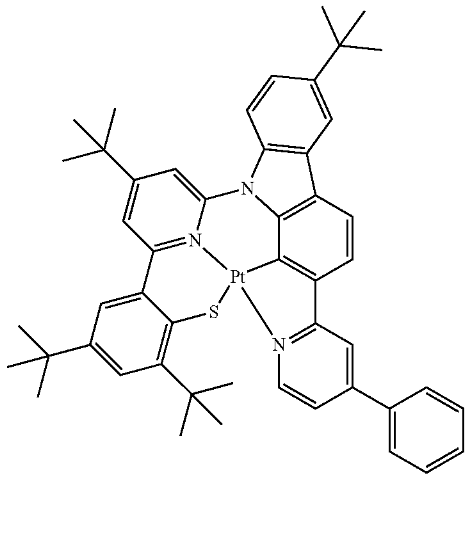
128
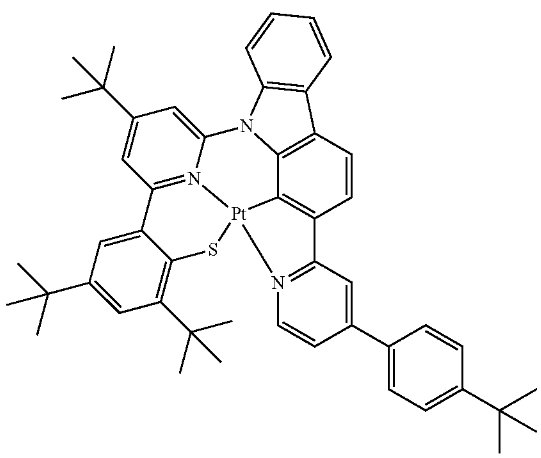
129
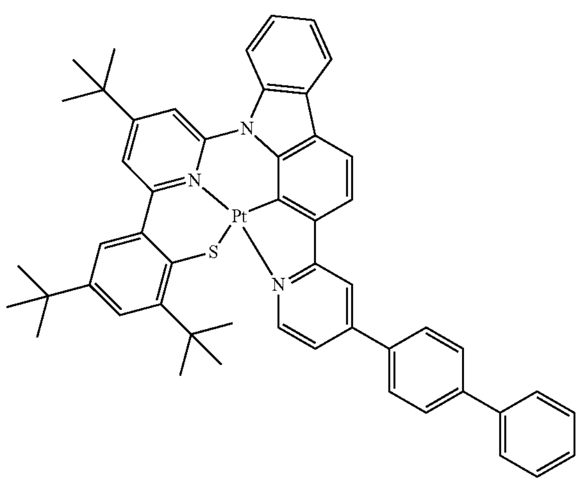
130
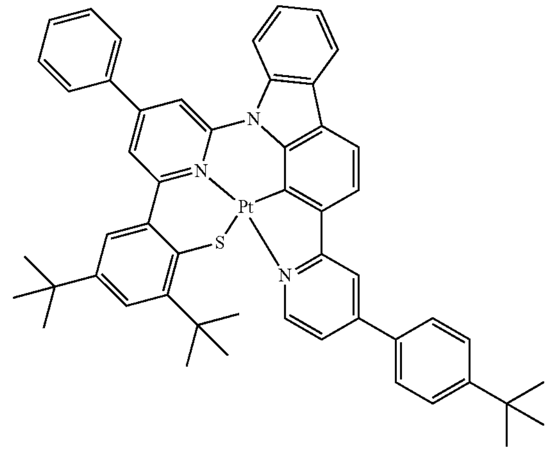
131
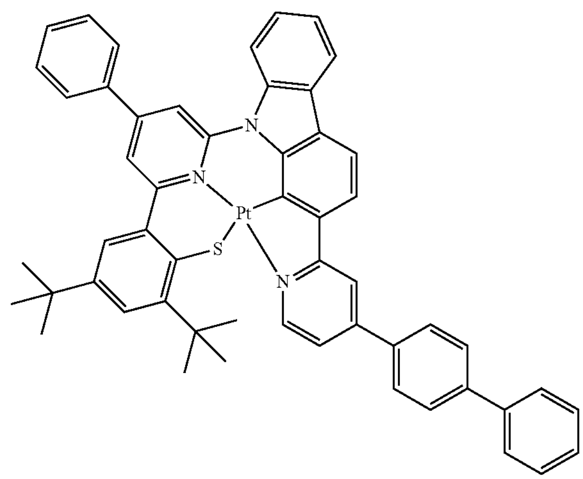
132
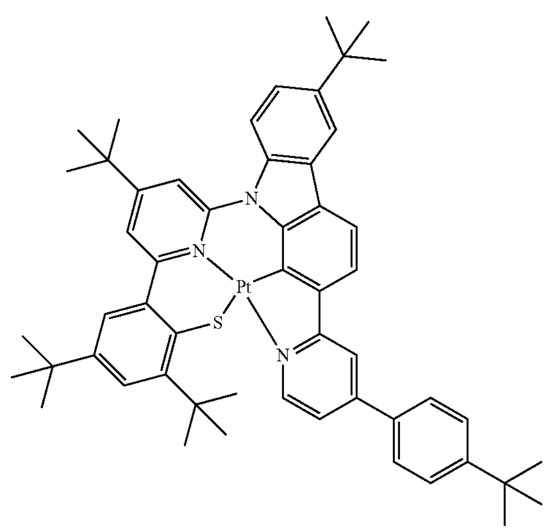

-continued
133
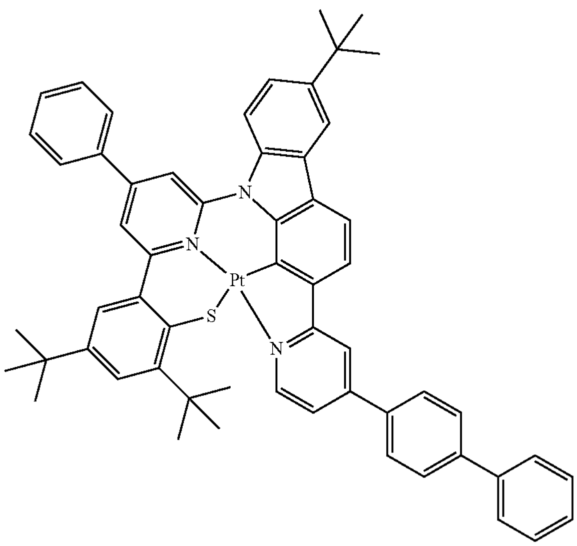
134
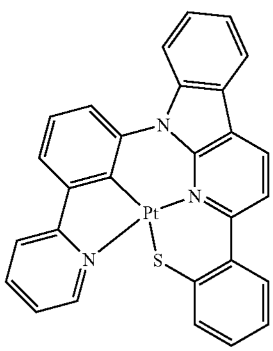
135
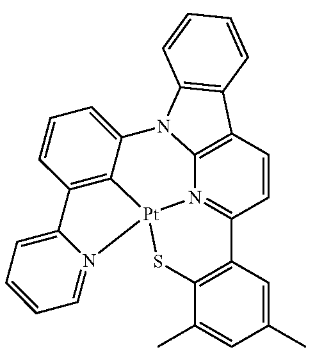
136
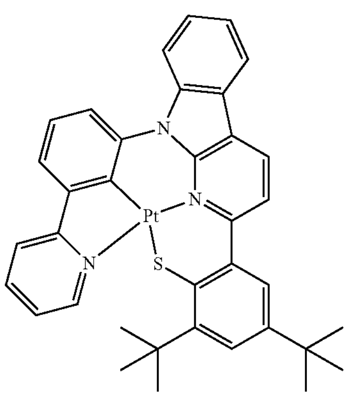
-continued
137
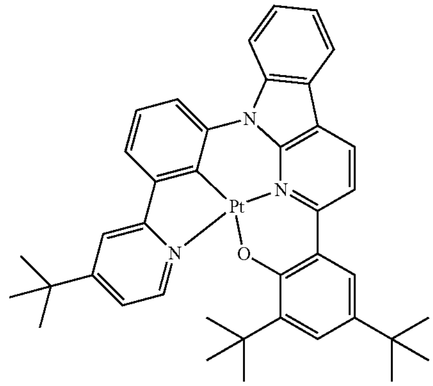
138
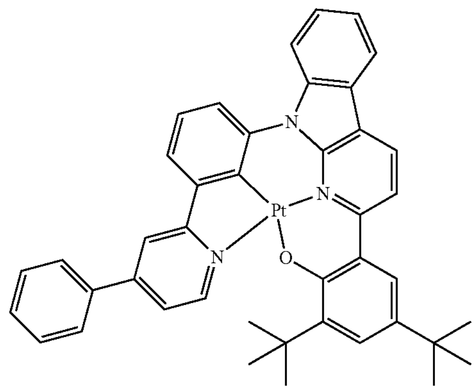
139
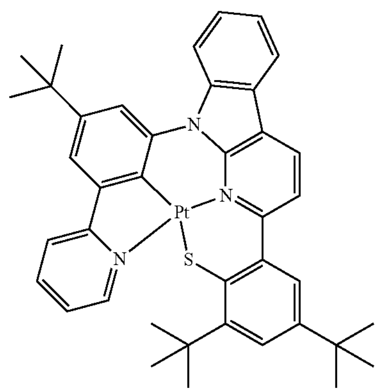
140
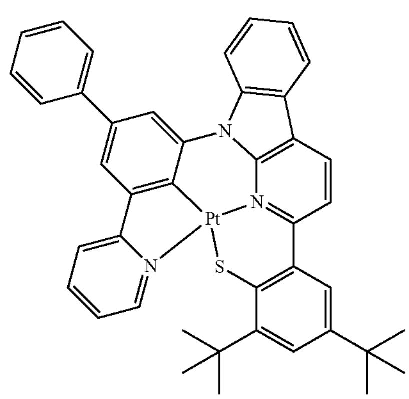

-continued
141
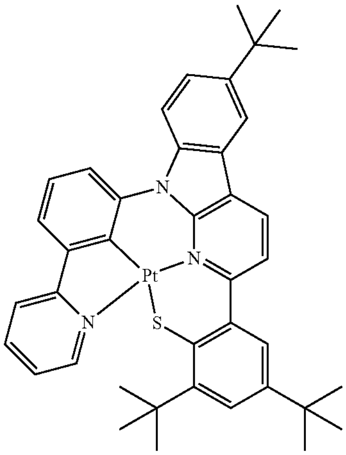
142
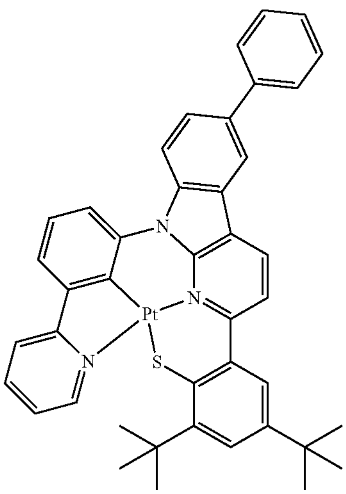
143
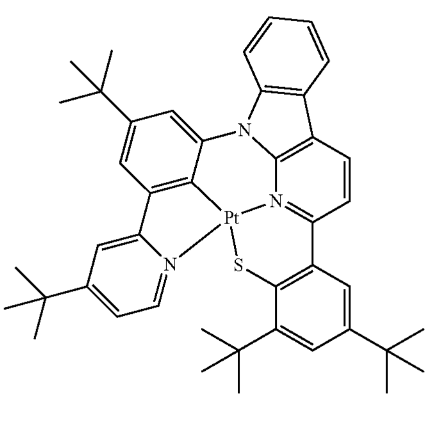
-continued
144
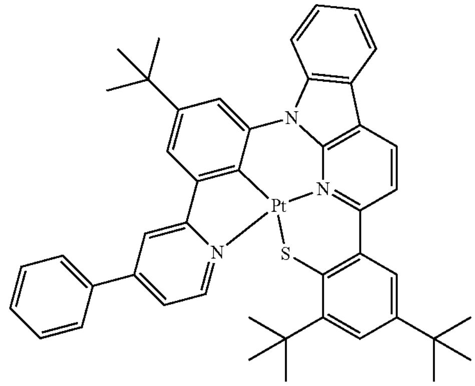
145
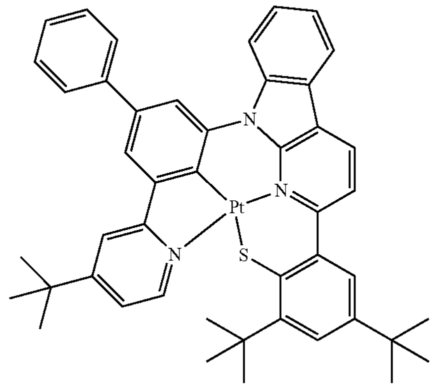
146
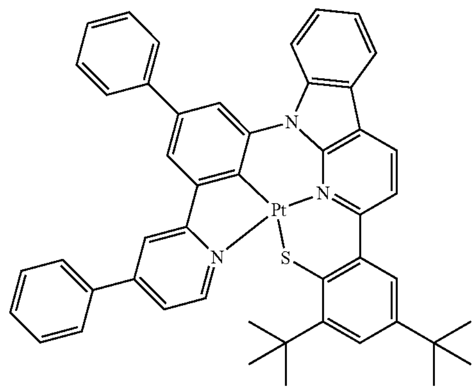
147
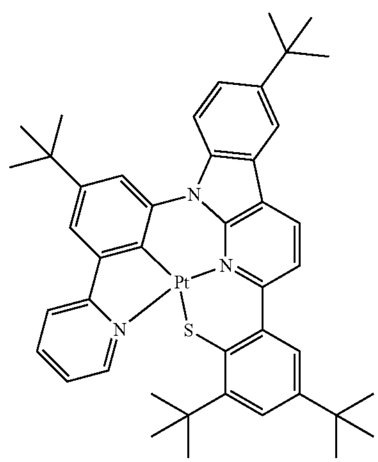

-continued
148
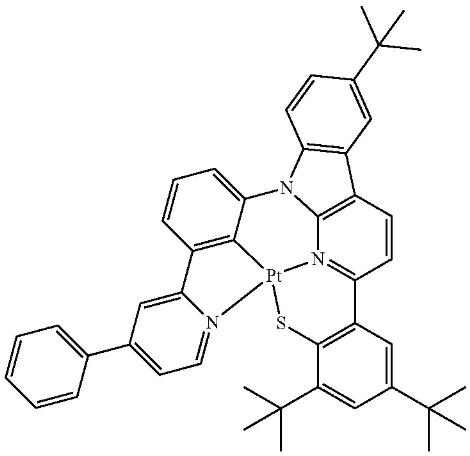
149
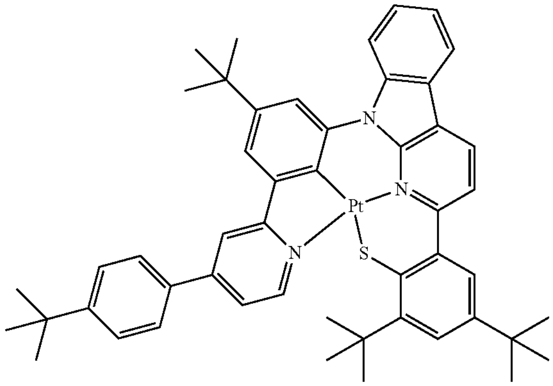
150
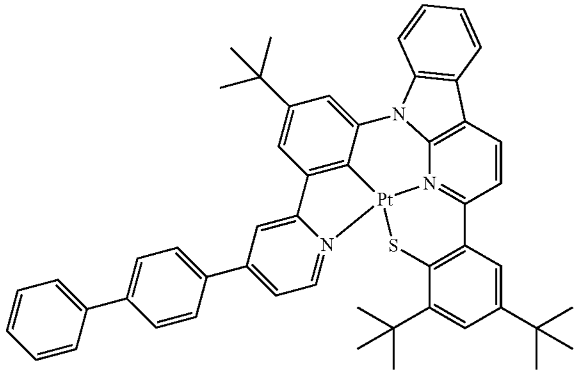
-continued
151
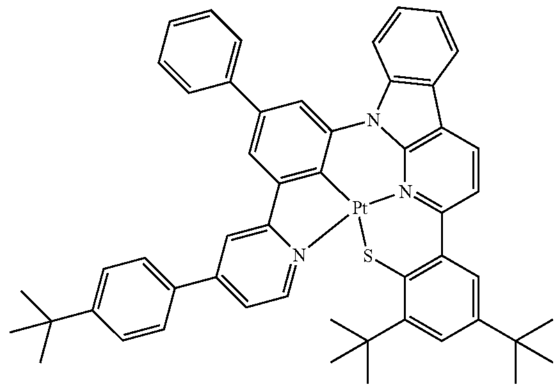
152
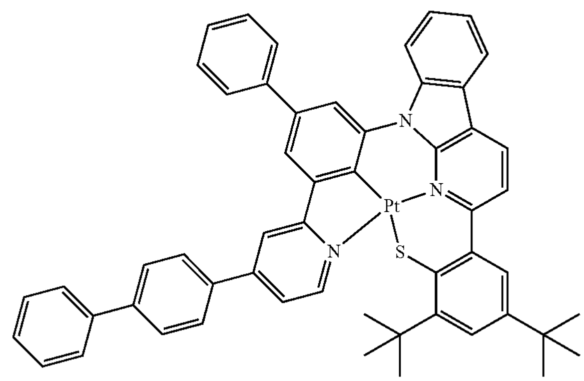
153
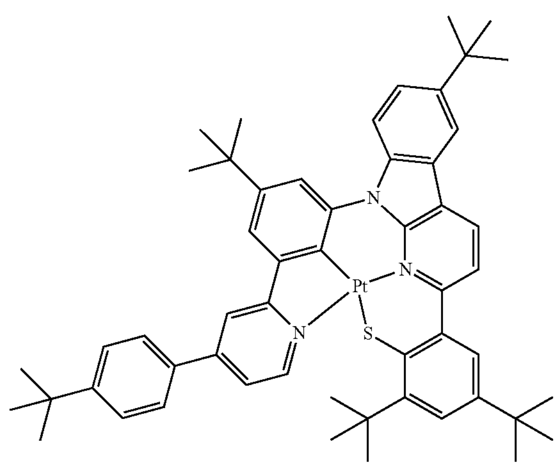

-continued
154
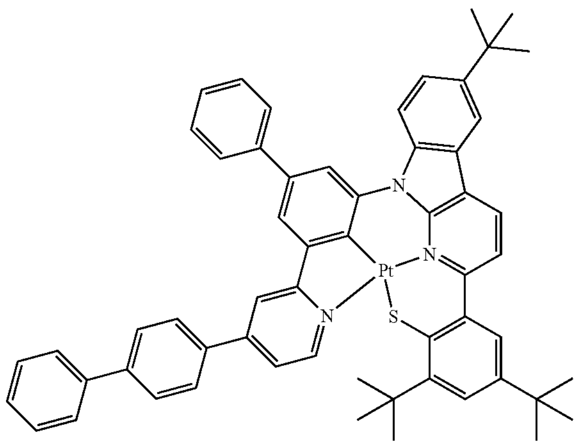
155
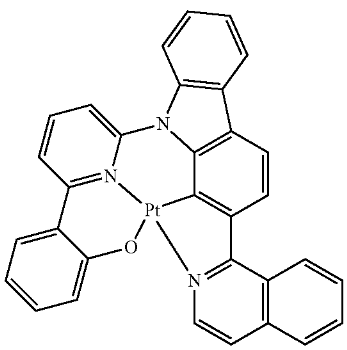
156
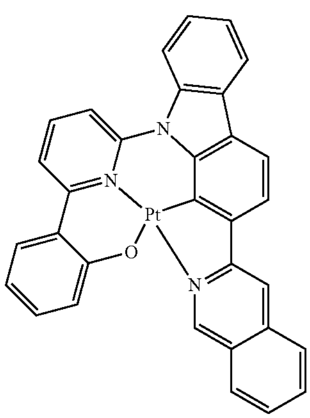
157
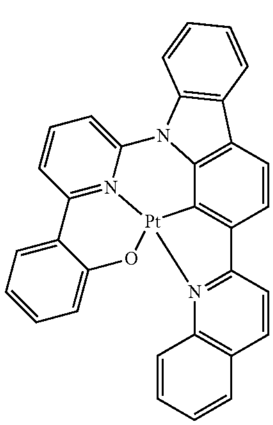
-continued
158
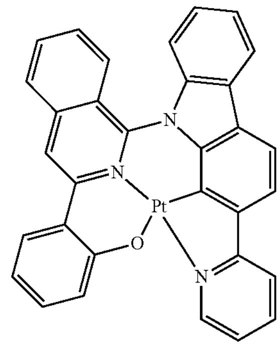
159
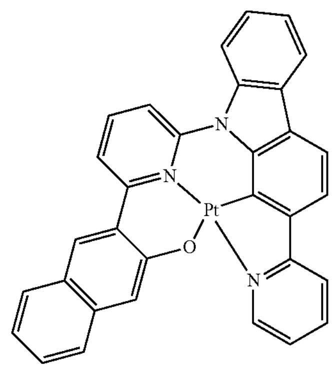
160
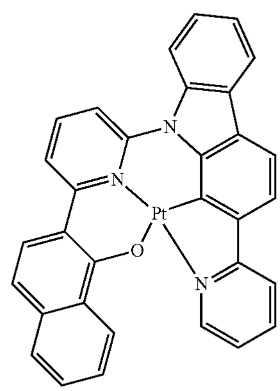
161
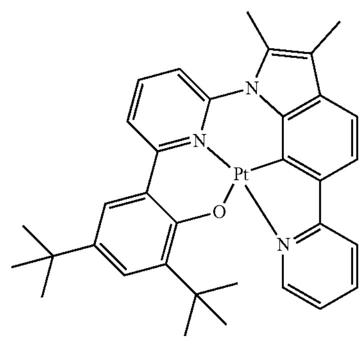

-continued

162

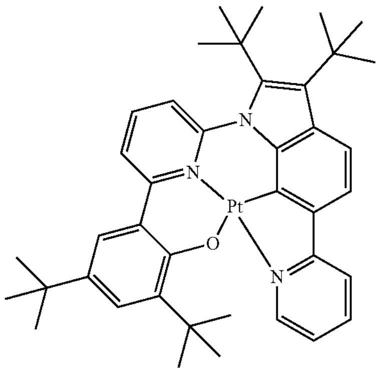

163

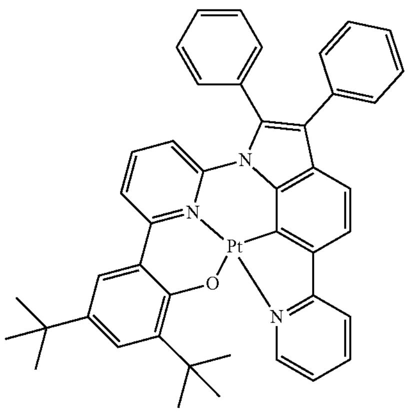

164

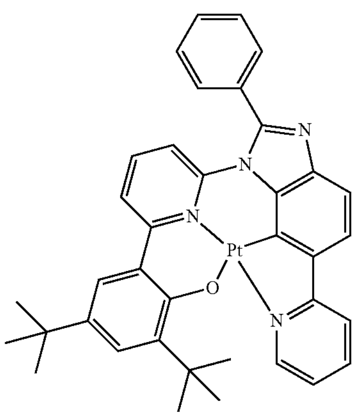

165

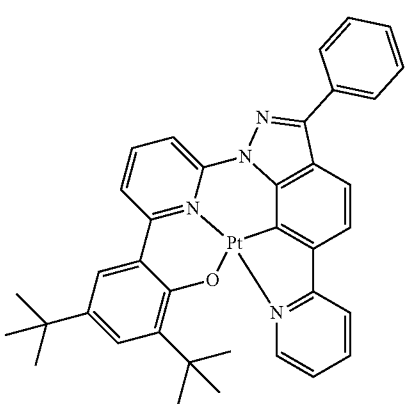

-continued

166

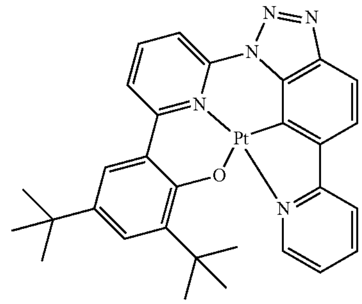

167

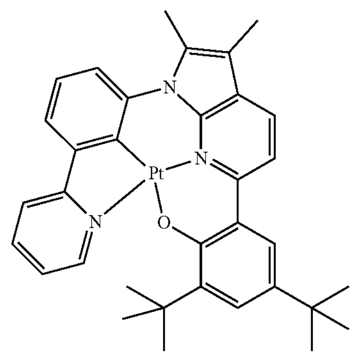

168

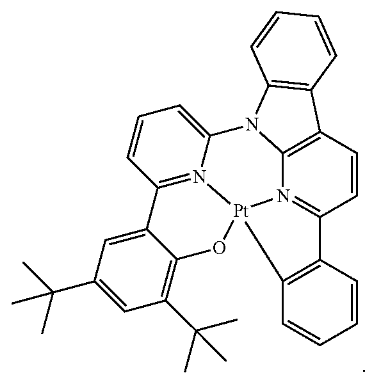

Formula 1 has the above-defined ring $CY_3$, and accordingly, a cyclometalated ring formed by M, ring $CY_2$, and ring $CY_3$ of Formula 1 is not a 5-membered ring. For example, a cyclometalated ring formed by M, ring $CY_2$, and ring $CY_3$ Formula 1 may be a 6-membered ring or a 7-membered ring. In this regard, an angle formed by $X_2$-M-$X_3$ in the organometallic compound may be maintained at an angle, for example, at least 90°, which can have a planar tetragonal structure with maintained structural stability, and accordingly, the organometallic compound represented by Formula 1 may have an excellent structural stability. Thus, an electronic device, such as an organic light-emitting device, including the organometallic compound represented by Formula 1 may have a long lifespan.

Furthermore, at least one of $X_5$ and $X_6$ in Formula 1 may not be a chemical bond. For example, at least one of $X_5$ and $X_6$ in Formula 1 may not be a chemical bond, and the other may be a chemical bond. In Formula 1, substituents of a highest occupied molecular orbital (HOMO) contribution moiety and a lowest occupied molecular orbital (LUMO) contribution moiety may be changed in various ways, and accordingly, the emission wavelength of the organometallic compound may be easily controlled. Thus, an electronic device, such as an organic light-emitting device, including the organometallic compound represented by Formula 1 may have a high emission efficiency.

For example, HOMO, LUMO, and $T_1$ energy levels of some of the compounds above may be evaluated by using a DFT method of Gaussian program (that is structurally optimized at a level of B3LYP, 6-31 G(d,p)), and the results thereof are shown in Table 1.

TABLE 1

| Compound No. | HOMO (eV) | LUMO (eV) | $T_1$ (eV) |
|---|---|---|---|
| 1 | −4.796 | −1.976 | 2.067 |
| 2 | −4.658 | −1.918 | 1.960 |
| 3 | −4.663 | −1.918 | 1.981 |
| 12 | −4.626 | −1.987 | 1.940 |
| 36 | −4.559 | −1.943 | 1.942 |
| 42 | −4.595 | −1.996 | 1.879 |
| 50 | −4.552 | −1.978 | 1.926 |
| 161 | −4.583 | −1.717 | 2.152 |
| A | −4.418 | −1.584 | 1.971 |

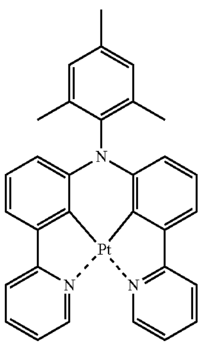

A

Referring to Table 1, it is confirmed that the organometallic compound represented by Formula 1 had a lower HOMO energy level (i.e., a larger absolute value of the HOMO energy level) and a lower LUMO energy level (i.e., a larger absolute value of the LUMO energy level), compared to those of Compound A. In this regard, it is also considered that the organometallic compound represented by Formula 1 has electric characteristics that are suitable for a dopant in an electronic device, such as an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an organic layer including an emission layer and at least one of the organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode.

The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

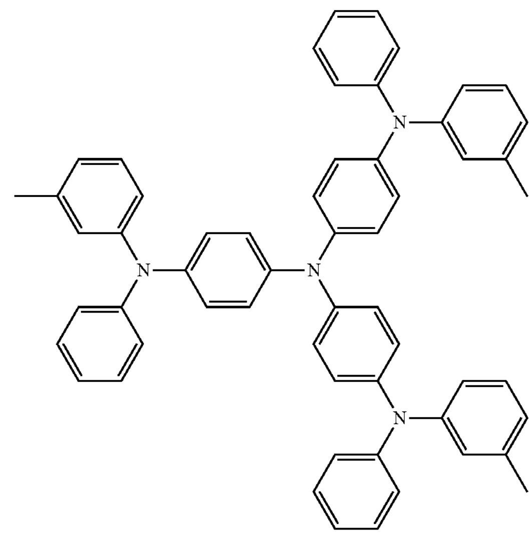

m-MTDATA

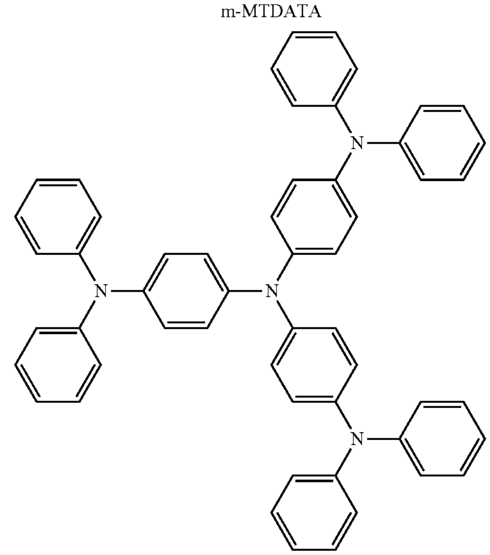

TDATA

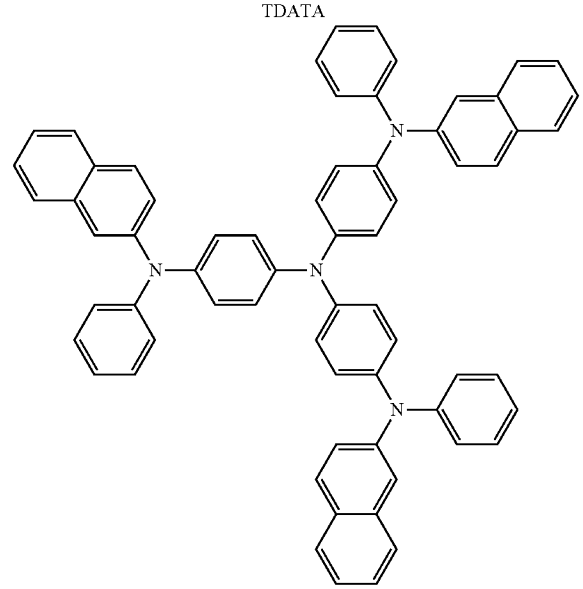

2-TNATA

-continued
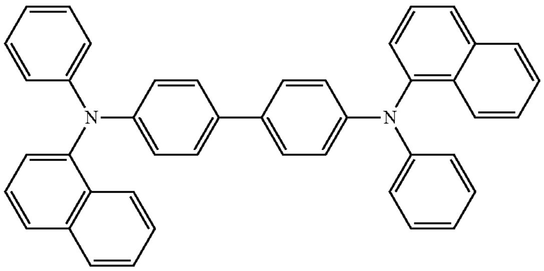
NPB
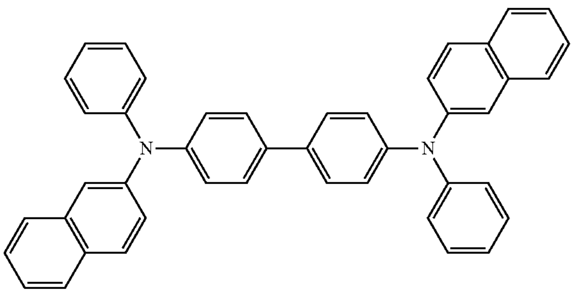
β-NPB
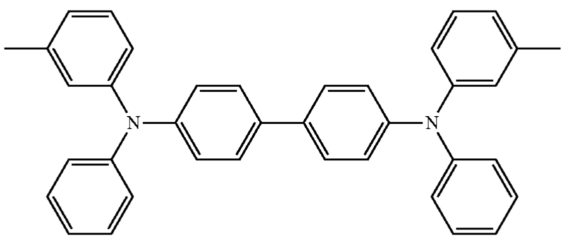
TPD
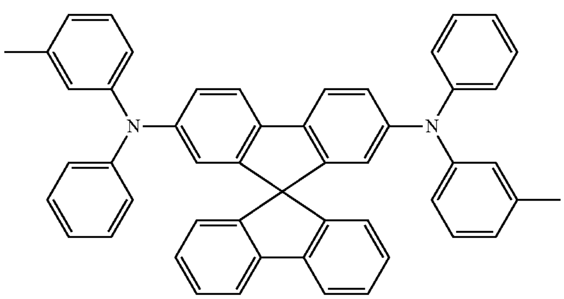
Spiro-TPD
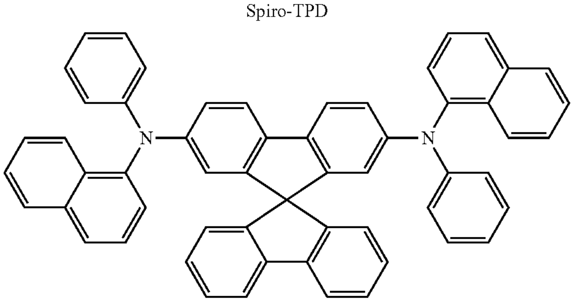
Spiro-NPB
-continued
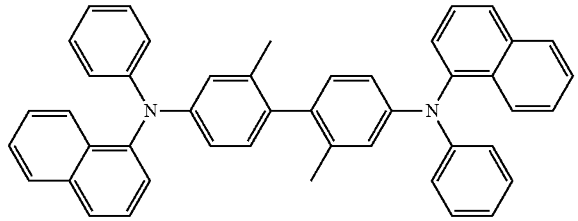
methylated NPB
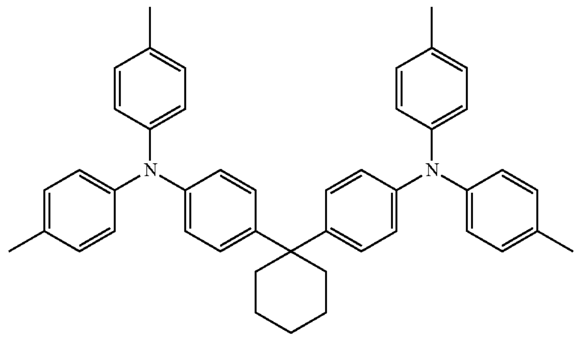
TAPC
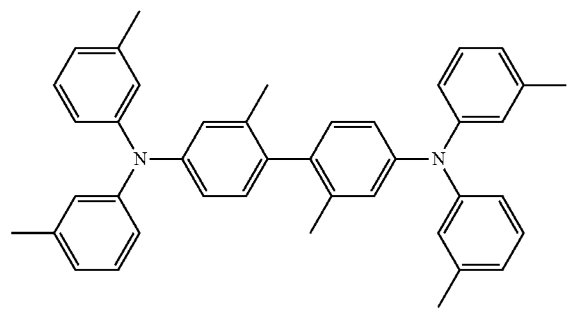
HMTPD
Formula 201
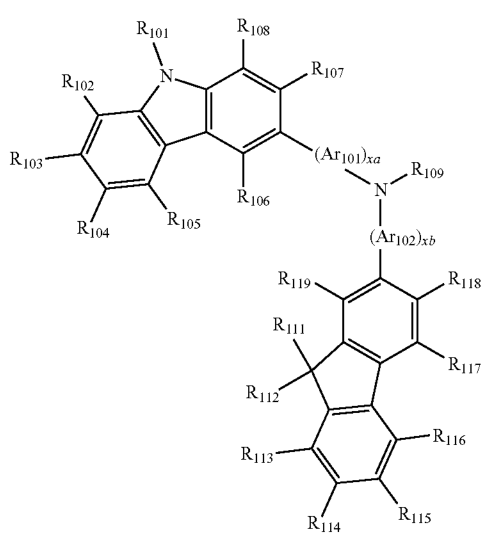

-continued

Formula 202

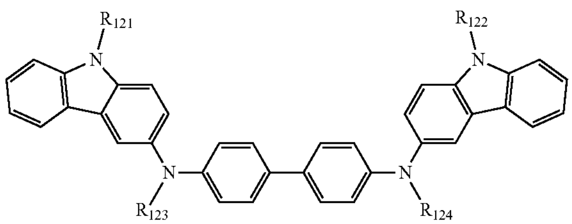

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

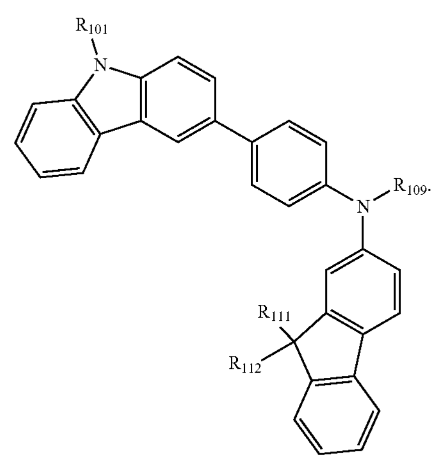

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

-continued
HT1
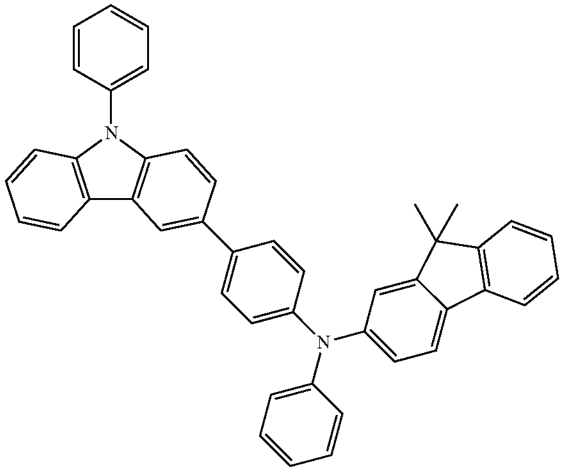
HT2
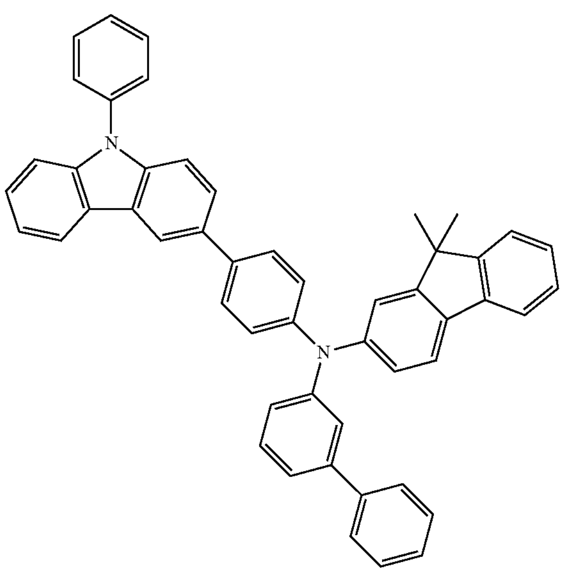
HT3
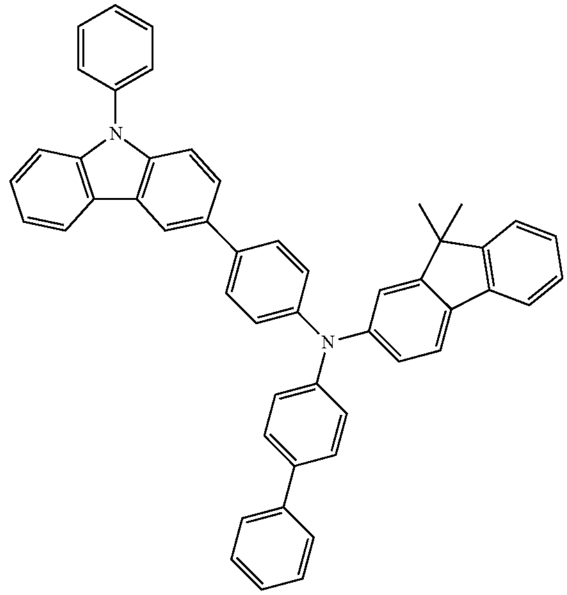
HT4
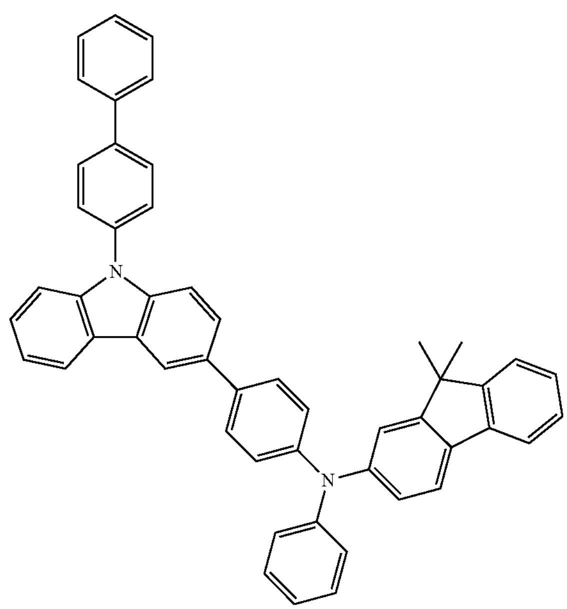

-continued
HT5
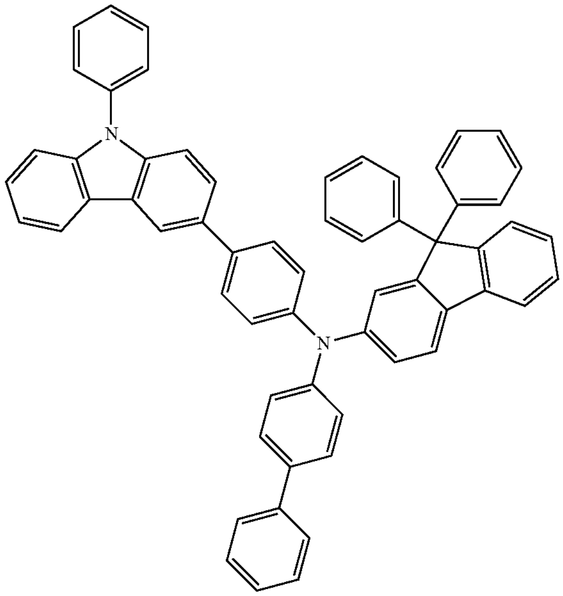
HT6
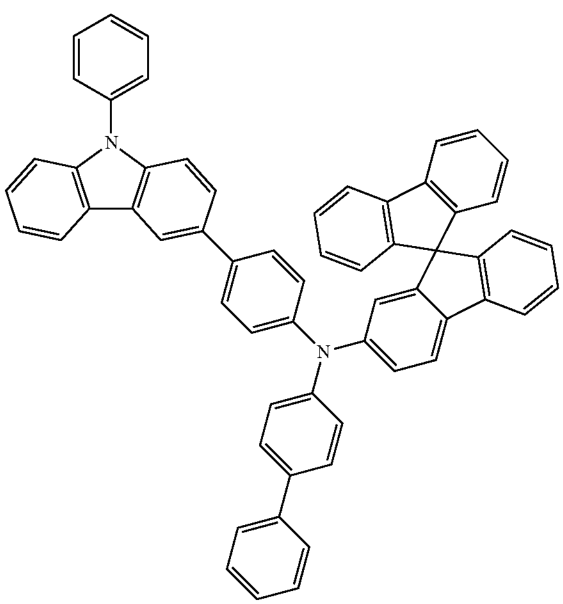
-continued
HT7
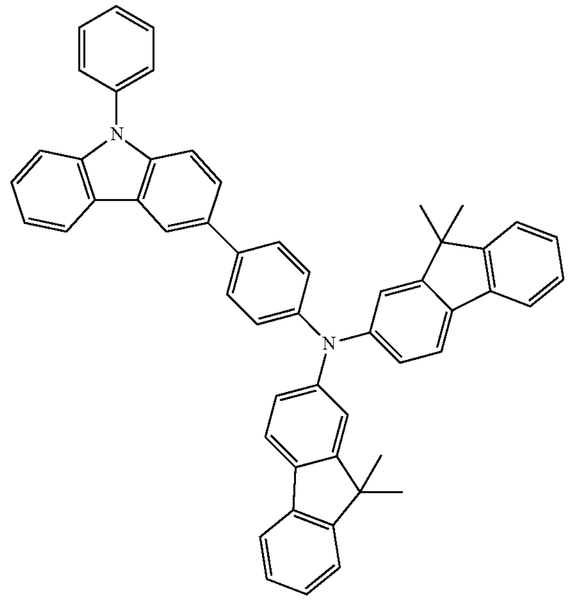
HT8
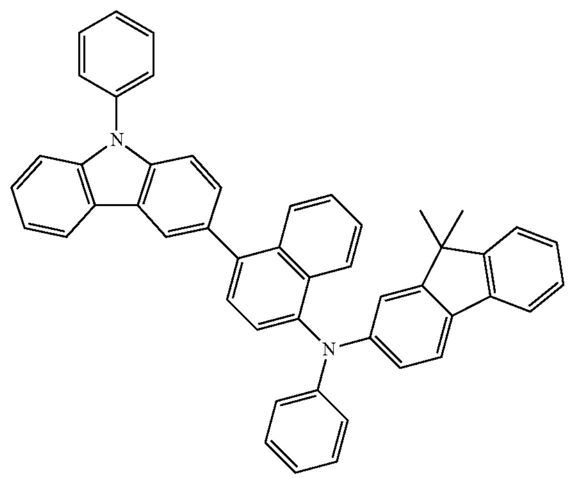
HT9
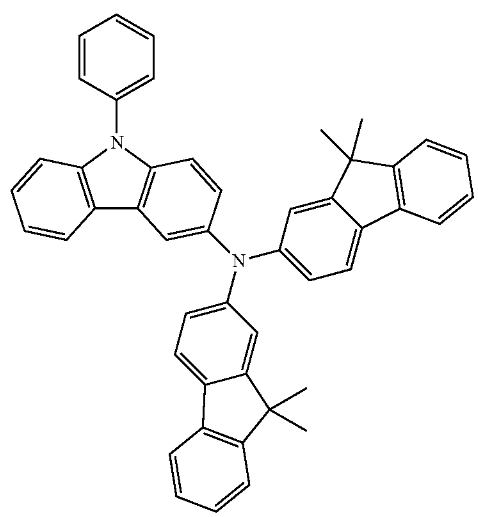

-continued
HT10
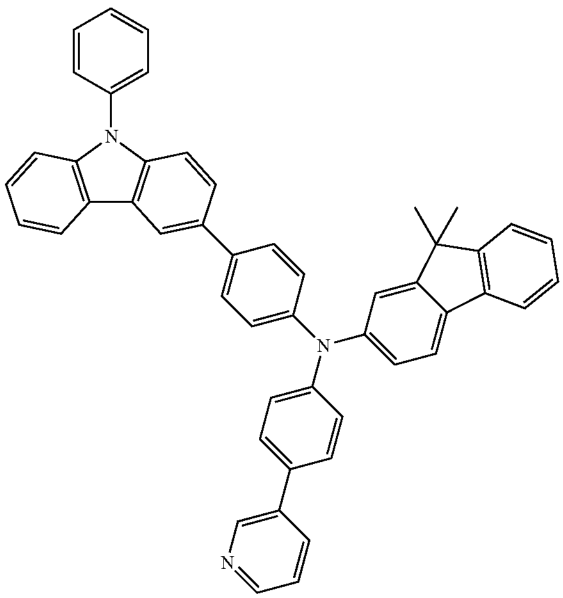
HT11
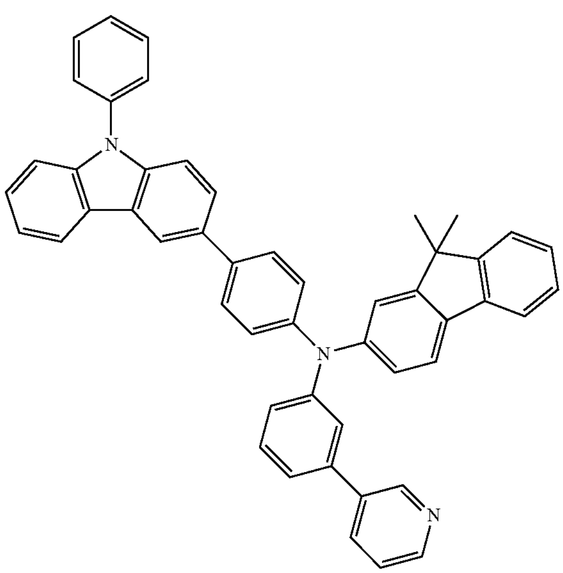
-continued
HT12
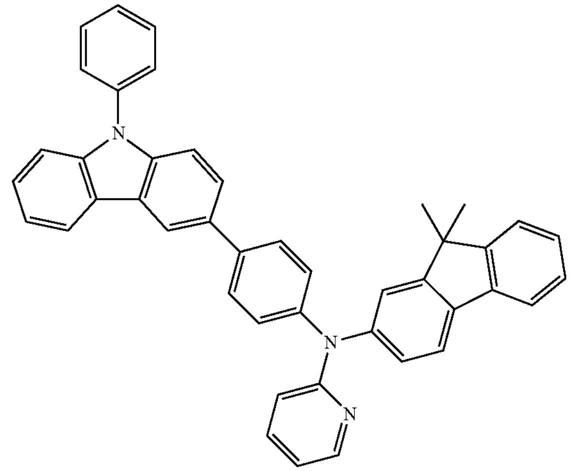
HT13
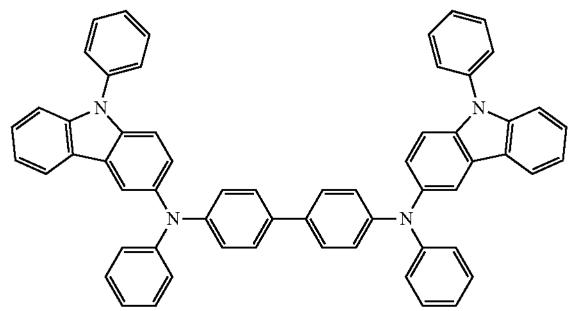
HT14
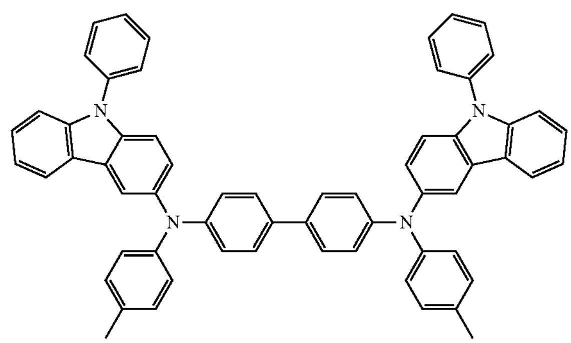
HT15
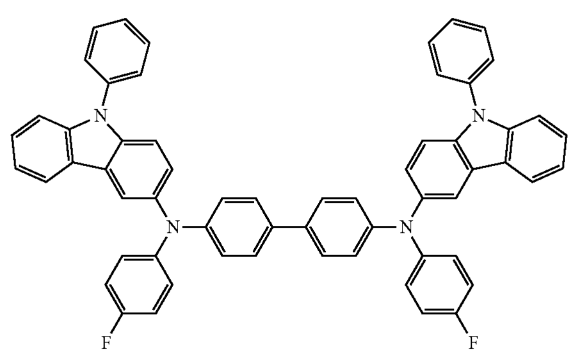

-continued

HT16

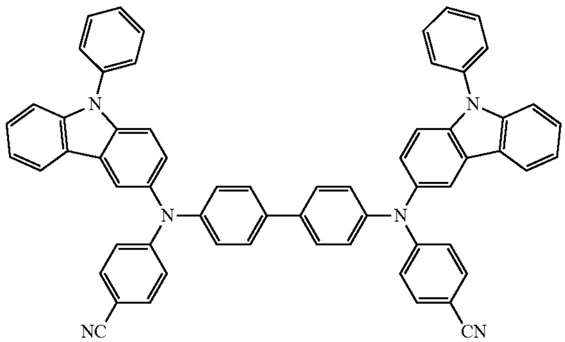

HT17

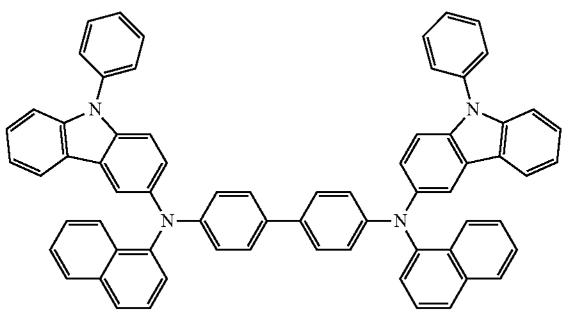

HT18

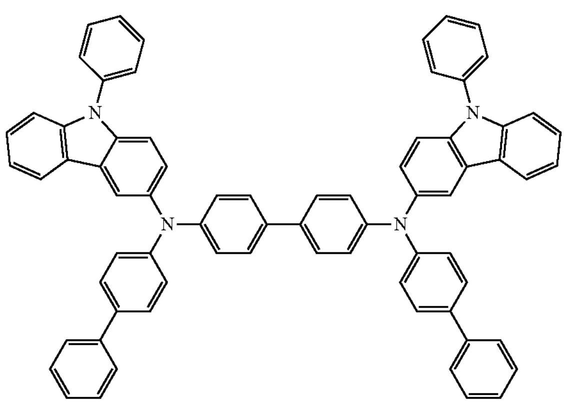

HT19

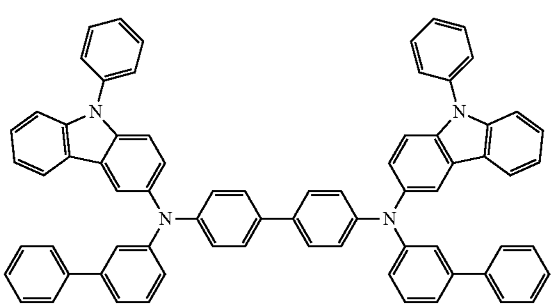

-continued

HT20

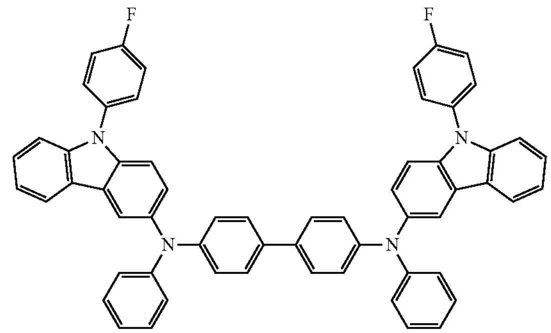

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto:

HT-D1

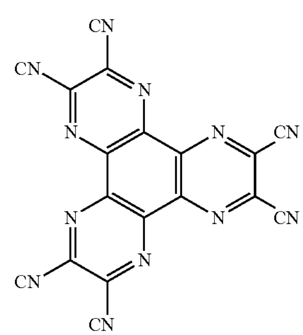

-continued

F4-TCNQ

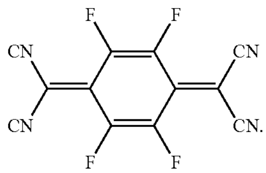

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

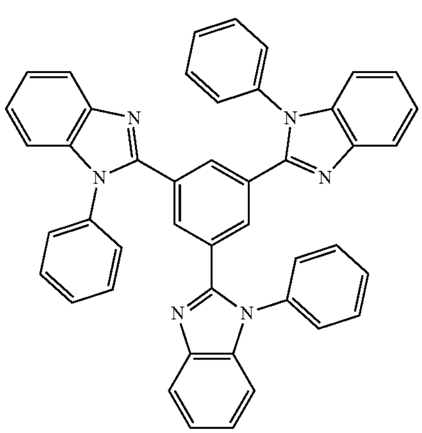

TPBi

-continued

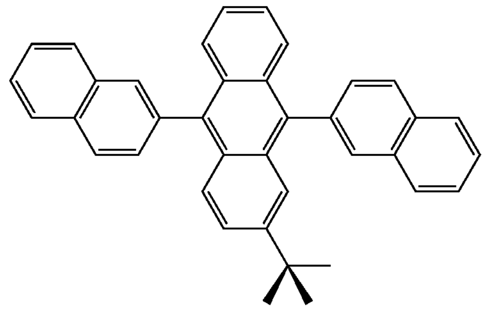

TBADN

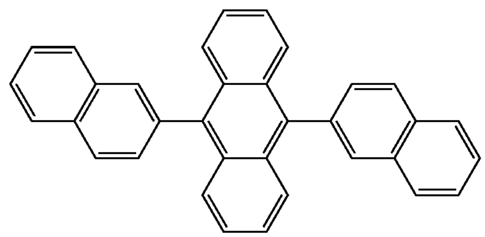

ADN

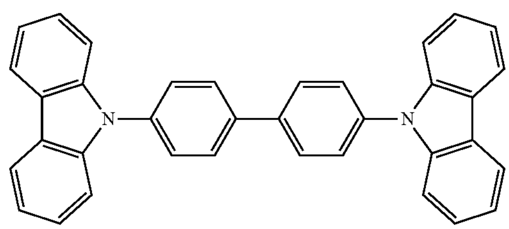

CBP

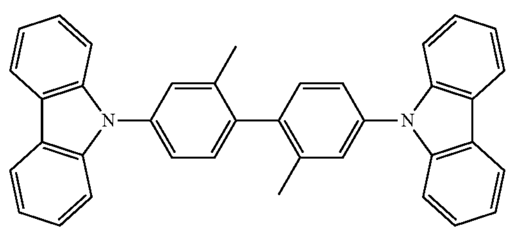

CDBP

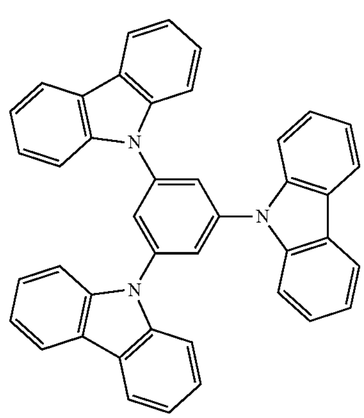

TCP

-continued

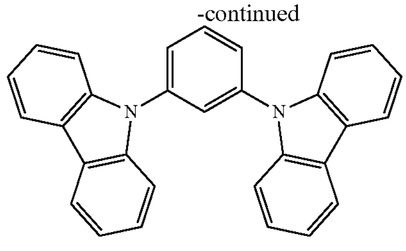

mCP

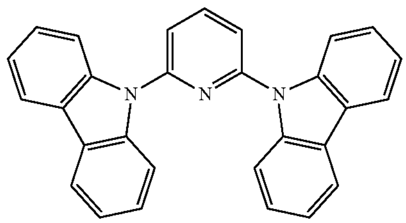

H50

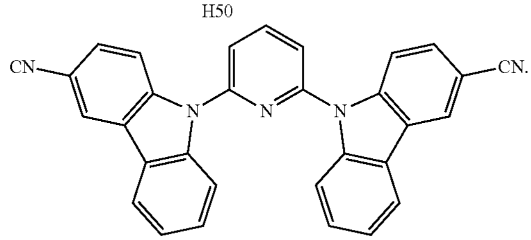

H51

In one or more embodiments, the host may further include a compound represented by Formula 301:

Formula 301

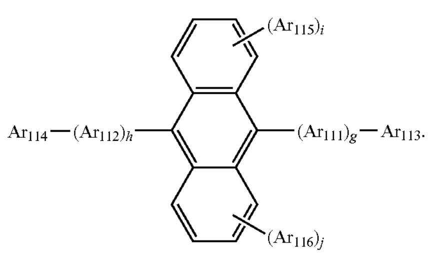

In Formula 301, $Ar_{111}$ and $Ar_{112}$ may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group, $Ar_{113}$ to $Ar_{116}$ may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group, and g, h, i, and j in Formula 301 may each independently be an integer from 0 to 4, and may be, for example, 0, 1, or 2.

In Formula 301, $Ar_{113}$ to $Ar_{116}$ may each independently be selected from:

a $C_1$-$C_{10}$ alkyl group, the substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

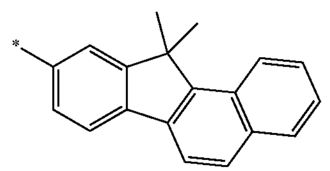

but embodiments of the present disclosure are not limited thereto.

In one or more embodiments, the host may include a compound represented by Formula 302 below:

Formula 302

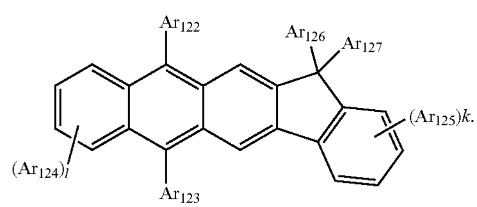

In Formula 302, $Ar_{122}$ to $Ar_{125}$ are the same as described in detail in connection with $Ar_{113}$ in Formula 301, $Ar_{126}$ and $Ar_{127}$ may each independently be a $C_1$-$C_{10}$ alkyl group (for example, a methyl group, an ethyl group, or a propyl group), and k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 part to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

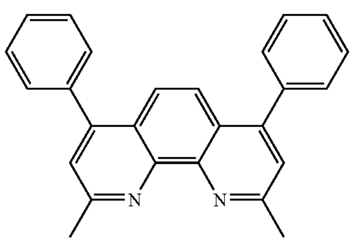

BCP

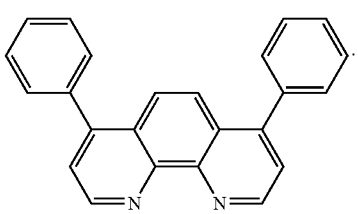

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ:

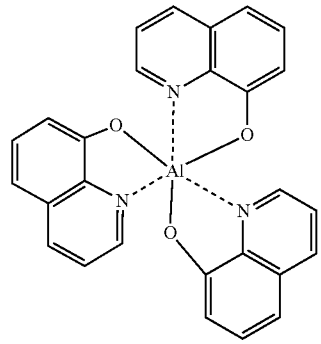

$Alq_3$

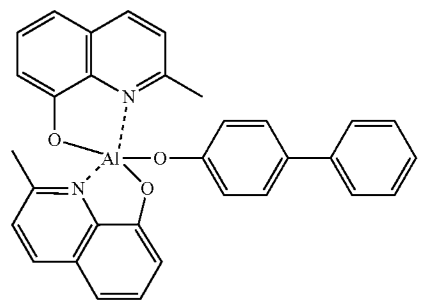

BAlq

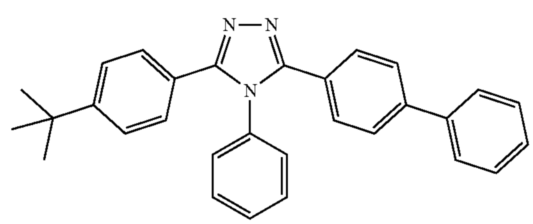

TAZ

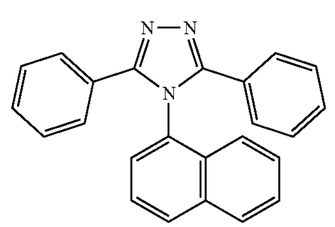

NTAZ

In one or more embodiments, the electron transport layer may include at least one of ET1 to ET25, but are not limited thereto:

-continued
ET1
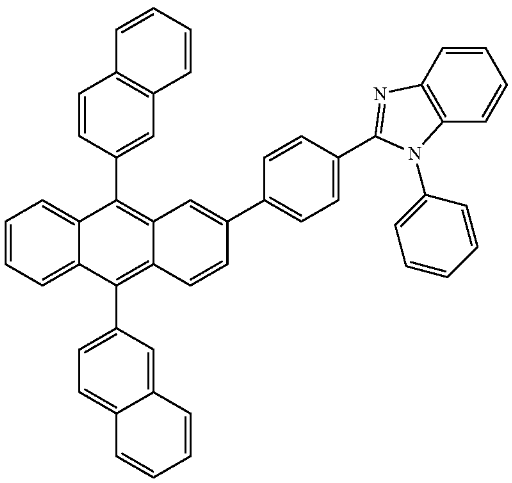
ET2
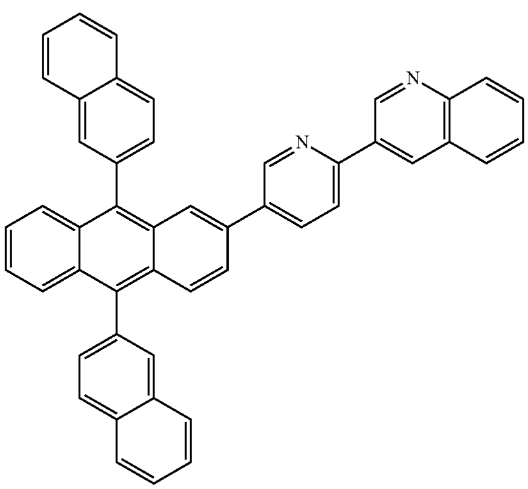
ET3
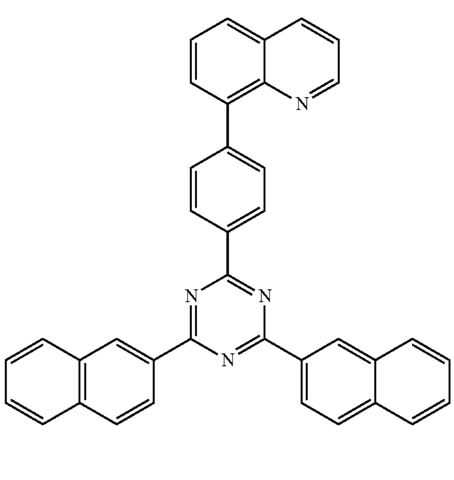
ET4
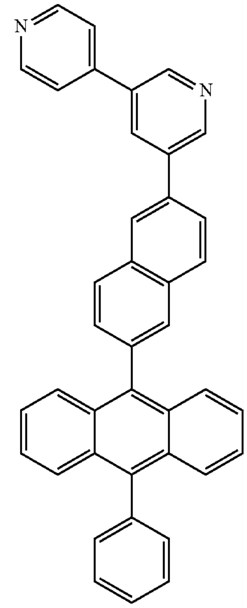
ET5
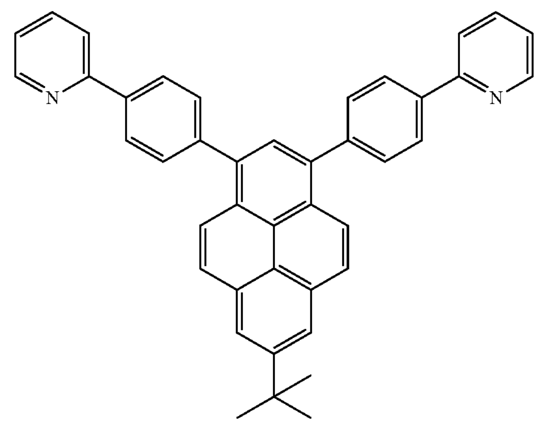
ET6
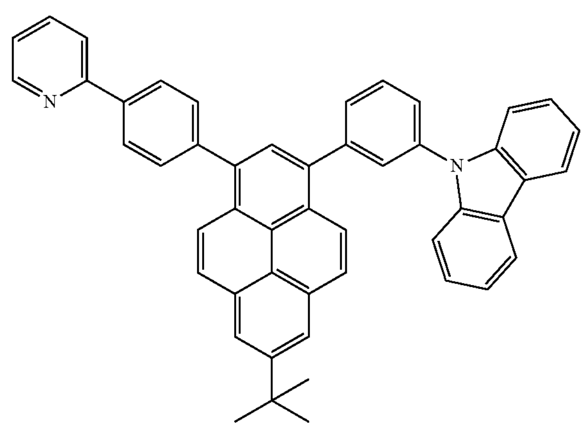

-continued
ET7
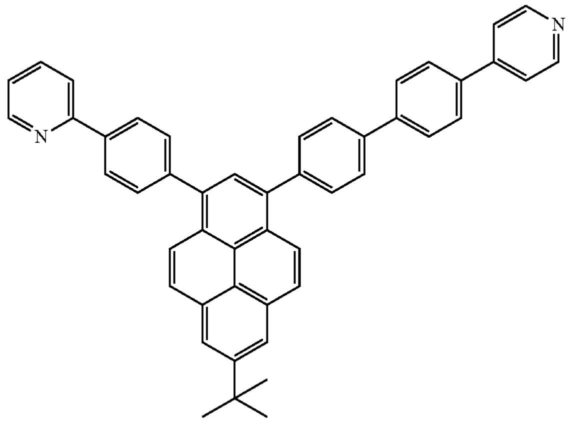
ET8
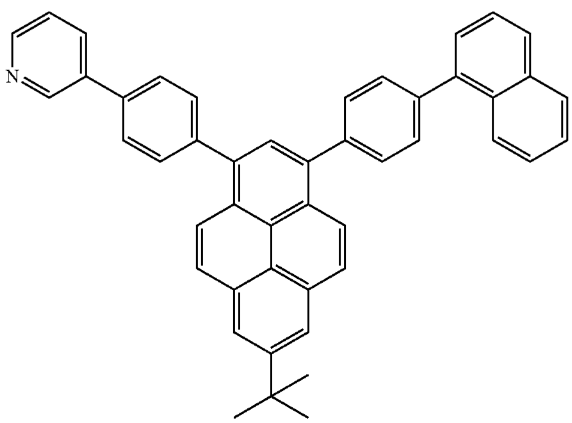
ET9
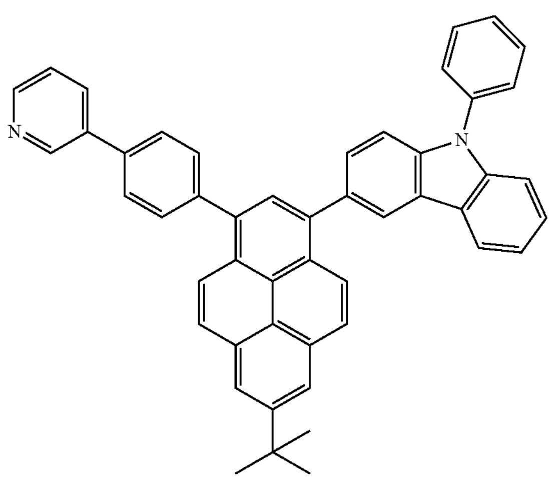
-continued
ET10
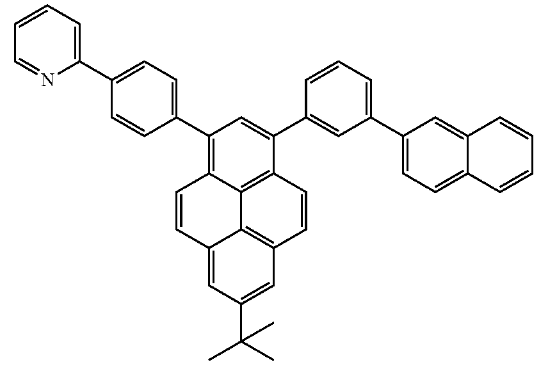
ET11
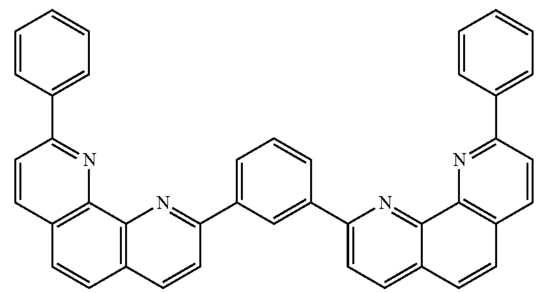
ET12
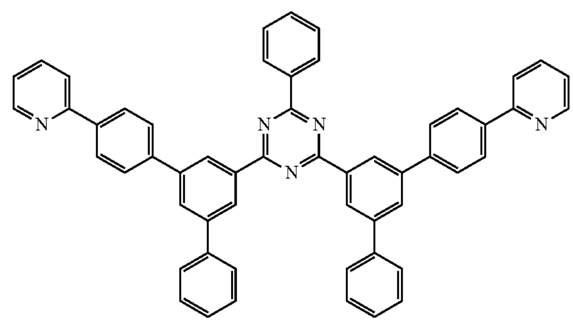
ET13
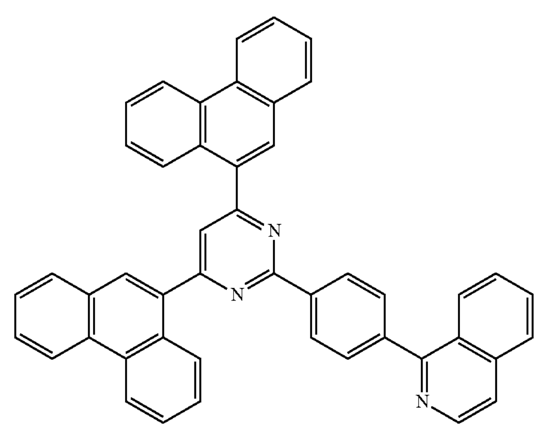

-continued
ET14
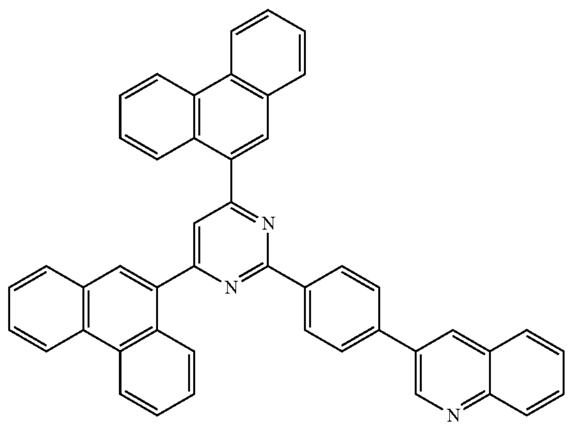
ET15
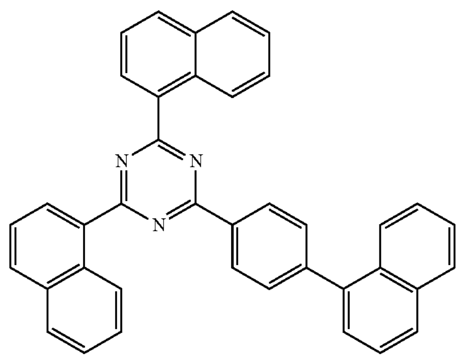
ET16
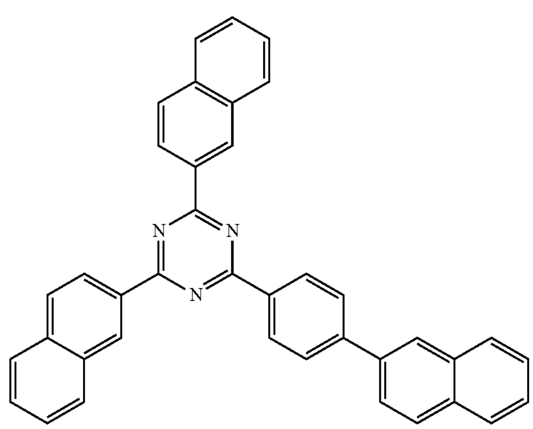
-continued
ET17
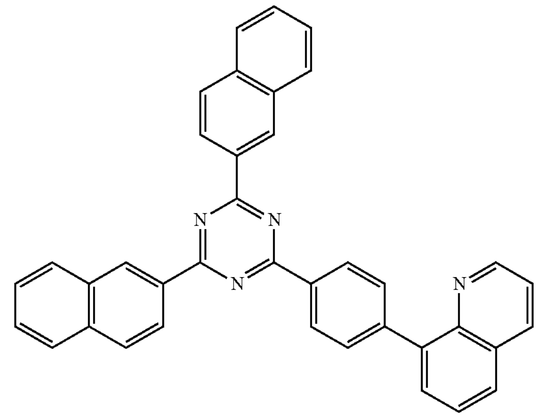
ET18
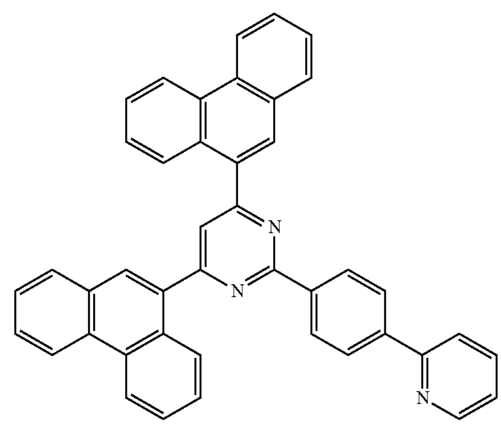
ET19
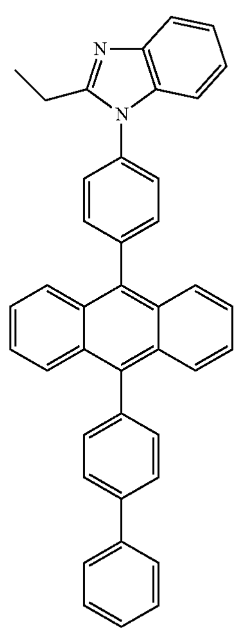

-continued
ET20
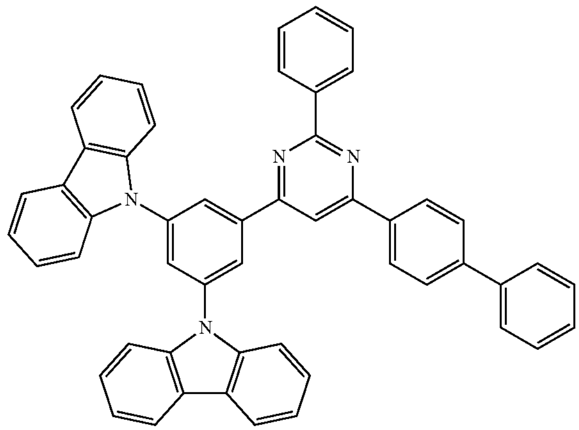
ET21
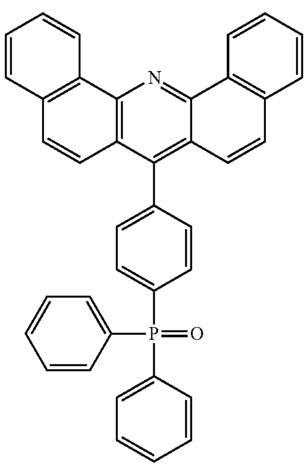
ET22
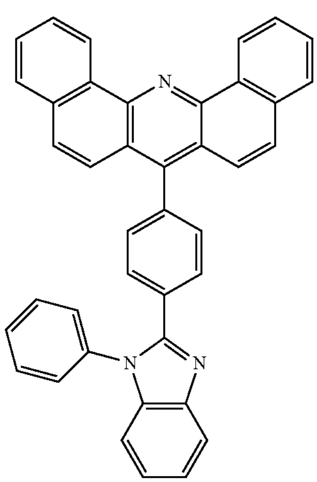
-continued
ET23
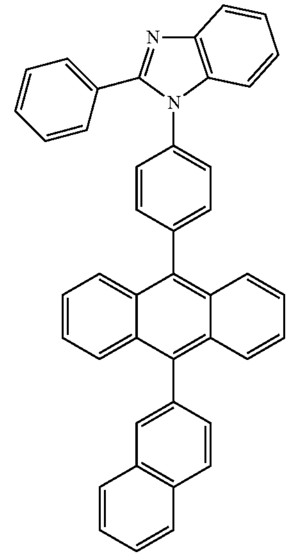
ET24
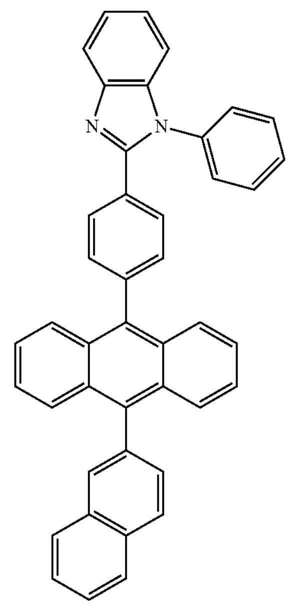
ET25
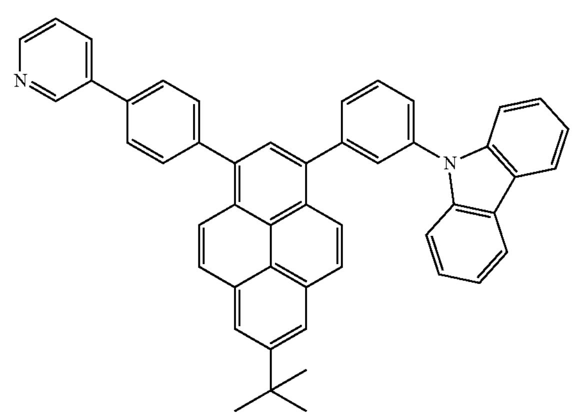
A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

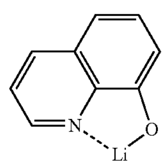

ET-D2

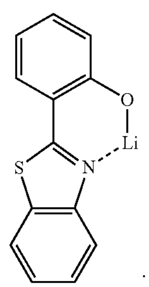

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19.

In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-

$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), the term a "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates $-A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to $-A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

Compound 1 was synthesized according to Reaction Scheme 1:

Reaction Scheme 1

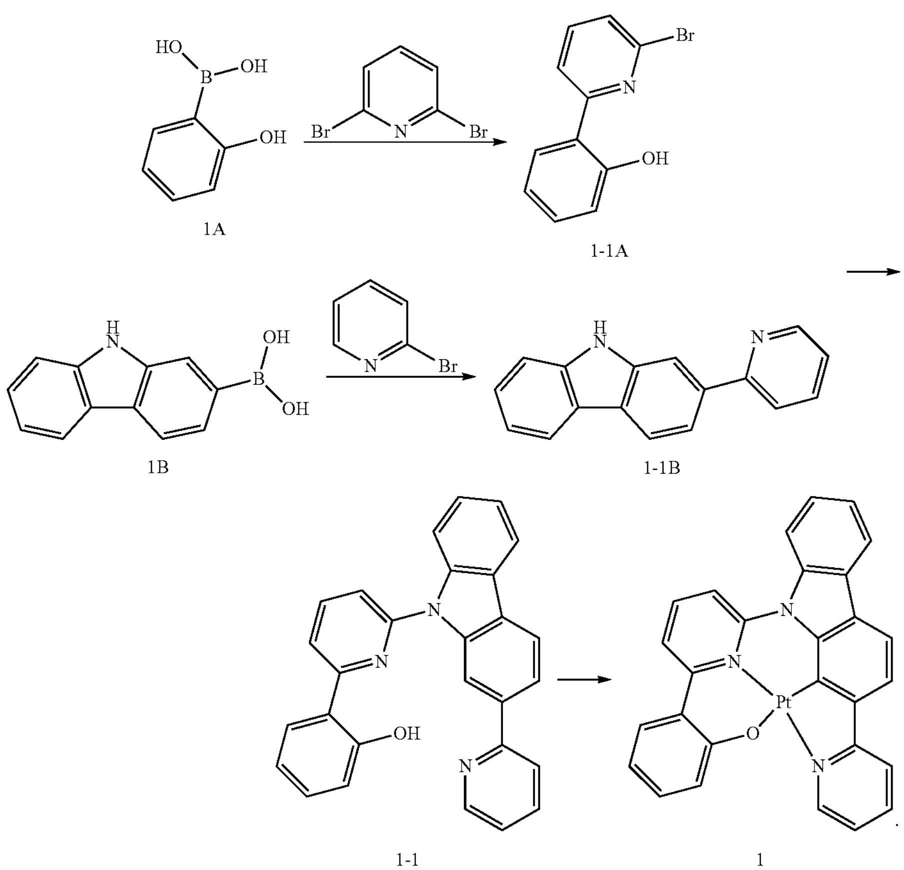

Synthesis of Intermediate 1-1A

Starting material 1A (2.0 grams (g), 9.086 millimoles, mmol), 2,6-dibromopyridine (2.05 g, 8.654 mmol), sodium carbonate (2.75 g, 25.96 mmol), and $Pd(PPh_3)_4$ (0.7 g, 0.61 mmol) were mixed with 60 milliliters (ml) of toluene, 20 ml of distilled water, and 20 ml of ethanol, and the mixed solution was stirred at a temperature of 95° C. for 10 hours under reflux. The resulting reaction product was cooled to room temperature and extracted by using 200 ml of water and 200 ml of ethyl acetate. The organic layer was dried by using $MgSO_4$. The solvent was removed from the organic layer, and the resulting residue was subjected to purification by silica gel column chromatography, thereby obtaining Intermediate 1-2A (1.8 g, 83%). The obtained compound was identified by LC-MS.

LC-MS m/z=249.98 $(M+H)^+$

Synthesis of Intermediate 1-1B

Starting material 1B (3.0 g, 10.253 mmol), 2-bromopyridine (1.35 g, 8.545 mmol), sodium carbonate (2.75 g, 25.96 mmol), and $Pd(PPh_3)_4$ (0.7 g, 0.61 mmol) were mixed with 60 ml of tetrahydrofuran (THF) and 20 ml of distilled water, and the mixed solution was stirred at a temperature of 90° C. for 3 hours under reflux. The resulting reaction product was cooled to room temperature and extracted by using 200 ml of water and 200 ml of ethyl acetate. The organic layer was dried by using $MgSO_4$. The solvent was removed from the organic layer, and the resulting residue was subjected to purification by silica gel column chromatography, thereby obtaining Intermediate 1-2B (1.83 g, 88%). The obtained compound was identified by LC-MS.

LC-MS m/z=245.10 $(M+H)^+$

Synthesis of Intermediate 1-1

Intermediate 1-2A (1.8 g, 7.37 mmol), Intermediate 1-2B (1.68 g, 6.70 mmol), cesium carbonate (2.18 g, 6.70 mmol), and CuI (0.13 g, 0.67 mmol) were mixed with 50 ml of dimethyl formamide (DMF), and the mixed solution was stirred at a temperature of 120° C. for 16 hours under reflux. The resulting reaction product was cooled to room temperature and the solvent was removed therefrom by vacuum distillation. The product was extracted by using 200 ml of water and 200 ml of dimethylchloride (DMC), and the organic layer extracted therefrom was dried by using $MgSO_4$. The solvent was removed from the organic layer, and the resulting residue was subjected to purification by silica gel column chromatography, thereby obtaining Intermediate 1-1 (1.96 g, 71%). The obtained compound was identified by LC-MS.

LC-MS m/z=414.15 $(M+H)^+$

Synthesis of Compound 1

Intermediate 1-1 (1.96 g, 4.75 mmol), potassium tetrachloroplatinate (2.07 g, 5.00 mmol), and 100 ml of benzonitrile (PhCN) were mixed together, and the mixed solution was stirred at a temperature of 180° C. for 14 hours under reflux. After the reaction was finished, the resulting reaction product was cooled to room temperature, and the solvent was removed therefrom by vacuum distillation. The resulting residue was subjected to purification by silica gel column chromatography, thereby obtaining Compound 1 (1.17 g, 41%). The obtained compound was identified by LC-MS.

LC-MS m/z=607.10 $(M+H)^+$

Synthesis Example 2: Synthesis of Compound 2

Compound 2 was synthesized in the same manner as in Synthesis Example 1, except that (2-hydroxy-3,5-dimethylphenyl)boronic acid was used instead of the starting material 1A in synthesizing Intermediate 1-1A. The obtained compound was identified by LC-MS.

LC-MS m/z=635.13 $(M+H)^+$

Synthesis Example 3: Synthesis of Compound 3

Compound 3 was synthesized in the same manner as in Synthesis Example 1, except that (3,5-di-tert-butyl-2-hydroxyphenyl)boronic acid was used instead of the starting material 1A in synthesizing Intermediate 1-1A. The obtained compound was identified by LC-MS.

LC-MS m/z=719.23 $(M+H)^+$

Synthesis Example 4: Synthesis of Compound 12

Compound 12 was synthesized in the same manner as in Synthesis Example 1, except that (3,5-di-tert-butyl-2-hydroxyphenyl)boronic acid was used instead of the starting material 1A in synthesizing Intermediate 1-1A and 2-bromo-4-phenylpyridine was used instead of 2-bromopyridine in synthesizing Intermediate 1-1B. The obtained compound was identified by LC-MS.

LC-MS m/z=795.26 $(M+H)^+$

Synthesis Example 5: Synthesis of Compound 36

Compound 36 was synthesized in the same manner as in Synthesis Example 1, except that (3,5-di-tert-butyl-2-hydroxyphenyl)boronic acid and 2,6-dibromo-4-(tert-butyl)pyridine were used instead of the starting material 1A and 2,6-dibromopyridine, respectively, in synthesizing Intermediate 1-1A, and 2-bromo-4-phenylpyridine was used instead of 2-bromopyridine in synthesizing Intermediate 1-1B. The obtained compound was identified by LC-MS.

LC-MS m/z=851.32 $(M+H)^+$

Synthesis Example 6: Synthesis of Compound 42

Compound 42 was synthesized in the same manner as in Synthesis Example 1, except that (3,5-d i-tert-butyl-2-hydroxyphenyl)boronic acid and 2,6-dibromo-4-phenylpyridine were used instead of the starting material 1A and 2,6-dibromopyridine, respectively, in synthesizing Intermediate 1-1A, and 2-bromo-4-phenylpyridine was used instead of 2-bromopyridine in synthesizing Intermediate 1-1B. The obtained compound was identified by LC-MS.

LC-MS m/z=871.29 $(M+H)^+$

Synthesis Example 7: Synthesis of Compound 50

Compound 50 was synthesized in the same manner as in Synthesis Example 1, except that (3,5-di-tert-butyl-2-hydroxyphenyl)boronic acid and 2,6-dibromo-4-(tert-butyl)pyridine were used instead of the starting material 1A and 2,6-dibromopyridine, respectively, in synthesizing Intermediate 1-1A, and 4-([1,1'-biphenyl]-4-yl)-2-bromopyridine was used instead of 2-bromopyridine in synthesizing Intermediate 1B. The obtained compound was identified by LC-MS.

LC-MS m/z=927.35 $(M+H)^+$

Synthesis Example 8: Synthesis of Compound 161

Compound 161 was synthesized in the same manner as in Synthesis Example 1, except that (3,5-di-tert-butyl-2-hydroxyphenyl)boronic acid was used instead of the starting material 1A in synthesizing Intermediate 1-1A, and (2,3-dimethyl-1H-indol-6-yl)boronic acid was used instead of 2-bromopyridine in synthesizing Intermediate 1-1B. The obtained compound was identified by LC-MS.

LC-MS m/z=697.24 $(M+H)^+$

Evaluation Example 1: Photoluminescence (PL) Spectrum Evaluation

Figure 2:
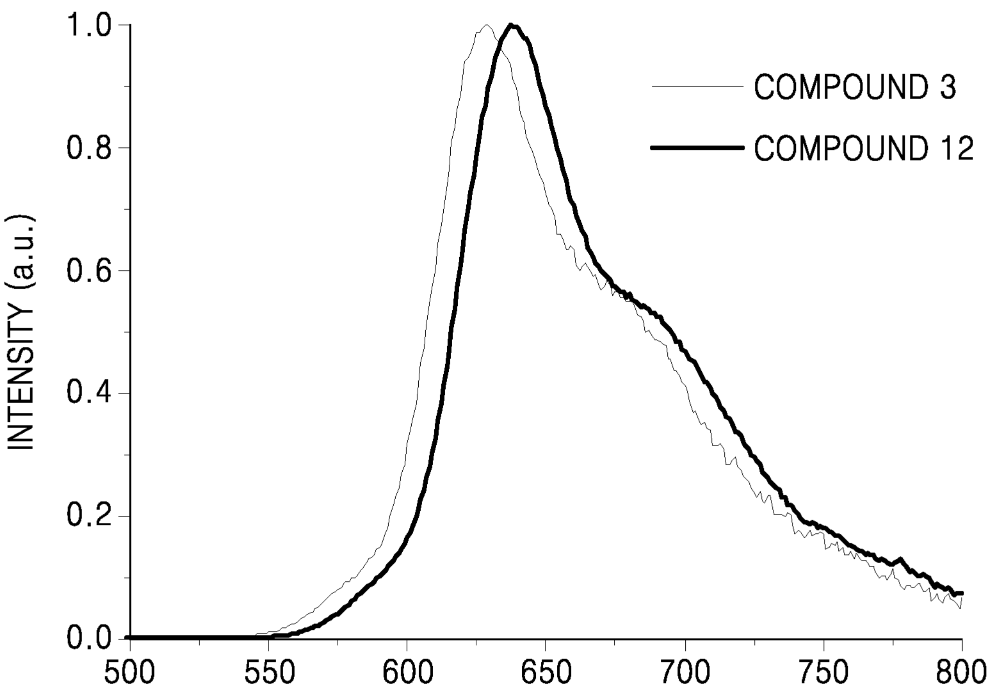
FIG. 2 is a graph of intensity (arbitrary units, a. u.) versus wavelength (nanometers, nm) showing photoluminescence spectra of Compounds 3 and 12.

Compound 1 was diluted to a concentration of 10 millimolar (mM) in toluene, followed by measuring PL spectrum of Compound 1 at room temperature by using ISC PC1 spectrofluorometer that is equipped with Xenon lamp. Such measurement was repeatedly performed on Compounds 2, 3, 12, 50, and A, and the results thereof are shown in Table 2. The PL spectra of Compounds 3 and 12 are shown in FIG. 2.

TABLE 2

| Compound No. | Maximum emission wavelength (nm) | FWHM (nm) |
|---|---|---|
| 1 | 604 | 69 |
| 2 | 632 | 74 |
| 3 | 629 | 74 |
| 12 | 637 | 79 |
| 50 | 641 | 81 |
| A | 615 | 61 |

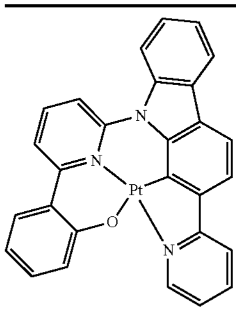
1

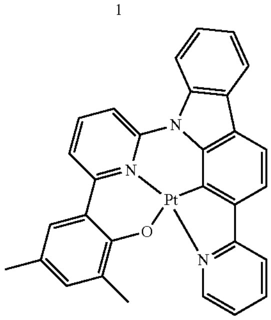
2

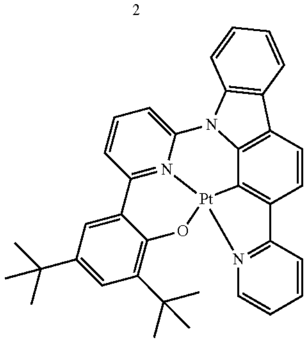
3

TABLE 2-continued

| Compound No. | Maximum emission wavelength (nm) | FWHM (nm) |
|---|---|---|

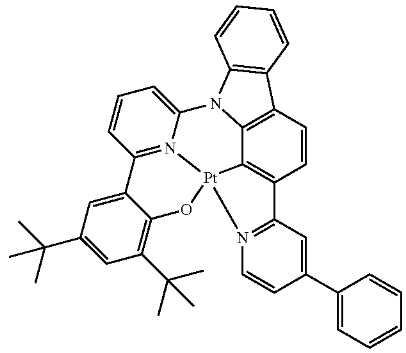
12

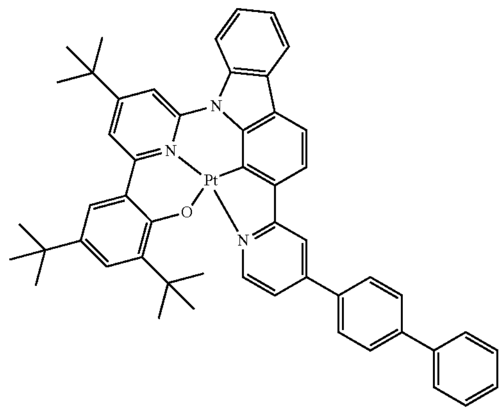
50

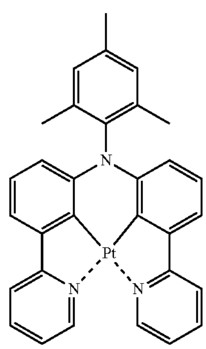
A

Example 1

An ITO glass substrate was cut to a size of 50 mm×50 mm×0.5 mm (mm=millimeter), sonicated with acetone isopropyl alcohol and pure water each for 15 minutes, and then, cleaned by exposure to ultraviolet rays and ozone for 30 minutes.

Then, m-MTDATA was formed on an ITO electrode (anode) formed on the ITO glass substrate at a deposition rate of 1 Angstrom per second (Å/sec) to form a hole injection layer having a thickness of 600 Angstroms (Å), and α-NPD(NPB) was formed on the hole injection layer at a deposition rate of 1 Å/sec to form a hole transport layer having a thickness of 250 Å.

Compound 1 (dopant) and CBP (host) were co-deposited on the hole transport layer at a dopant to host weight ratio of 2:98 to form an emission layer having a thickness of 400 Å.

Balq was deposited on the emission layer at a deposition rate of 1 Å/sec to form a hole blocking layer having a thickness of 50 Å, and $Alq_3$ was deposited on the hole blocking layer to form an electron transport layer having a thickness of 300 Å. Then, LiF was deposited on the electron transport layer to form an electron injection layer having a thickness of 10 Å, and Al was vacuum deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 1 (2 weight %)(400 Å)/Balq (50 Å)/$Alq_3$ (300 Å)/LiF (10 Å)/Al (1,200 Å):

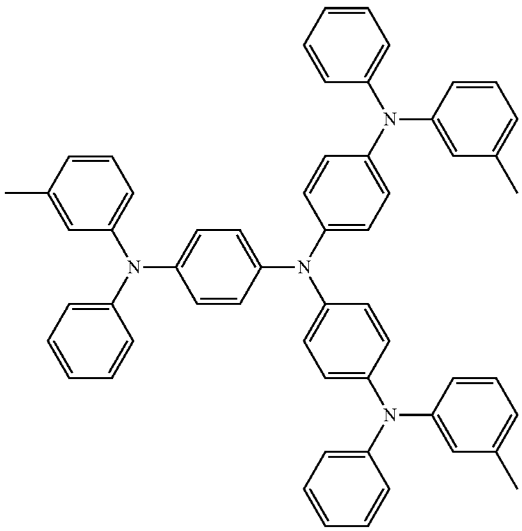

m-MTDATA

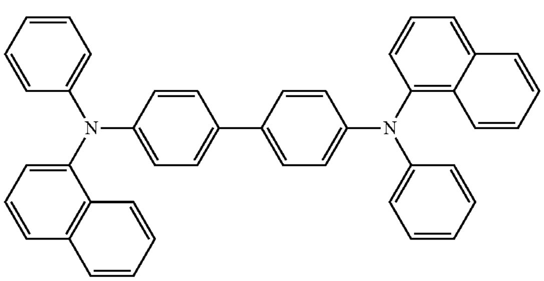

NPB

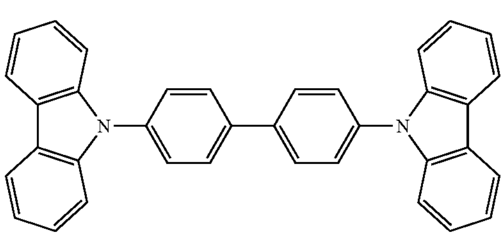

CBP

-continued

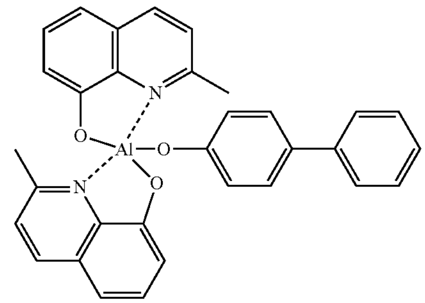

BAlq

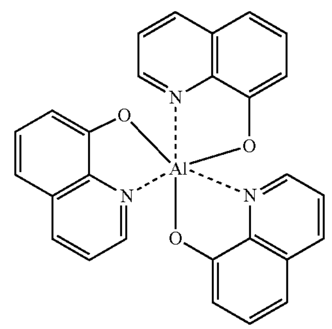

$Alq_3$

Examples 2 to 5 and Comparative Example A

Organic light-emitting devices were manufactured in the same manner as in Example 1, except that Compounds shown in Table 3 were each used instead of Compound 1 in forming an emission layer.

Evaluation Example 2: Evaluation on Characteristics of Organic Light-Emitting Devices Driving voltage, emission efficiency, luminescence quantum efficiency, roll-off ratio, maximum emission wavelength, and full width at half maximum (FWHM) of the organic light-emitting devices manufactured according to Examples 1 to 5 and Comparative Example A were evaluated by using a current-voltage meter (Keithley 2400) and a luminance meter (Minolta Cs-1000A), and the results thereof are shown in Table 3. Here, the roll-off ratio was as calculated according to Equation 20.

$$\text{Roll off}=\{1-(\text{efficiency(at 9,000 nit)}/\text{maximum emission efficiency})\}\times 100\% \quad \text{Equation 20}$$

TABLE 3

| | Dopant Compound No. | Driving Voltage (V) | Emission Efficiency (cd/A) | Luminescence quantum efficiency (%) | Roll-off ratio (%) | Maximum emission wavelength (nm) | FWHM (nm) |
|---|---|---|---|---|---|---|---|
| Example 1 | 1 | 5.02 | 24.5 | 16.2 | 23 | 602 | 65 |
| Example 2 | 2 | 4.97 | 25.8 | 17.4 | 22 | 612 | 68 |
| Example 3 | 3 | 4.46 | 28.1 | 19.5 | 19 | 617 | 72 |
| Example 4 | 12 | 4.52 | 29.3 | 19.8 | 19 | 623 | 74 |
| Example 5 | 50 | 4.57 | 28.9 | 20.2 | 20 | 628 | 78 |
| Comparative Example A | A | 5.37 | 16.46 | 13.32 | 25.5 | 615 | 68 |

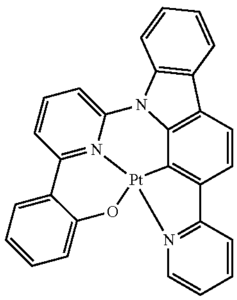
1

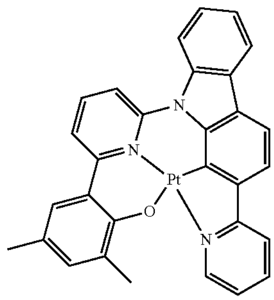
2

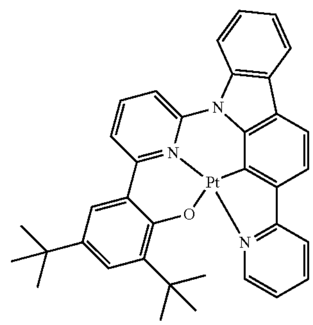
3

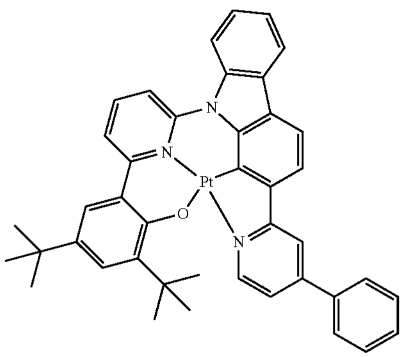
12

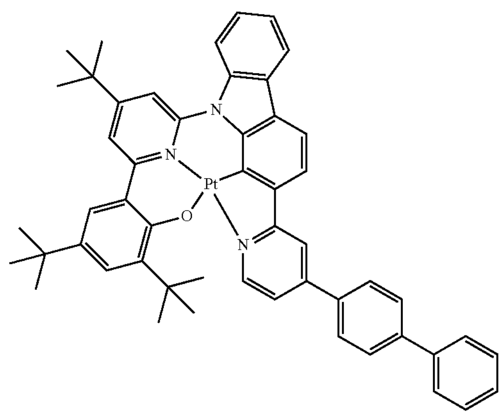
50

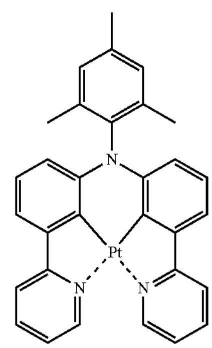
A

Referring to Table 3, it was confirmed that the organic light-emitting devices of Examples 1 to 5 had improved driving voltages, emission efficiencies, luminescence quantum efficiencies, and roll-off ratios than those of the organic light-emitting device of Comparative Example A.

The organometallic compound according to embodiments has excellent electric characteristics and/or thermal stability. Accordingly, an organic light-emitting device including the organometallic compound may have an improved emission efficiency, a high external quantum efficiency, a high roll-off ratio, and a long lifespan. In addition, due to excellent phosphorescent emission characteristics of the organometallic compound, the organometallic compound may be used to provide a diagnostic composition having a high diagnostic efficiency.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula

Formula 1

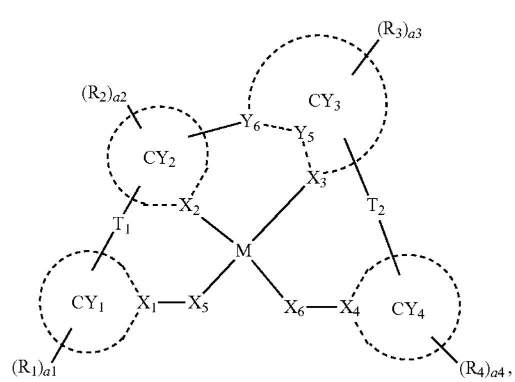

1:

wherein, in Formula 1,

M is platinum (Pt), $X_1$ and $X_3$ are each independently C, $X_2$ and $X_4$ are each independently N, $X_5$ is O, $X_6$ is a chemical bond, $X_4$ and M are directly bonded together, a bond between $X_5$ and M and a bond between $X_3$ and M are each independently a covalent bond, and a bond between $X_2$ and M and a bond between $X_4$ and M are each independently a coordinate bond, $T_1$ and $T_2$ are each independently a single bond, $R_1$ to $R_4$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, two groups $R_1$ among a plurality of neighboring groups $R_1$ are optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, two groups $R_2$ among a plurality of neighboring groups $R_2$ are optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, two groups $R_3$ among a plurality of neighboring groups $R_3$ are optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, two groups $R_4$ among a plurality of neighboring groups $R_4$ are optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted at least one $R_{10a}$, $R_1$ and $R_2$, $R_1$ and $R_3$, $R_1$ and $R_4$, $R_2$ and $R_3$, $R_2$ and $R_4$, and $R_3$ and $R_4$ are not linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $R_{10a}$ is the same as described in connection with $R_1$,

* and *' each independently indicate a binding site to a neighboring atom, wherein the moiety represented by

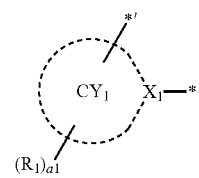

is represented by Formula A1-1(1),

A1-1(1)

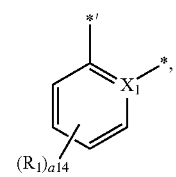

wherein, in Formula A1-1(1), a14 is an integer of 0 to 4,

* indicates a binding site to $X_5$ of Formula 1, and

*' indicates a binding site to $T_1$ of Formula 1, wherein the moiety represented by

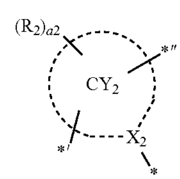

is represented by Formula A2-1(1),

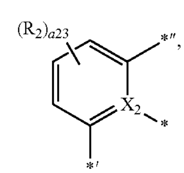

wherein, in Formula A2-1(1), a23 is an integer of 0 to 3,

* indicates a binding site to M of Formula 1,

*' indicates a binding site to $T_1$ of Formula 1, and

*'' indicates a binding site to $Y_6$ of Formula 1, wherein the moiety represented by

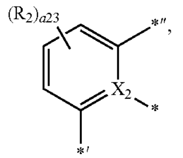

is represented by Formula A3-3(52)

A3-3(52)

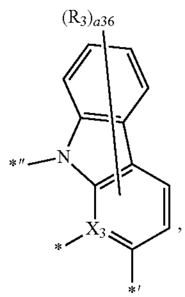

* indicates a binding site to M of Formula 1,

*" indicates a binding site to ring $CY_2$ of Formula 1,

*' indicates a binding site to $T_2$ of Formula 1, wherein the moiety represented by

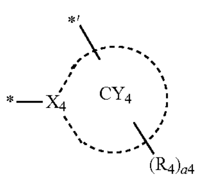

is represented by Formula A4-1(1),

A4-1(1)

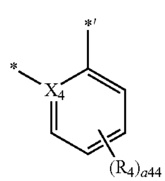

wherein, in Formula A4-1(1), a44 is an integer of 0 to 4,

* indicates a binding site to M or $X_6$ of Formula 1, and

*' indicates a binding site to $T_2$ of Formula 1, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group is selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropoly cyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, and a monovalent non-aromatic condensed heteropoly cyclic group, provided that a number of carbons in a $C_1$-$C_{60}$ alkyl group, a $C_2$-$C_{60}$ alkenyl group, and a $C_2$-$C_{60}$ alkynyl group, each substituted with at least one selected from a $C_1$-$C_{60}$ alkyl group, a $C_2$-$C_{60}$ alkenyl group, and a $C_2$-$C_{60}$ alkynyl group does not exceed 60 carbons.

2. The organometallic compound of claim 1, wherein $R_1$ to $R_4$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbomenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbomenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbomenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, provided that a number of carbons in a $C_1$-$C_{20}$ alkyl group substituted with a $C_1$-$C_{10}$ alkyl group does not exceed 20 carbons.

3. The organometallic compound of claim 1, wherein the moiety represented by

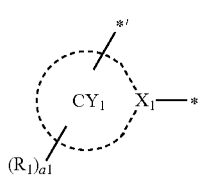

is represented by one of Formulae CY1-1 to CY1-16, the moiety represented by

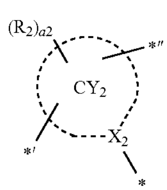

is represented by one of Formulae CY2-1 to CY2-8, the moiety represented by

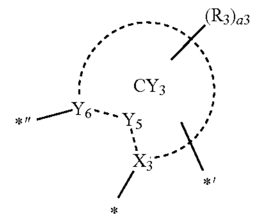

is represented by one of Formulae CY3-10 to CY3-13, and the moiety represented by

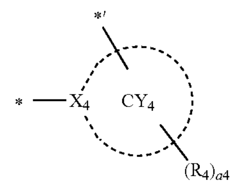

is represented by one of Formulae CY4-1 to CY4-16

CY1-1

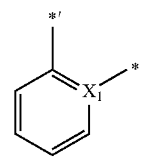

CY1-2

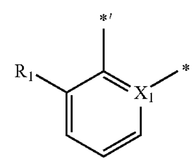

CY1-3

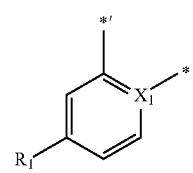

CY1-4

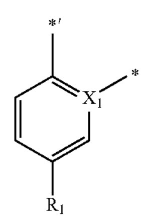

CY1-5

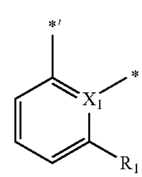

CY1-6
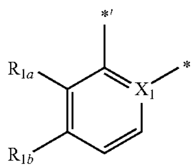
CY1-7
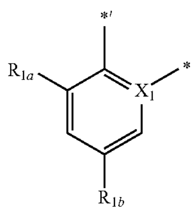
CY1-8
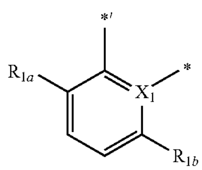
CY1-9
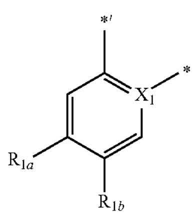
CY1-10
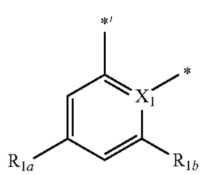
CY1-11
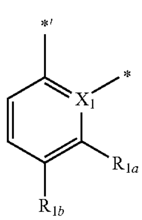
CY1-12
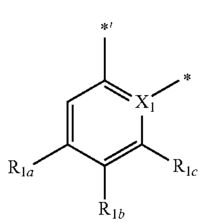
CY1-13
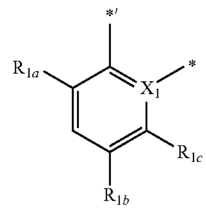
CY1-14
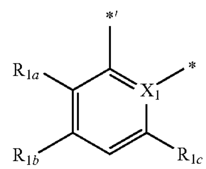
CY1-15
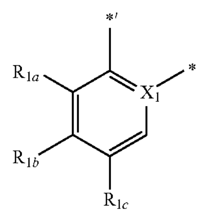
CY1-16
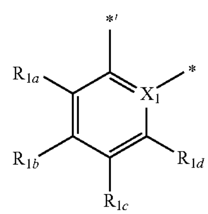
CY1-17
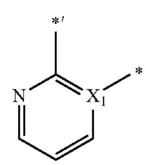
CY1-18
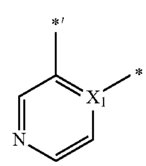
CY1-19
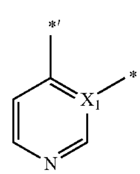
CY1-20
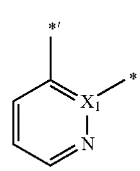

-continued
CY1-21
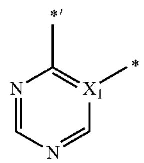
CY1-22
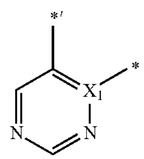
CY1-23
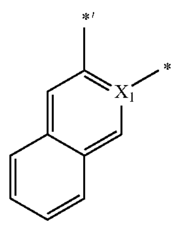
CY1-24
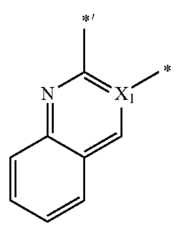
CY1-25
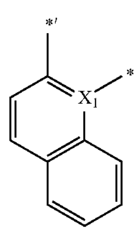
CY1-26
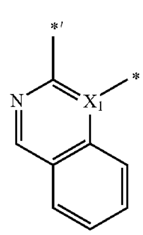
CY1-27
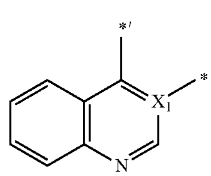
CY1-28
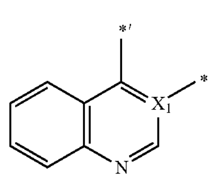
-continued
CY1-29
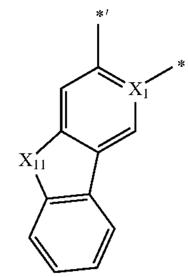
CY1-30
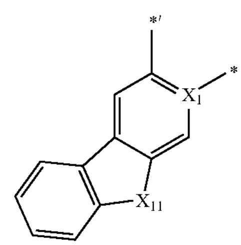
CY1-31
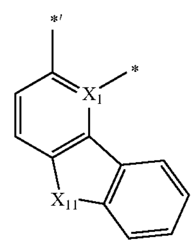
CY1-32
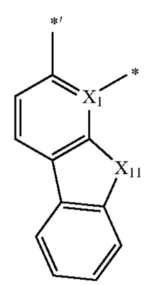
CY1-33
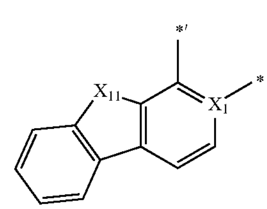
CY1-34
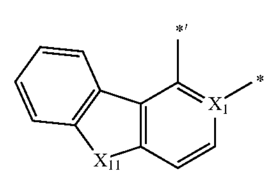

-continued
CY1-35
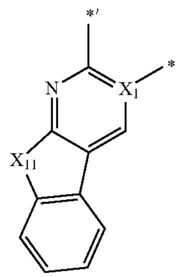
CY1-36
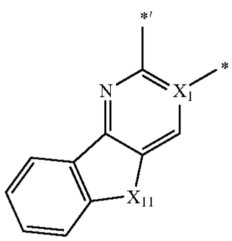
CY1-37
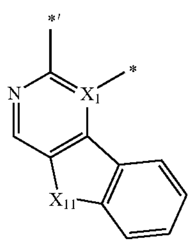
CY1-38
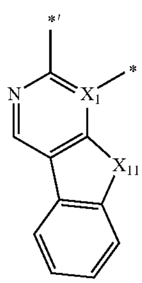
CY1-39
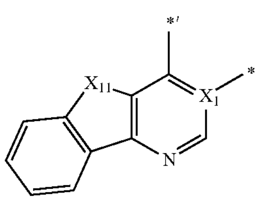
CY1-40
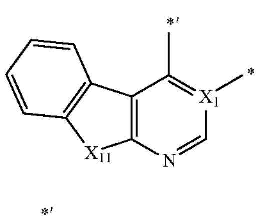
CY1-41
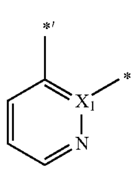
-continued
CY2-1
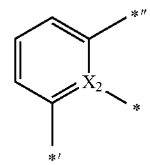
CY2-2
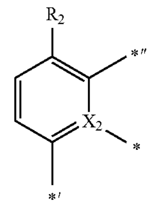
CY2-3
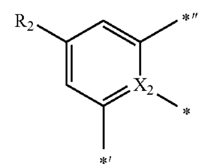
CY2-4
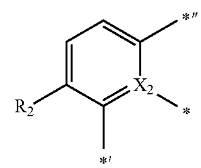
CY2-5
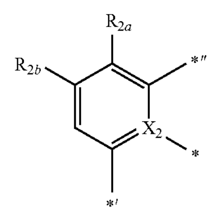
CY2-6
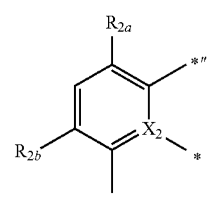
CY2-7
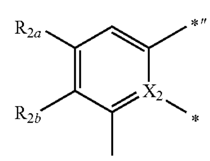
CY2-8
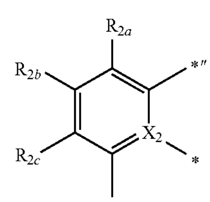

CY2-9
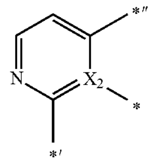
CY2-10
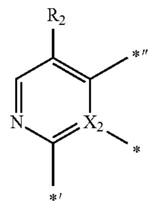
CY2-11
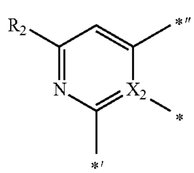
CY2-12
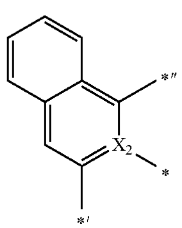
CY2-13
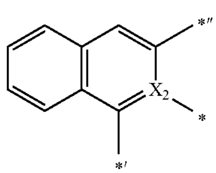
CY2-14
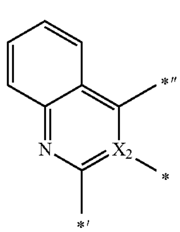
CY2-15
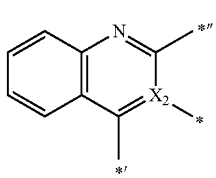
CY3-1
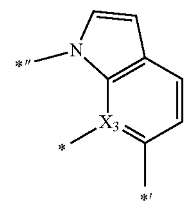
CY3-2
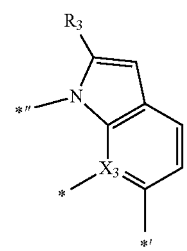
CY3-3
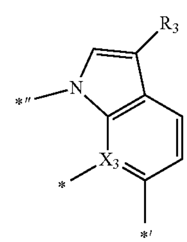
CY3-4
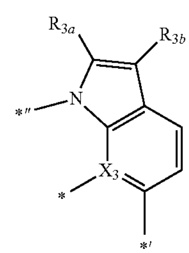
CY3-5
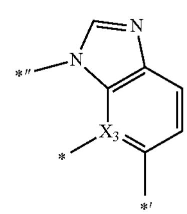
CY3-6
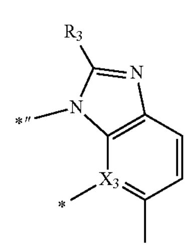

-continued
CY3-7
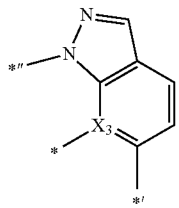
CY3-8
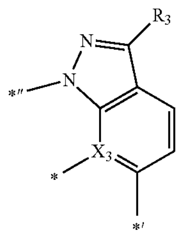
CY3-9
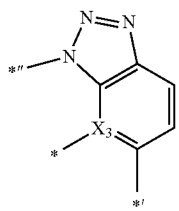
CY3-10
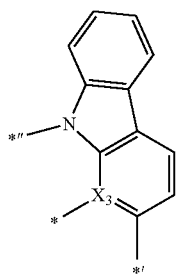
CY3-11
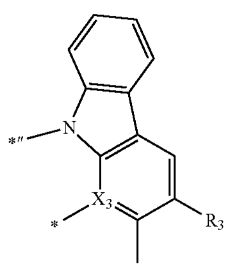
CY3-12
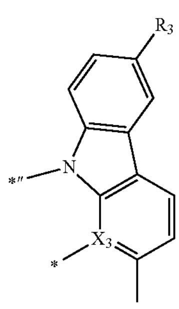
-continued
CY3-13
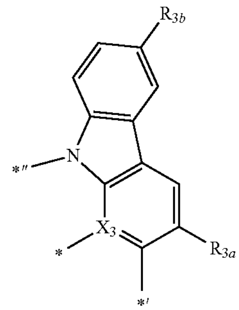
CY4-1
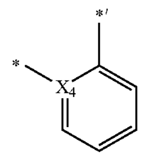
CY4-2
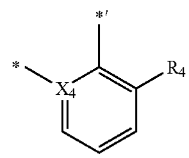
CY4-3
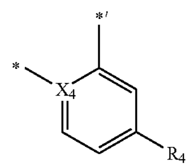
CY4-4
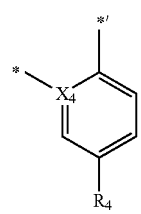
CY4-5
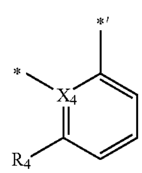
CY4-6
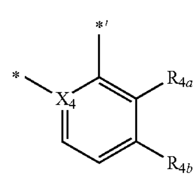
CY4-7
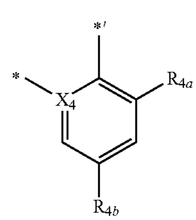

-continued
CY4-8
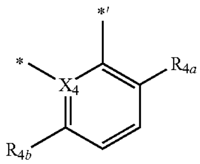
CY4-9
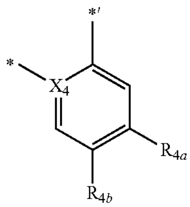
CY4-10
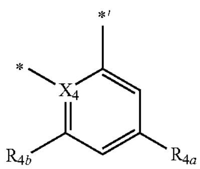
CY4-11
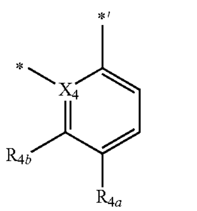
CY4-12
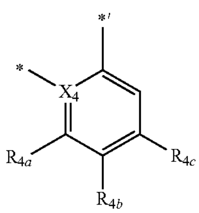
CY4-13
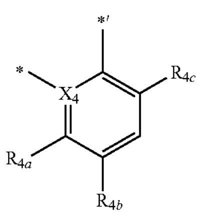
CY4-14
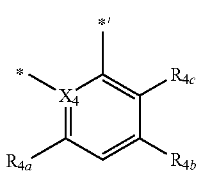
CY4-15
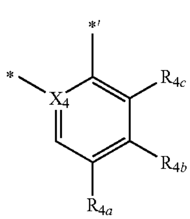
-continued
CY4-16
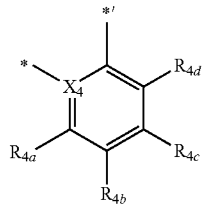
CY4-17
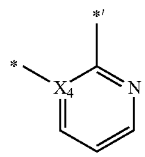
CY4-18
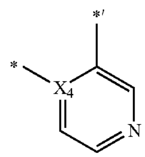
CY4-19
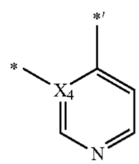
CY4-20
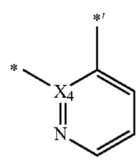
CY4-21
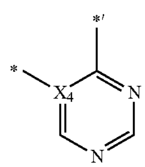
CY4-22
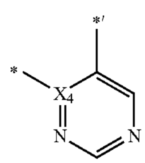
CY4-23
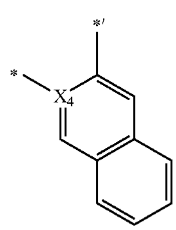

-continued
CY4-24
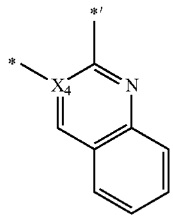
CY4-25
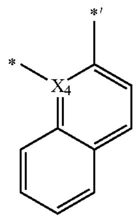
CY4-26
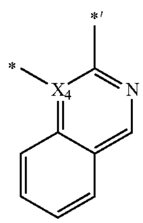
CY4-27
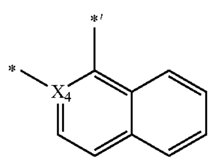
CY4-28
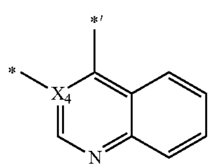
CY4-29
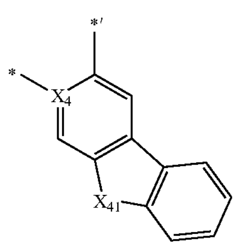
CY4-30
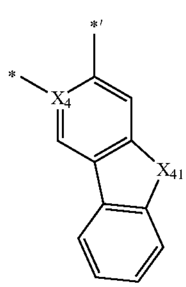
-continued
CY4-31
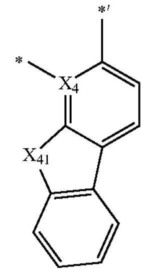
CY4-37
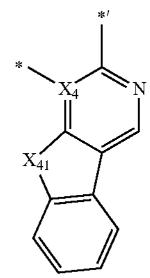
CY4-38
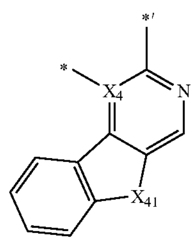
CY4-39
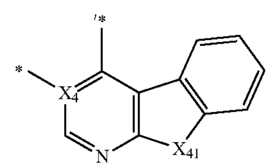
CY4-40
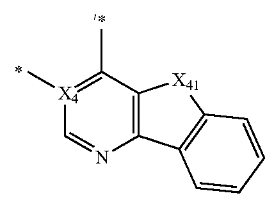
CY4-41
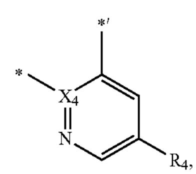
wherein, in Formulae CY1-1 to CY1-16, CY2-1 to CY2-8, CY3-10 to CY3-13, and CY4-1 to CY4-16,
$X_1$ to $X_4$ and $R_1$ to $R_4$ are the same as described in claim 1,
$R_{1a}$ to $R_{1d}$ are the same as described in connection with $R_1$ in claim 1,
$R_{2a}$ to $R_{2c}$ are the same as described in connection with $R_2$ in claim 1, $R_{3a}$ and $R_{3b}$ are the same as described in connection with $R_3$ in claim 1, $R_{4a}$ to $R_{4d}$ are the same as described in connection with $R_4$ in claim 1, provided that, $R_1$ to $R_4$, $R_{1a}$ to $R_{1a}$, $R_{2a}$ to $R_{2c}$, $R_{3a}$, $R_{3b}$, and $R_{4a}$ to $R_{4d}$ are not each independently hydrogen,

* in Formulae CY1-1 to CY1-16 indicates a binding site to $X_5$ of Formula 1,

*' in Formulae CY1-1 to CY1-16 indicates a binding site to $T_1$ of Formula 1,

* in Formulae CY2-1 to CY2-8 indicates a binding site to M of Formula 1,

*' in Formulae CY2-1 to CY2-8 indicates a binding site to $T_1$ of Formula 1,

*" in Formulae CY2-1 to CY2-8 indicates a binding site to $T_2$ of Formula 1,

* in Formulae CY3-10 to CY3-13 indicates a binding site to M of Formula 1,

*" in Formulae CY3-10 to CY3-13 indicates a binding site to $T_2$ of Formula 1,

*' in Formulae CY3-10 to CY3-13 indicates a binding site to $T_3$ of Formula 1,

* in Formulae CY4-1 to CY4-16 indicates a binding site to M or $X_6$ of Formula 1, and

*' in Formulae CY4-1 to CY4-16 indicates a binding site to $T_2$ of Formula 1.

4. The organometallic compound of claim 1, wherein the organometallic compound is one of Compounds 1 to 56, 116, or 117:

1

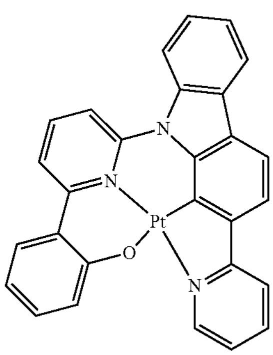

2

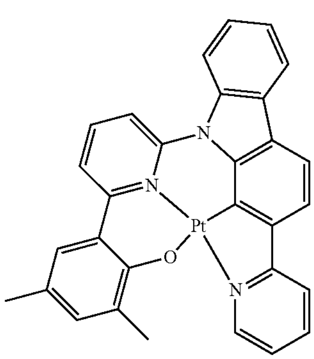

-continued

3

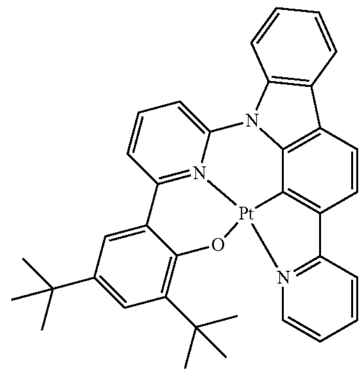

4

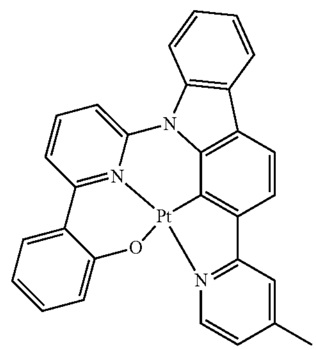

5

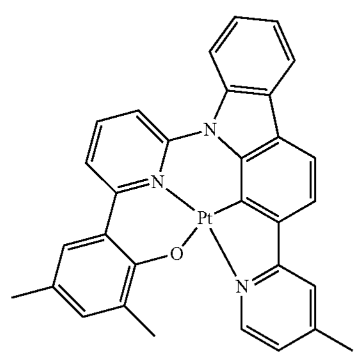

6

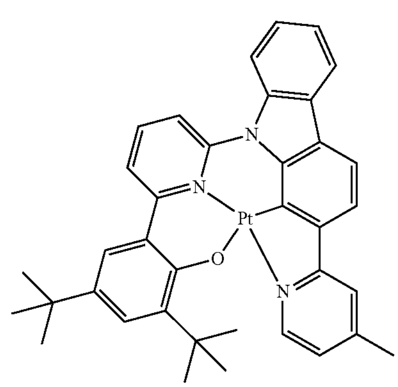

-continued
7
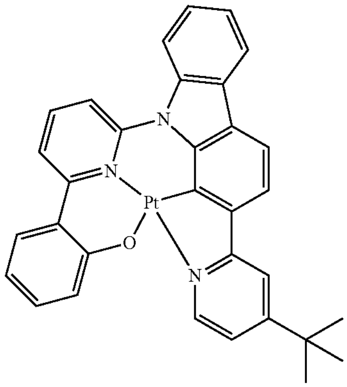
8
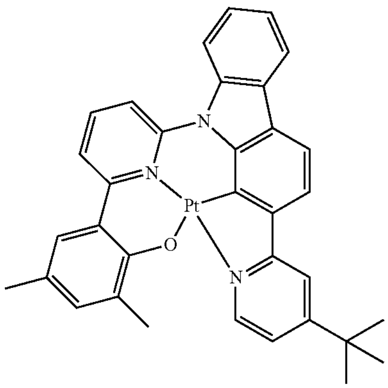
9
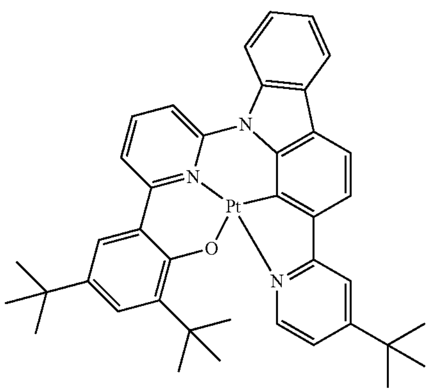
10
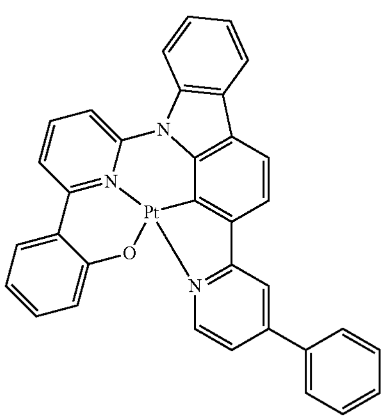
-continued
11
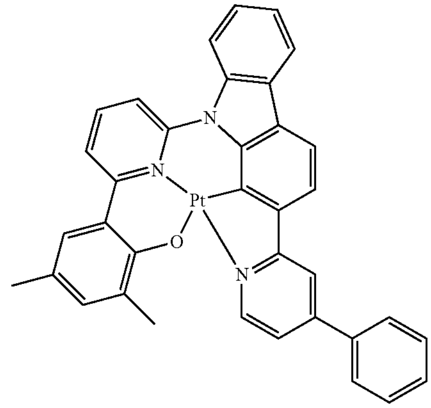
12
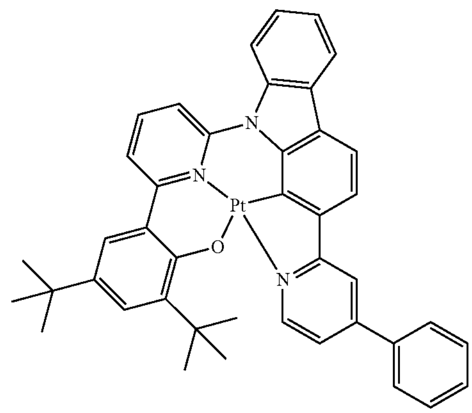
13
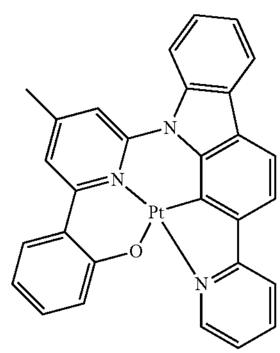
14
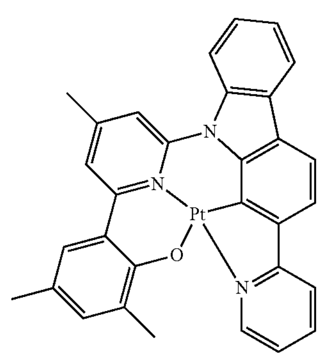

15
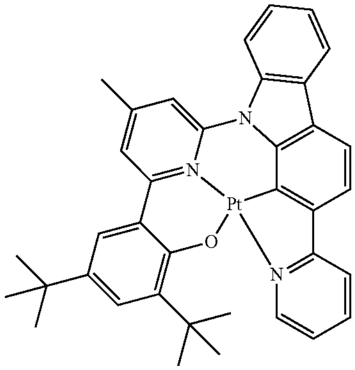
16
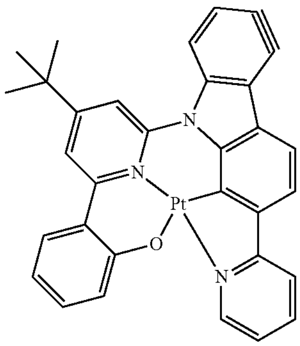
17
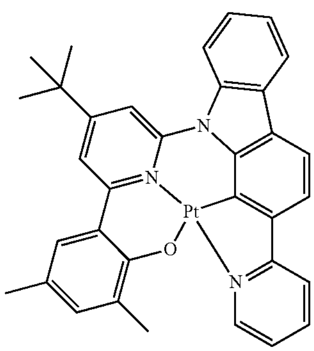
18
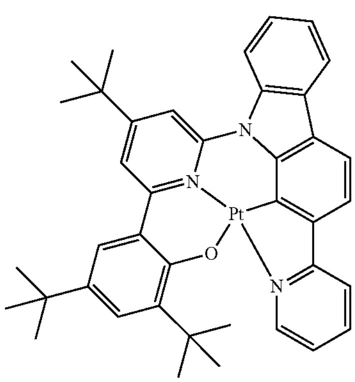
19
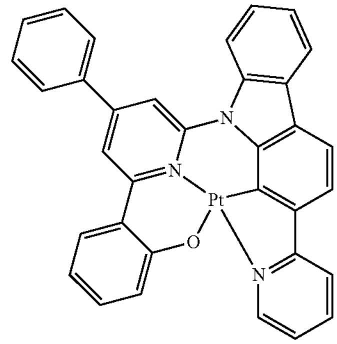
20
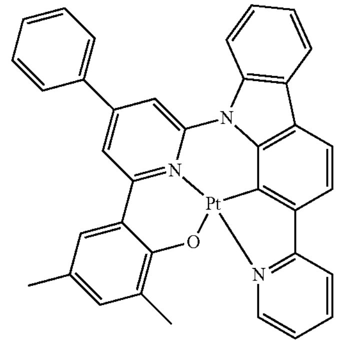
21
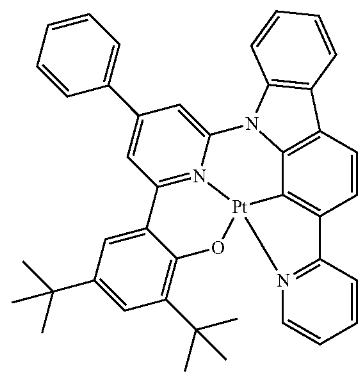
22
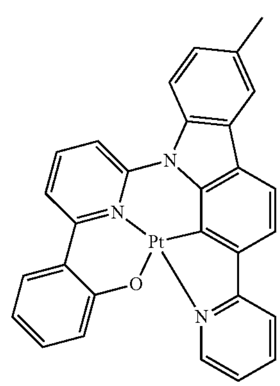

-continued
23
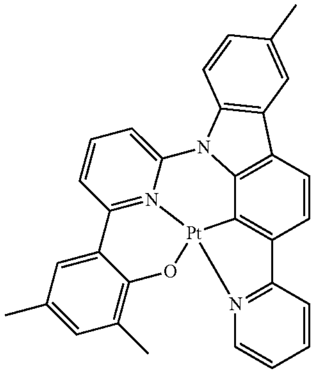
24
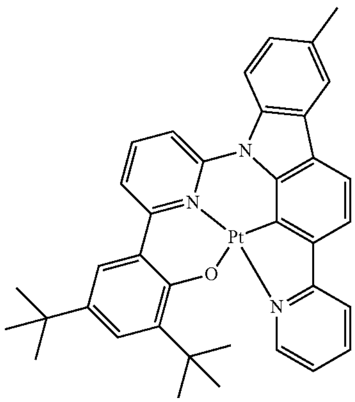
25
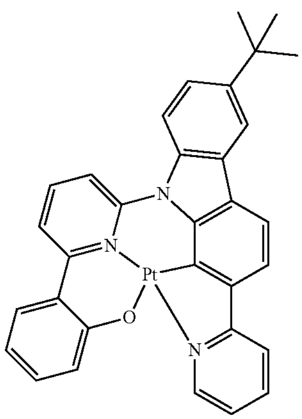
26
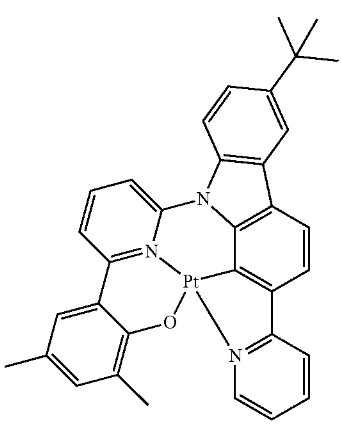
-continued
27
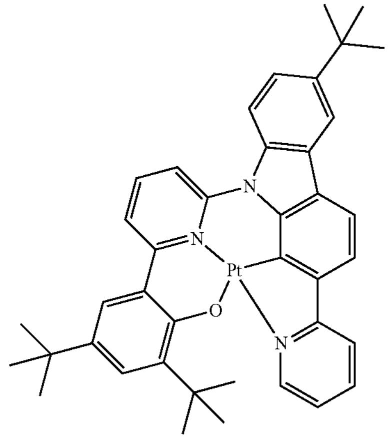
28
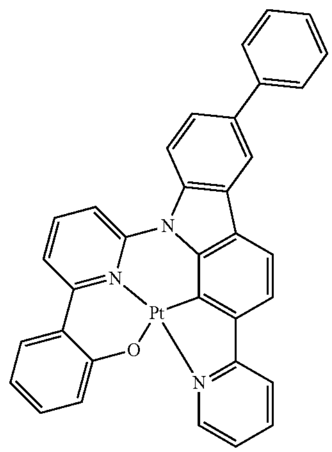
29
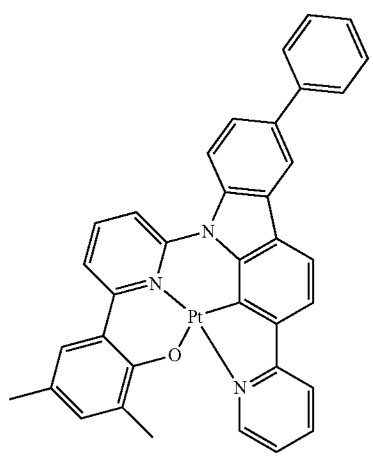

-continued
30
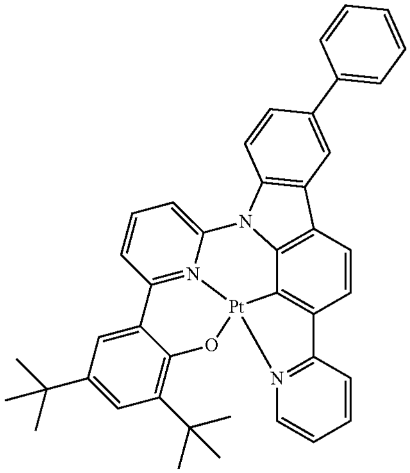
31
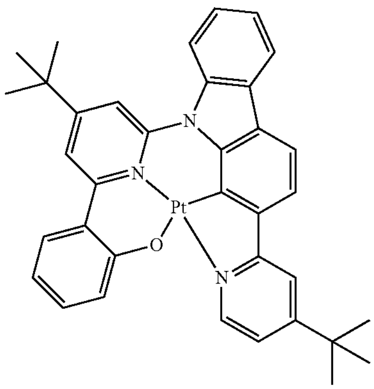
32
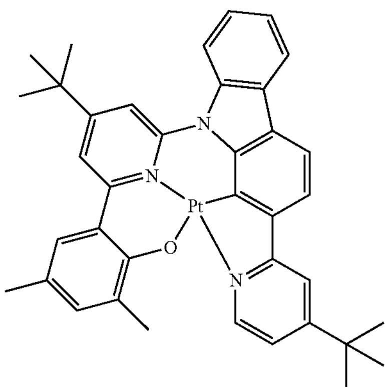
33
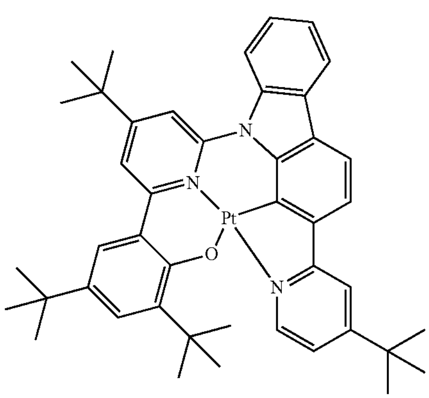
-continued
34
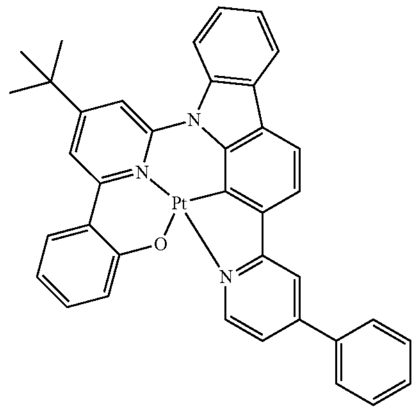
35
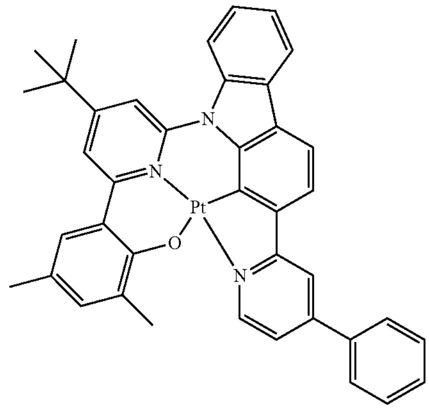
36
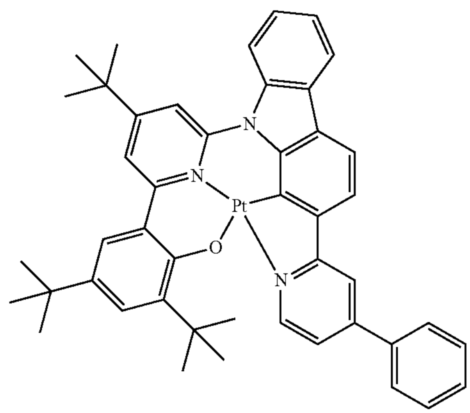
37
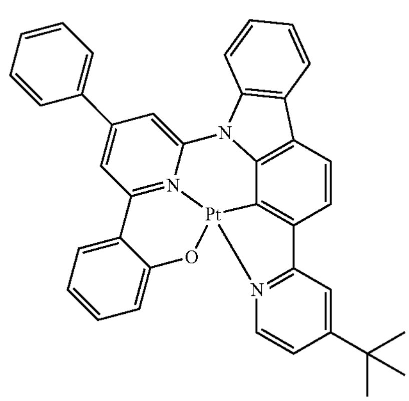

-continued
38
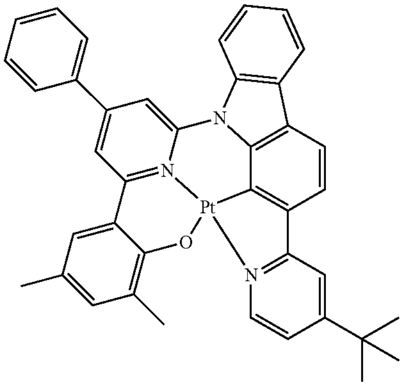
39
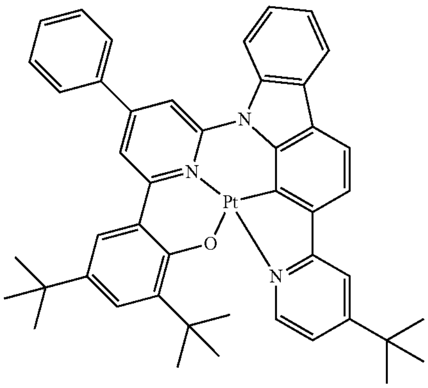
40
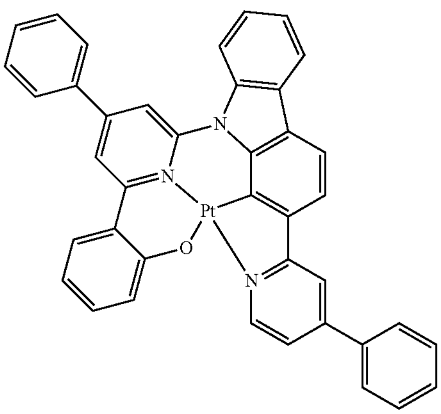
41
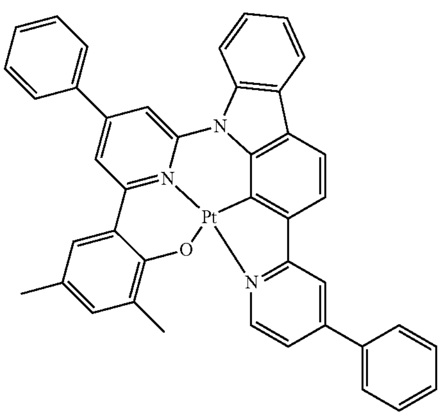
-continued
42
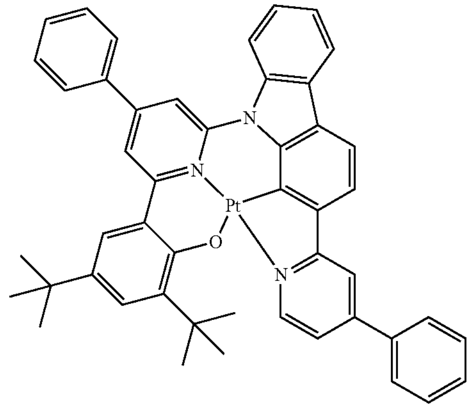
43
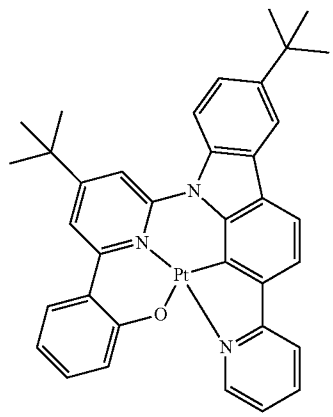
44
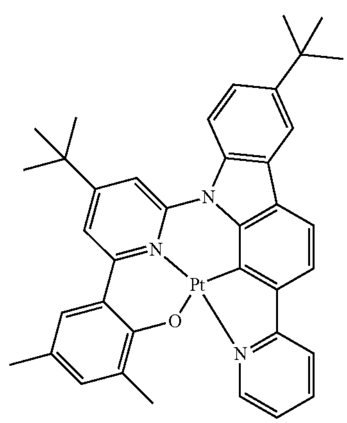

-continued
45
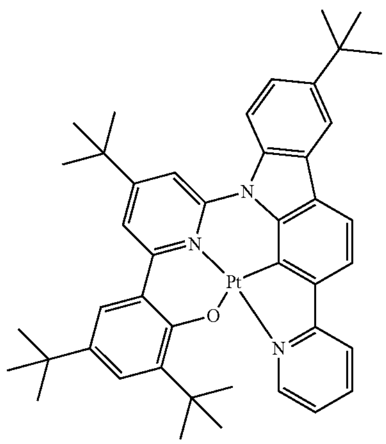
46
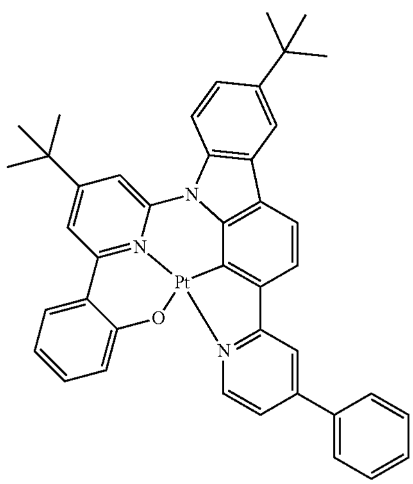
47
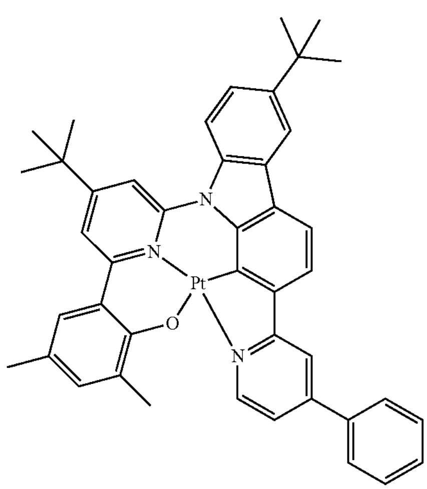
-continued
48
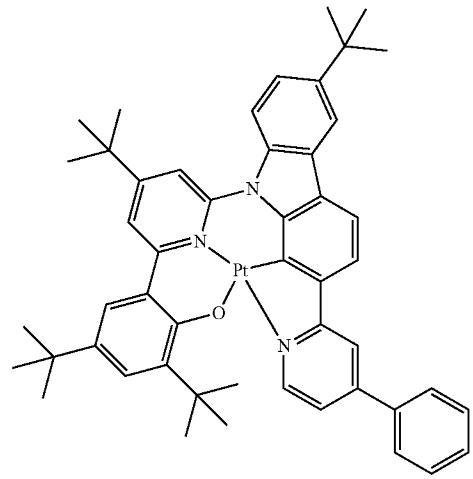
49
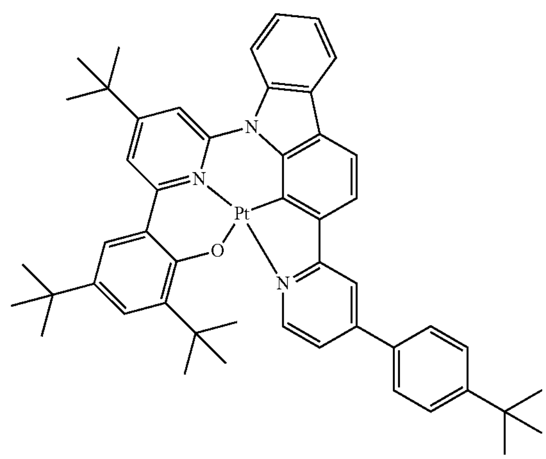
50
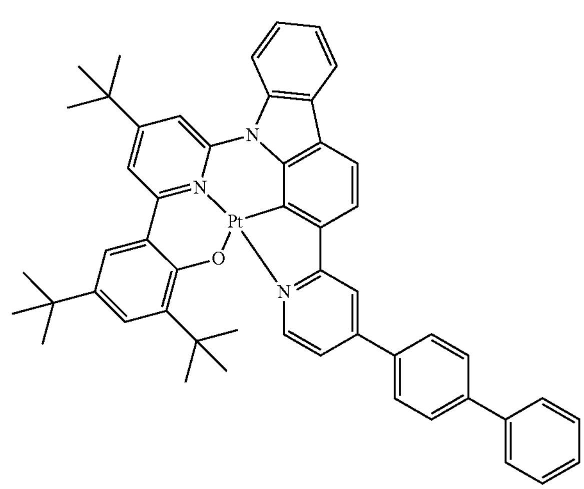

-continued
51
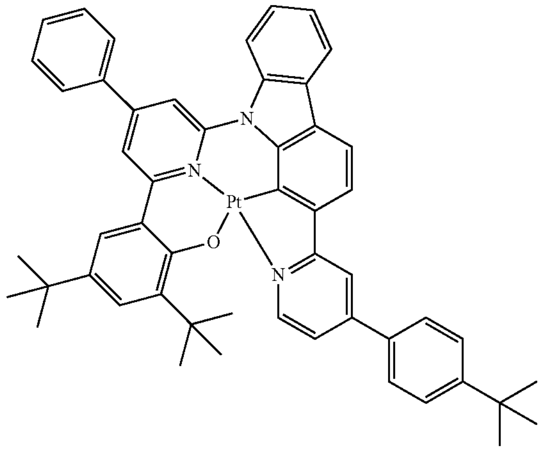
52
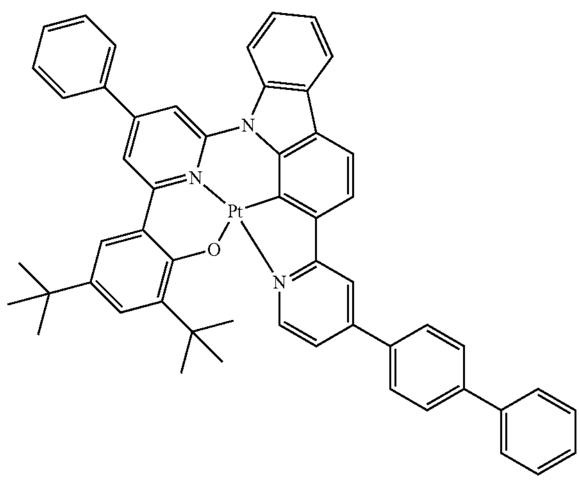
53
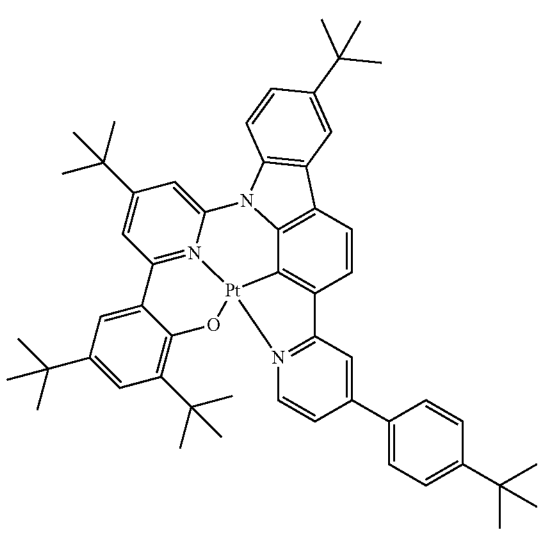
-continued
54
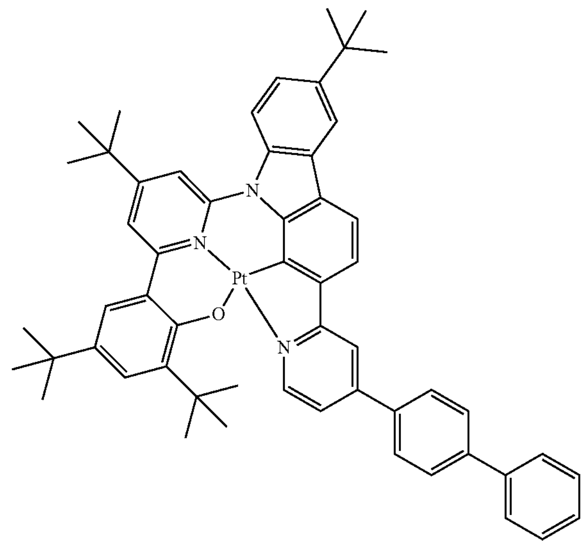
55
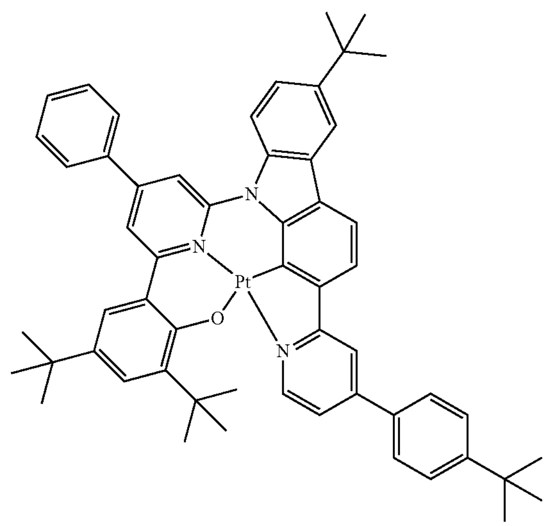
56
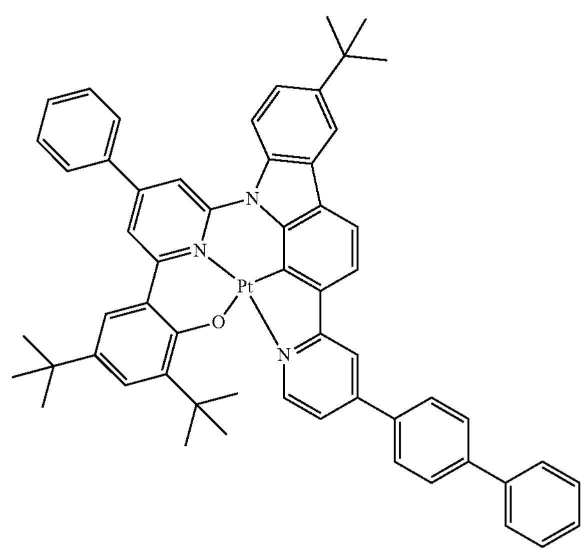

-continued
116
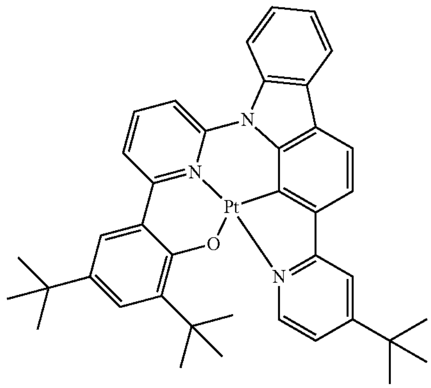
117
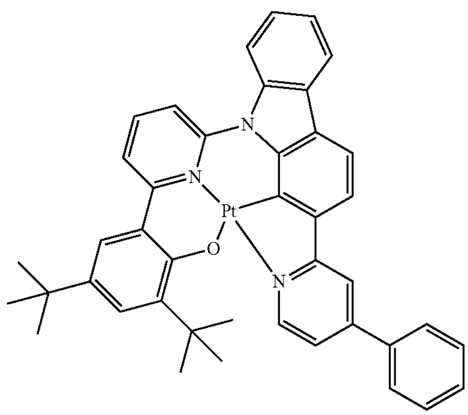
155
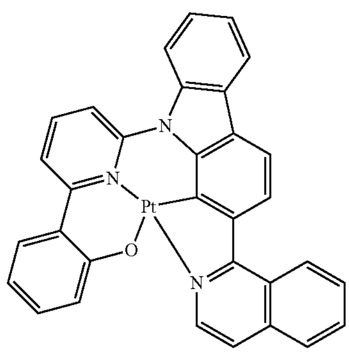
156
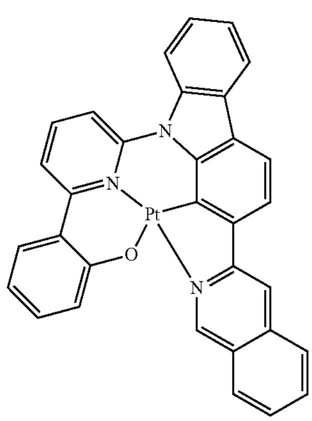
-continued
157
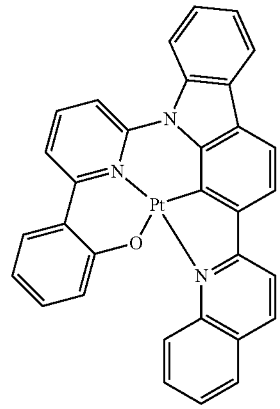
158
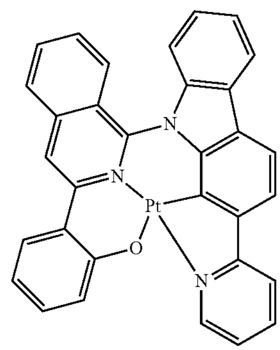
159
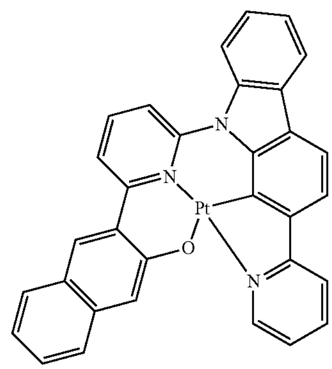
160
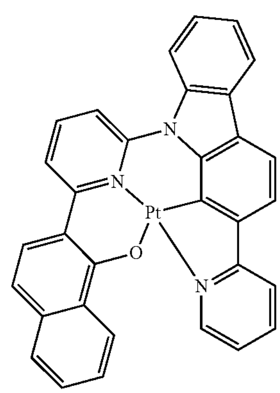
5. An organic light-emitting device comprising:
a first electrode;
a second electrode; and
an organic layer disposed between the first electrode and the second electrode, wherein the organic layer comprises an emission layer, and wherein the organic layer comprises at least one organometallic compound of claim 1.

6. The organic light-emitting device of claim 5, wherein the first electrode is an anode, the second electrode is a cathode, and the organic layer comprises a hole transport region disposed between the first electrode and the emission layer and an electron transport region disposed between the emission layer and the second electrode, wherein the hole transport region comprises a hole injection layer, a hole transport layer, an electron blocking layer, or any combination thereof, and wherein the electron transport region comprises a hole blocking layer, an electron transport layer, an electron injection layer, or any combination thereof.

7. The organic light-emitting device of claim 5, wherein the emission layer comprises the organometallic compound.

8. The organic light-emitting device of claim 7, wherein the emission layer further comprises a host, and wherein an amount of the host is greater than an amount of the organometallic compound.

9. A diagnostic composition comprising at least one of the organometallic compound of claim 1.

* * * * *